(12) United States Patent
Moon et al.

(10) Patent No.: US 9,431,625 B2
(45) Date of Patent: Aug. 30, 2016

(54) ORGANIC LIGHT-EMITTING DIODE

(75) Inventors: Jung-Min Moon, Yongin-si (KR); Ja-Hyun Im, Yongin-si (KR); Tae-Jin Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 511 days.

(21) Appl. No.: 13/598,555

(22) Filed: Aug. 29, 2012

(65) Prior Publication Data

US 2013/0228753 A1 Sep. 5, 2013

(30) Foreign Application Priority Data

Mar. 2, 2012 (KR) .................. 10-2012-0022037

(51) Int. Cl.
H01L 51/50 (2006.01)
H01L 51/00 (2006.01)

(52) U.S. Cl.
CPC ......... *H01L 51/508* (2013.01); *H01L 51/0052* (2013.01); *H01L 51/0067* (2013.01); *H01L 51/5004* (2013.01); *H01L 51/5076* (2013.01)

(58) Field of Classification Search
None
See application file for complete search history.

(56) References Cited

U.S. PATENT DOCUMENTS

| | | | |
|---|---|---|---|
| 2006/0214553 A1* | 9/2006 | Nagara et al. | 313/483 |
| 2007/0170424 A1* | 7/2007 | Nishita | 257/40 |
| 2009/0146554 A1 | 6/2009 | Lee et al. | |
| 2011/0084259 A1 | 4/2011 | Lee et al. | |
| 2011/0147716 A1* | 6/2011 | Kondakova et al. | 257/40 |

FOREIGN PATENT DOCUMENTS

| | | |
|---|---|---|
| KR | 10-2009-0059842 | 6/2009 |
| KR | 10-2010-0022638 A | 3/2010 |
| KR | 10-2011-0040735 | 4/2011 |
| KR | 10-2011-0056715 A | 5/2011 |

* cited by examiner

*Primary Examiner* — Gregory Clark
(74) *Attorney, Agent, or Firm* — Lewis Roca Rothgerber Christie LLP

(57) ABSTRACT

An organic light-emitting diode (OLED).

24 Claims, 4 Drawing Sheets

ORGANIC LIGHT-EMITTING DIODE

CROSS-REFERENCE TO RELATED PATENT APPLICATION

This application claims priority to and the benefit of Korean Patent Application No. 10-2012-0022037, filed on Mar. 2, 2012, in the Korean Intellectual Property Office, the disclosure of which is incorporated herein in its entirety by reference.

BACKGROUND

1. Field

The following description relates to an organic light-emitting diode (OLED).

2. Description of the Related Art

Organic light-emitting diodes (OLEDs) are self-emitting devices, have advantages such as a wide viewing angle, excellent contrast, quick response, high brightness, and excellent driving voltage, and can provide multicolored images.

A general OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic layers formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

An aspect of an embodiment of the present invention is directed toward an organic light-emitting diode (OLED) having high efficiency and long lifetime (lifespan) by using a new electron transport layer.

According to an embodiment of the present invention, there is provided an organic light-emitting diode (OLED) including a substrate; a first electrode formed on the substrate; a second electrode facing the first electrode; an emission layer interposed between the first electrode and the second electrode; and an electron transport layer interposed between the emission layer and the second electrode, wherein the electron transport layer has a structure in which n (where n is an integer of 1 or more) electron transport units are stacked and each electron transport unit includes a first mixed layer including a first material and a first dopant and a second mixed layer including a second material and a second dopant, wherein the first material and the second material are different from each other, and wherein the first material and the second material satisfy at least one of Formulae 1, 2, and 3 below:

Electron mobility of the first material≠Electron mobility of the second material,     Formula 1

Absolute value of Lowest Unoccupied Molecular Orbital (LUMO) level of the first material≠Absolute value of LUMO level of the second material, and     Formula 2

Absolute value of Highest Occupied Molecular Orbital (HOMO) level of the first material≠Absolute value of HOMO level of the second material.     Formula 3

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, an organic light-emitting diode (OLED) will be described with reference to FIG. 1 that is a cross-sectional view of an OLED 100 according to an embodiment of the present invention. As used herein, the term "and/or" includes any and all combinations of one or more of the associated listed items. Expressions such as "at least one of," when preceding a list of elements, modify the entire list of elements and do not modify the individual elements of the list.

Figure 1:
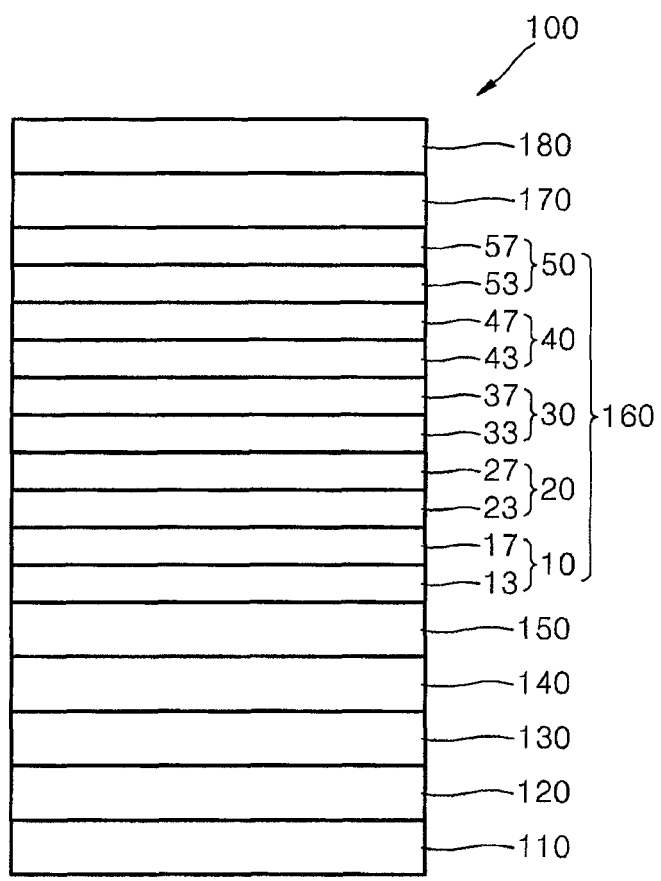
FIG. 1 is a cross-sectional view of an organic light-emitting diode (OLED) according to an embodiment of the present invention.

Referring to FIG. 1, the OLED 100 has a structure in which a substrate 110, a first electrode 120, a hole injection layer (HIL) 130, a hole transport layer (HTL) 140, an emission layer (EML) 150, an electron transport layer (ETL) 160, an electron injection layer (EIL) 170, and a second electrode 180 are sequentially stacked.

The ETL 160 has a structure in which i) a first electron transport unit 10 including a first mixed layer 13 and a second mixed layer 17, ii) a second electron transport unit 20 including a first mixed layer 23 and a second mixed layer 27, iii) a third electron transport unit 30 including a first mixed layer 33 and a second mixed layer 37, and iv) a fourth electron transport unit 40 including a first mixed layer 43 and a second mixed layer 47 are sequentially stacked (that is, n=4).

The first mixed layers 13, 23, 33, and 43 include (e.g., each include) a first material and a first dopant, and the second mixed layers 17, 27, 37, and 47 include (e.g., each include) a second material and a second dopant.

The substrate 110 may be a substrate used in a general OLED, and may be a glass substrate or a transparent plastic substrate having excellent mechanical strength, thermal stability, transparency, surface smoothness, ease of handling, and/or waterproofness.

The first electrode 120 may be formed by applying a first electrode material on the substrate 110 by deposition or sputtering. When the first electrode 120 is an anode, the first electrode material may be selected from materials having a high work function so as to facilitate hole injection. The first electrode 120 may be a reflective electrode, a semi-transparent electrode, or a transparent electrode. Examples of the first electrode material may include indium-tin oxide (ITO), indium-zinc-oxide (IZO), tin oxide ($SnO_2$), and zinc oxide (ZnO) which are transparent and having excellent conductivity. Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 120 may be formed as a reflective electrode.

The first electrode 120 may be formed as a single layer or have a multi-layered structure having at least two layers. For example, the first electrode 120 may have a three-layered structure, e.g., ITO/Ag/ITO, but is not limited thereto.

The HIL 130 is formed on the first electrode 120. The HIL 130 may be formed on the first electrode 120 by using various methods such as a vacuum deposition, spin coating, casting, or LB deposition.

When the HIL 130 is formed by vacuum deposition, the deposition conditions may vary according to a compound used as a material for forming the HIL 130, a structure of a desired HIL, and thermal characteristics. For example, the deposition condition may be, but is not limited to, a deposition temperature of about 100 to about 500° C., a degree of vacuum of about $10^{-8}$ to about $10^{-3}$ torr, and a deposition speed of about 0.01 to about 100 Å/sec.

When the HIL 130 is formed by spin coating, the coating condition may vary according to a compound used as a material for forming the HIL 130, a structure of a desired HIL, and thermal characteristics. For example, the coating condition may be, but is not limited to, a coating speed of about 2,000 to about 5,000 rpm and a heat treatment temperature for removing a solvent after coating of about 80 to about 200° C.

The material for forming the HIL 130 may be a known hole injection material. Examples of the known hole injection material include, but are limited to, N,N'-diphenyl-N, N'-bis-[4-(phenyl-m-tolyl-amino)-phenyl]-biphenyl-4,4'-diamine (DNTPD), a phthalocyanine compound such as copper phthalocyanine, 4,4',4"-tris (3-methylphenylphenylamino)triphenylamine (m-MTDATA), N,N'-di(1-naphthyl)-N,N'-diphenylbenzidine) (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), (polyaniline/camphor sulfonicacid (Pani/CSA), and polyaniline/poly(4-styrenesulfonate) (PANI/PSS).

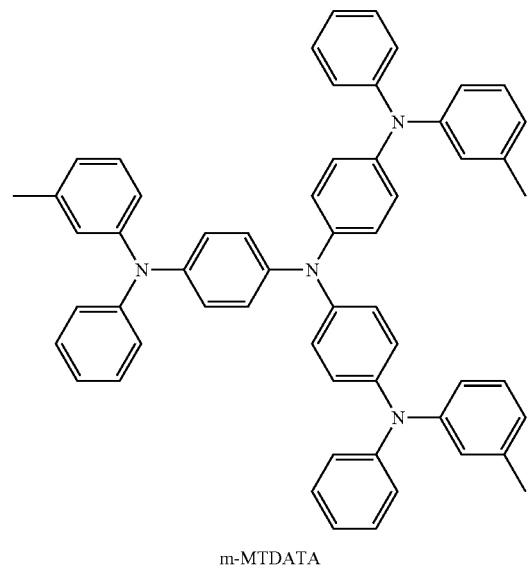

m-MTDATA

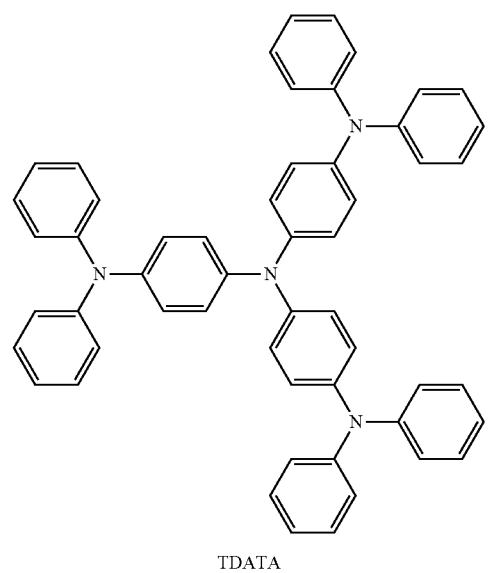

TDATA

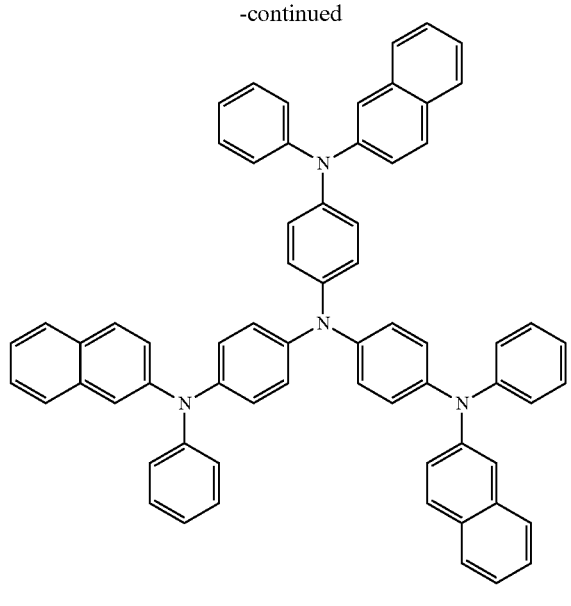

2-TNATA

The thickness of the HIL 130 may be in the range of about 100 Å to about 10,000 Å, for example, in the range of about 100 Å to about 1,000 Å. When the thickness of the HIL 130 is within this range, satisfactory hole injection properties may be obtained without a substantial increase in driving voltage.

Then, the HTL 140 may be formed on the HIL 130 by using various methods such as vacuum deposition, spin coating, casting, or LB deposition. When the HTL 140 is formed by vacuum deposition or spin coating, the deposition and coating conditions vary according to a used compound. However, in general, the condition may be almost the same as the condition for forming the HIL 130.

A material for forming the HTL 140 may be a known hole transporting material. Examples of the known hole transporting material include, but are not limited to, carbazole derivatives such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

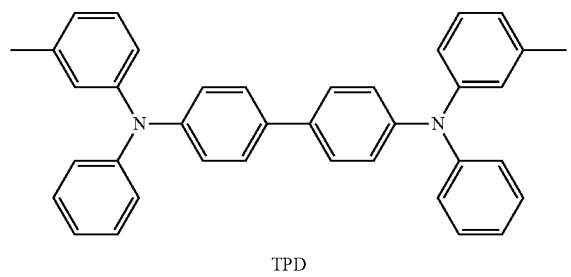

TPD

The thickness of the HTL 140 may be in the range of about 50 Å to about 2,000 Å, for example, in the range of about 100 Å to about 1,500 Å. When the thickness of the HTL 140 is within this range, satisfactory hole transport properties may be obtained without a substantial increase in driving voltage.

At least one of the HIL 130 and the HTL 140 may include at least one of a compound represented by Formula 300 below and a compound represented by Formula 350 below:

Formula 300

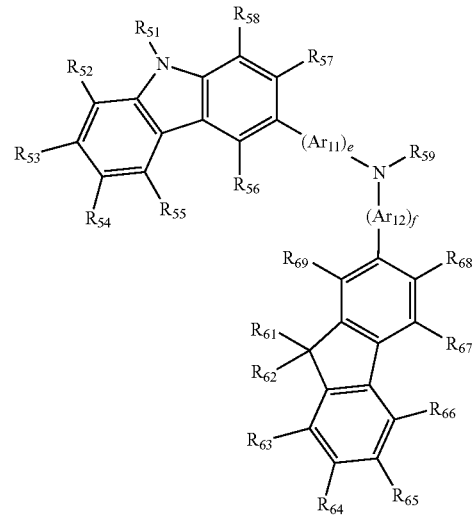

Formula 350

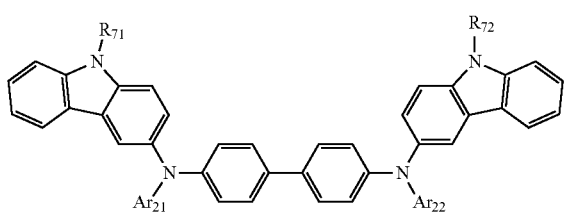

In Formula 300 above, $Ar_{11}$ and $Ar_{12}$ may be each independently a substituted or unsubstituted $C_6$-$C_{60}$ arylene group. $Ar_{11}$ and $Ar_{12}$ refer to the detailed description for $X_1$ below.

In Formula 350 above, $Ar_{21}$ and $Ar_{22}$ may be each independently a substituted or unsubstituted $C_6$-$C_{60}$ aryl group or a substituted or unsubstituted $C_2$-$C_{60}$ heteroaryl group. For example, $Ar_{21}$ and $Ar_{22}$ may be each independently a substituted or unsubstituted phenyl group, a substituted or unsubstituted naphthyl group, a substituted or unsubstituted phenanthrenyl group, a substituted or unsubstituted anthryl group, a substituted or unsubstituted pyrenyl group, a substituted or unsubstituted chrysenyl group, a substituted or unsubstituted fluorenyl group, a substituted or unsubstituted carbazolyl group, a substituted or unsubstituted dibenzofuranyl group, or a substituted or unsubstituted dibenzothiophenyl group. In this case, at least one of the substituents of the substituted phenyl group, the substituted naphthyl group, the substituted phenanthrenyl group, the substituted anthryl group, the substituted pyrenyl group, the substituted chrysenyl group, the substituted fluorenyl group, the substituted carbazolyl group, the substituted dibenzofuranyl group, and the substituted dibenzothiophenyl group may be selected from deuterium; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{10}$ alkyl group; a $C_1$-$C_{10}$ alkoxy group; a phenyl group, a naphthyl group, a fluorenyl group, a phenanthrenyl group, an anthryl group, a triphenylenyl group, a pyrenyl group, a chrysenyl group, an imidazolyl group, an imidazolinyl group, an imidazopyridinyl group, an imidazopyrimidinyl group, a pyridinyl group, a pyrazinyl group, a pyrimidinyl group, and an indolyl group; and a phenyl group, a naphthyl group, a fluorenyl group, a phenanthrenyl group, an anthryl group, a triphenylenyl group, a pyrenyl group, a chrysenyl group, an imidazolyl group, an imidazolinyl group, an imidazopyridinyl group, an imidazopyrimidinyl group, a pyridinyl group, a pyrazinyl group, a pyrimidinyl group, and an indolyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group.

In Formula 300 above, e and f may be each independently an integer of 0 to 5, for example, 0, 1, or 2. For example, e may be 1 and f may be 0, e and f are not limited to the above example.

In Formulae 300 and 350 above, $R_{51}$ through $R_{58}$, $R_{61}$ through $R_{69}$, and $R_{71}$ and $R_{72}$ may be each independently hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. For example, $R_{51}$ through $R_{58}$, $R_{61}$ through $R_{69}$, and $R_{71}$ and $R_{72}$ may be each independently one of hydrogen; deuterium; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{10}$ alkyl group (e.g., methyl, ethyl, propyl, butyl, pentyl, hexyl, and the like), a $C_1$-$C_{10}$ alkoxy group (e.g., methoxy, ethoxy, propoxy, butoxy, pentoxy, and the like); a $C_1$-$C_{10}$ alkyl group and a $C_1$-$C_{10}$ alkoxy group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, and a phosphoric acid or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group, but are not limited thereto.

In Formula 300 above, $R_{59}$ may be one of a phenyl group; a naphthyl group; an anthryl group; a biphenyl group; a pyridinyl group; and a phenyl group, a naphthyl group, an anthryl group, a biphenyl group, and a pyridinyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a substituted or unsubstituted $C_1$-$C_{20}$ alkyl group, and a substituted or unsubstituted $C_1$-$C_{20}$ alkoxy group.

The compound of Formula 300 may be represented by Formula 300A below, but is not limited thereto:

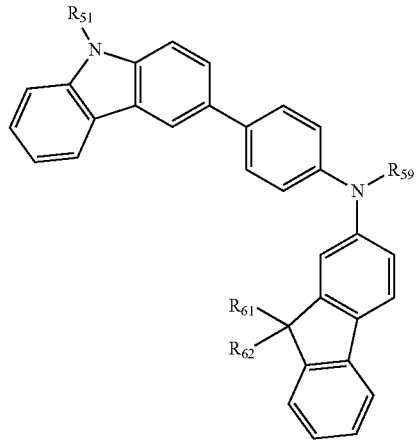

Formula 300A wherein a detailed description of $R_{51}$, $R_{60}$, $R_{61}$, and $R_{59}$ is already provided above.

For example, at least one of the HIL 130 and the HTL 140 may include at least one of Compounds 301 through 320 below, but is not limited thereto:

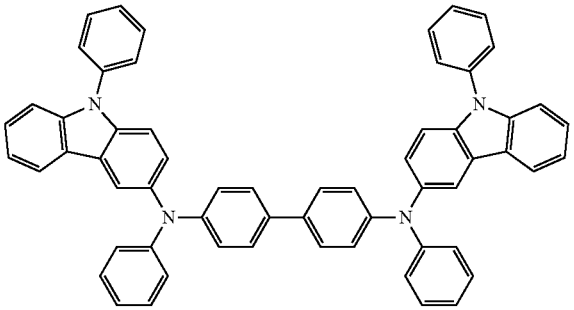

301

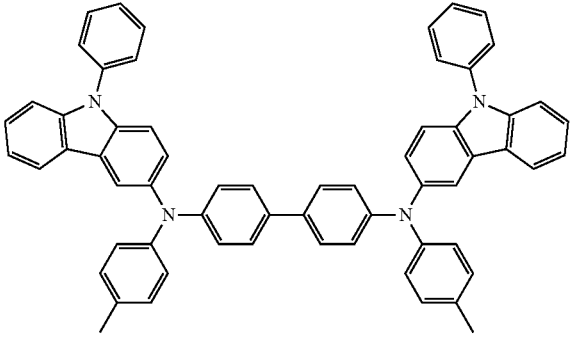

302

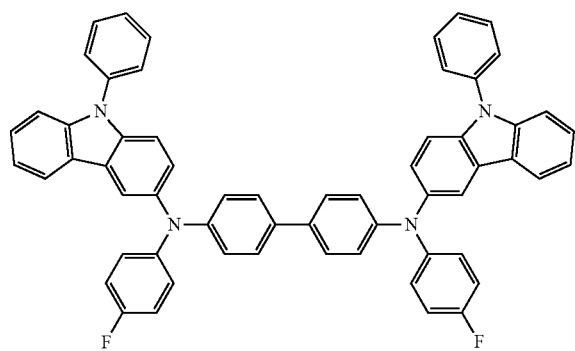
303
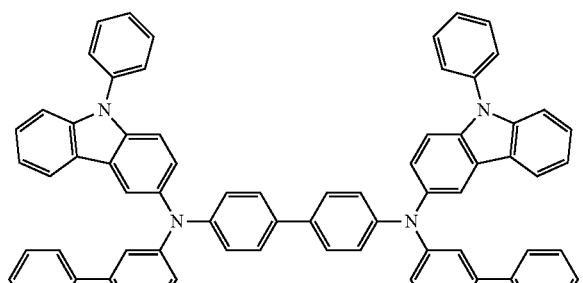
307
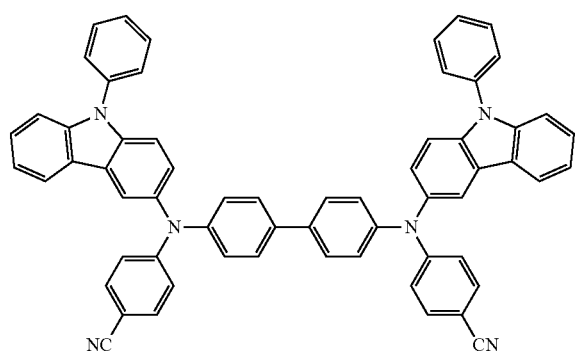
304
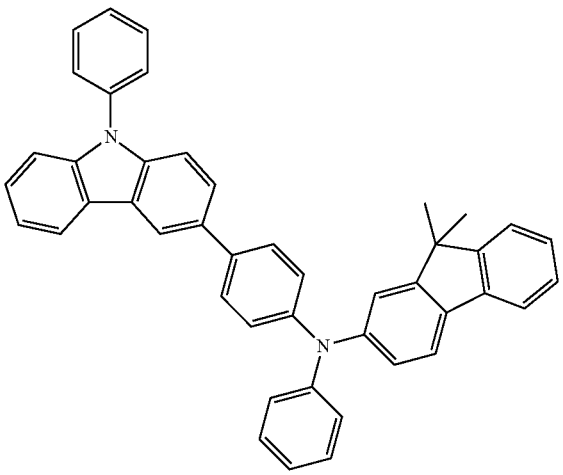
308
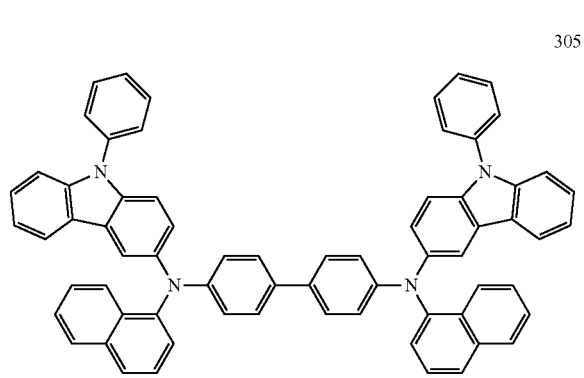
305
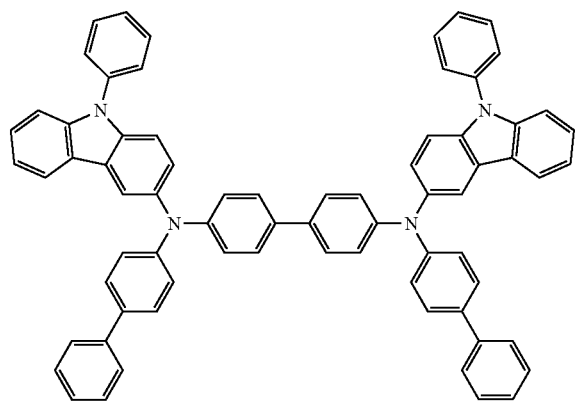
306
309

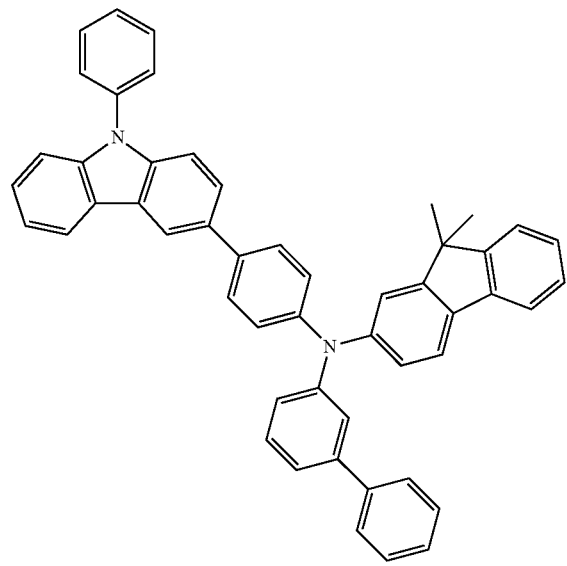
310
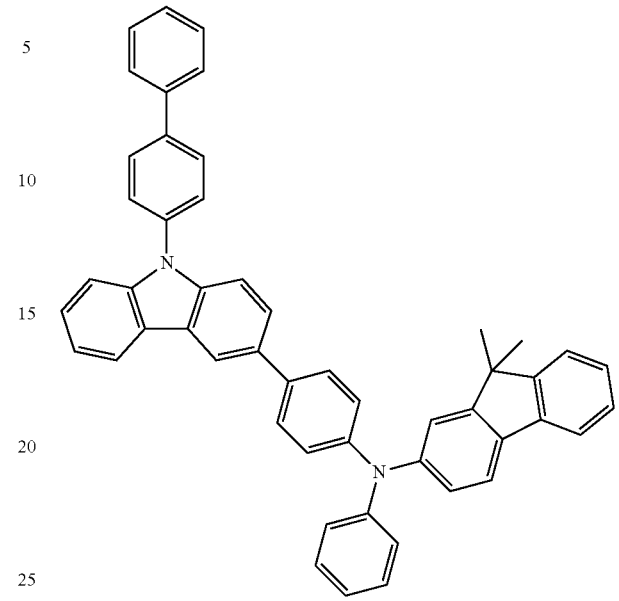
312
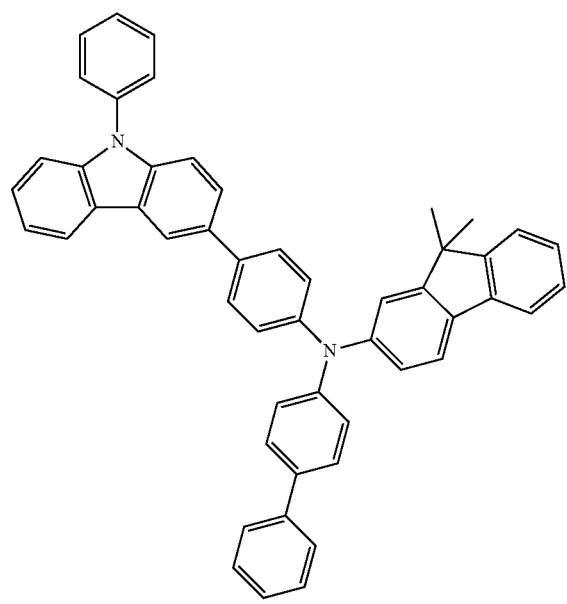
311
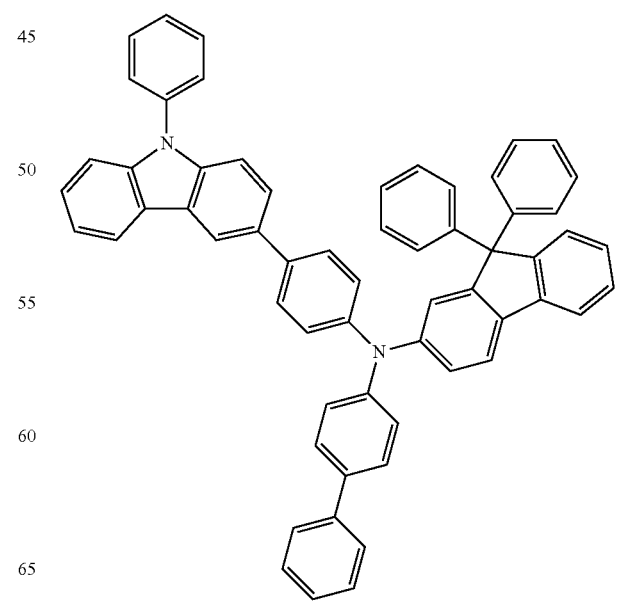
313

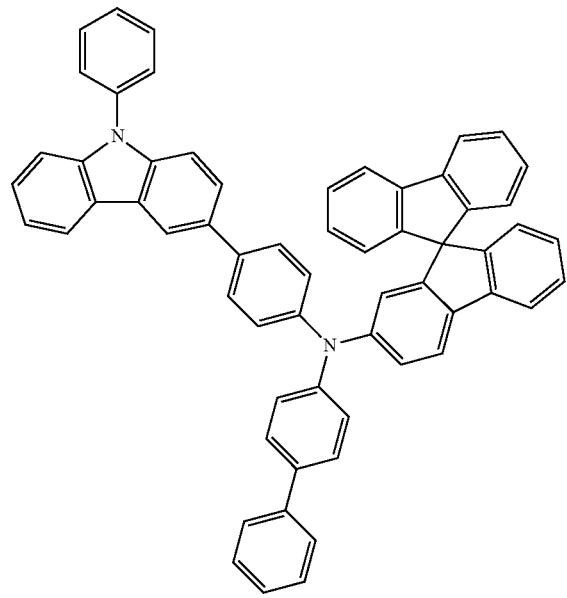
314
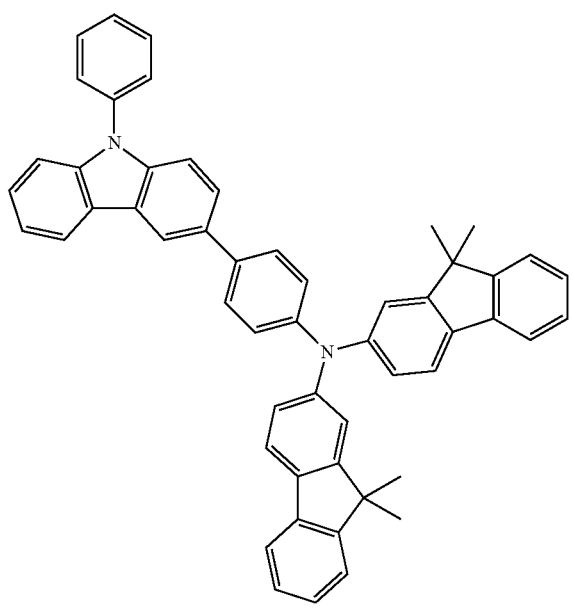
315
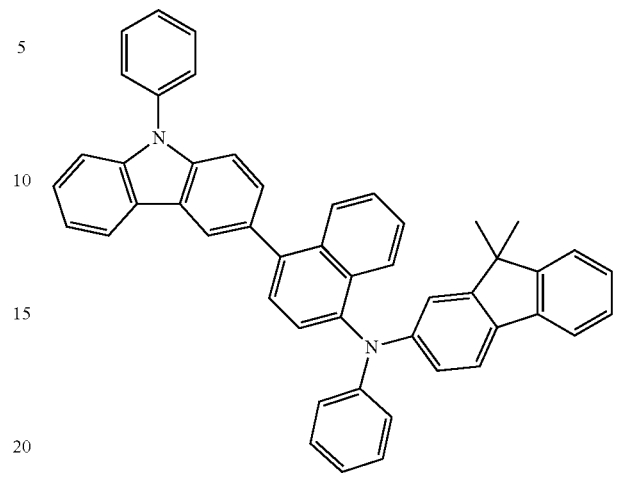
316
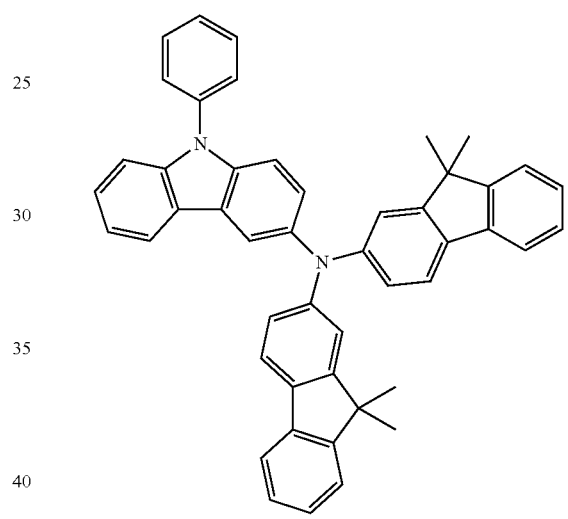
317
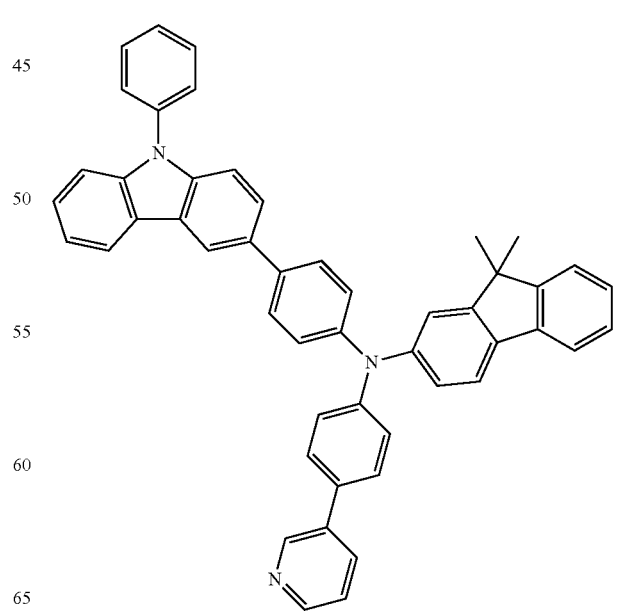
318

319

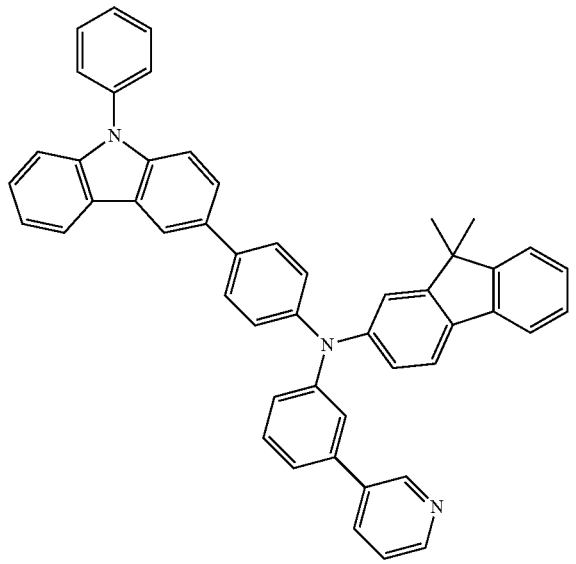

320

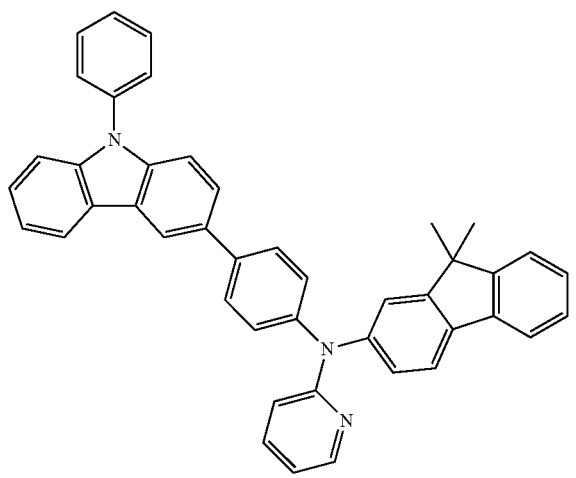

At least one of the HIL 130 and the HTL 140 further includes a charge-generating material so as to increase the conductivity of the layers.

The charge-generating material may be, for example, a p-dopant. The p-dopant may be one of a quinone derivative, a metal oxide, and a cyano-containing compound, but is not limited thereto. Examples of the p-dopant may include, but are not limited to, quinone derivatives such as tetra-cyano-quinodimethane (TCNQ) and 2,3,5,6-tetrafluoro-tetra-cyano-1,4-benzoquinodimethane (F4-TCNQ); metal oxides such as an tungsten oxide and a molybdenum oxide; and cyano-containing compounds such as Compound 390 below and the like.

Formula 390

<F4-TCNQ>

When at least one of the HIL 130 and the HTL 140 further includes the charge-generating material, the charge-generating material may be homogeneously or inhomogeneously dispersed in at least one of the HIL 130 and the HTL 140.

An intermediate layer (not shown in FIG. 1) may be interposed between the HTL 140 and the EML 150. The intermediate layer increases efficiency by compensating for an optical resonance distance according to the wavelength of light emitted from the EML 150. The intermediate layer may include a known hole injection material and a known hole transporting material. Also, the intermediate layer may include the same material as one of the materials included in the HIL 130 and/or the HTL 140 that are formed below the intermediate layer.

Then, the EML 150 may be formed on the HTL 140 by vacuum deposition, spin coating, casting, or Langmuir-Blodgett (LB) deposition. When the EML 150 is formed by vacuum deposition or spin coating, the deposition and coating conditions vary according to a used compound. However, in general, the condition may be almost the same as the condition for forming the HIL 130.

The EML 150 may include a known emission material. For example, the EML 150 may include a known host and dopant.

Examples of the host may include, but are not limited to, $Alq_3$, 4,4'-N,N'-dicabazole-biphenyl (CBP), poly(n-vinylcabazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, and distyrylarylene (DSA), dmCBP (refer to Formula below), and Compounds 501 through 509 below.

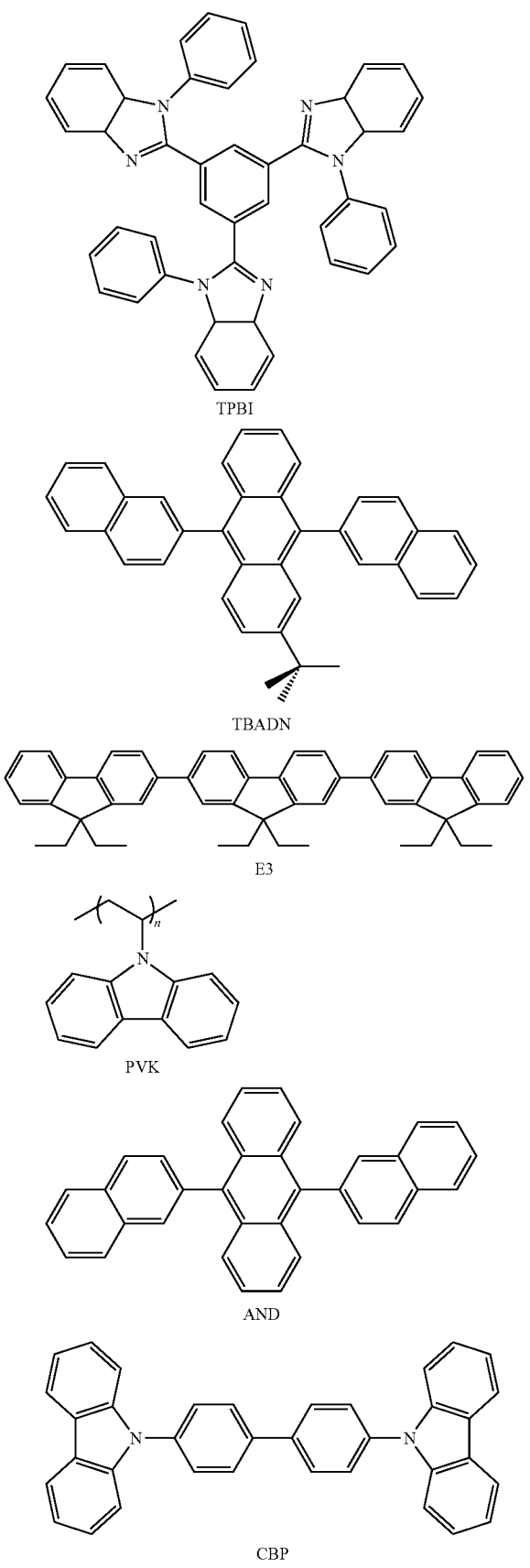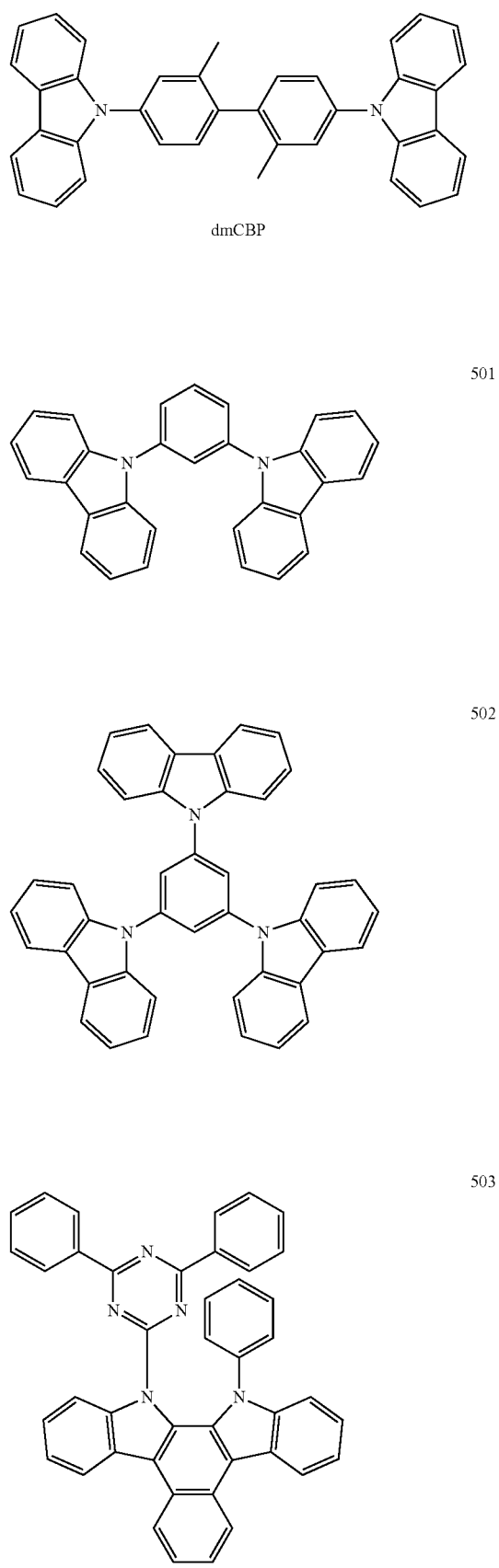

504
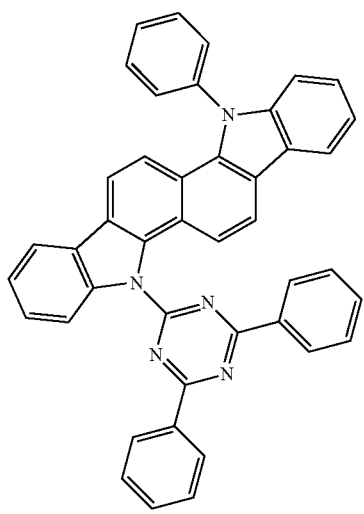

505
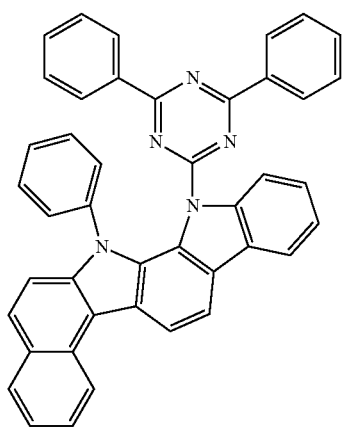

506
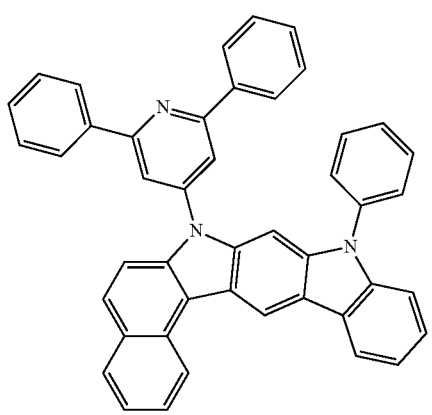

507
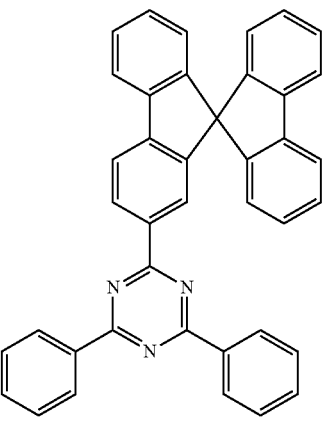

508
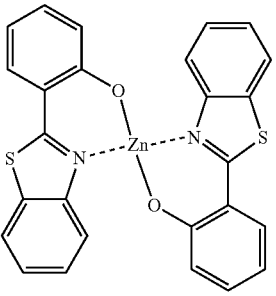

509
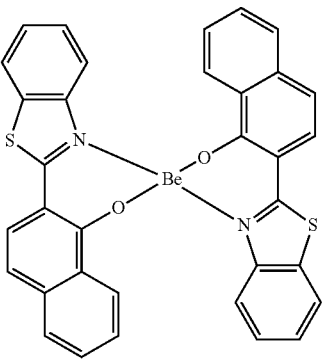

Also, the host may be an anthracene-based compound represented by Formula 400 below:

Formula 400
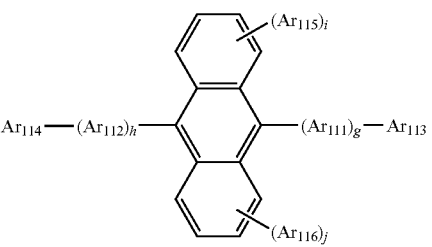

wherein $Ar_{111}$ and $Ar_{112}$ may be each independently a substituted or unsubstituted $C_6$-$C_{60}$ arylene group; $Ar_{113}$ through $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer of 0 to 4.

For example, in Formula 400 above, $Ar_{111}$ and $Ar_{112}$ may be each independently one of a phenylene group; a naphthylene group; a phenanthrenylene group; a pyrenylene group; and a phenylene group, a naphthylene group, a phenanthrenylene group, a fluorenyl group, and a pyrenylene group that are substituted with at least one of a phenyl group, a naphthyl group, and an anthryl group.

In Formula 400 above, g, h, i, and j may be each independently 0, 1, or 2.

In Formula 400 above, $Ar_{113}$ through $Ar_{116}$ may be each independently, but are not limited to, a $C_1$-$C_{10}$ alkyl group that is substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

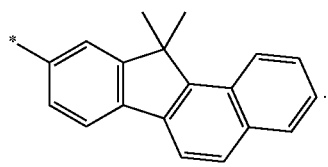 [SMILES: *c1ccc2c(c1)C(C)(C)c1c-2ccc2ccccc12]

For example, the anthracene-based compound of Formula 400 may be, but is not limited to, one of the compounds below:

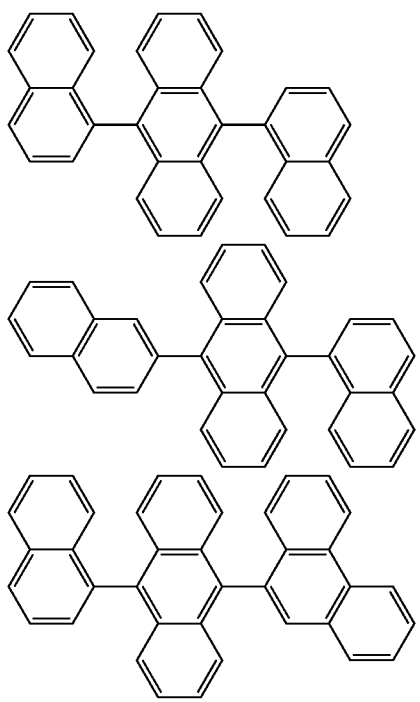

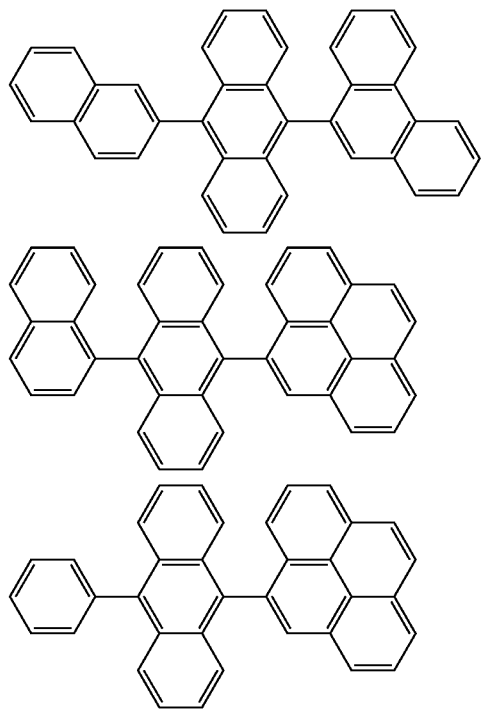

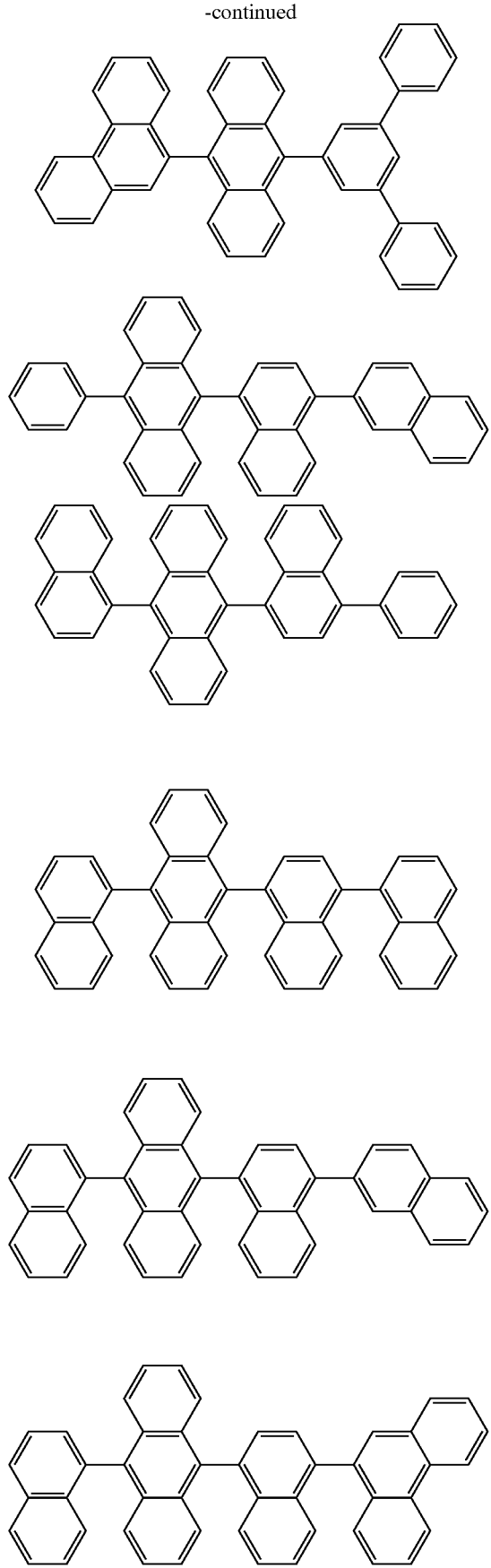
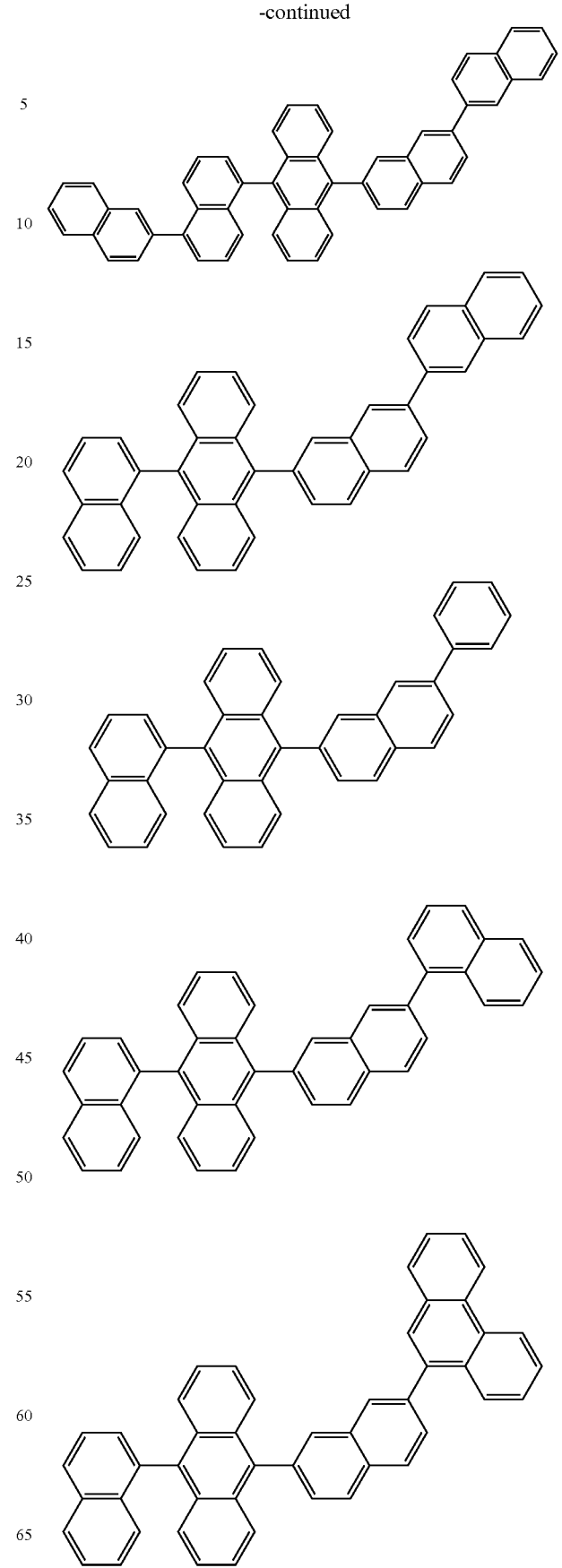

-continued
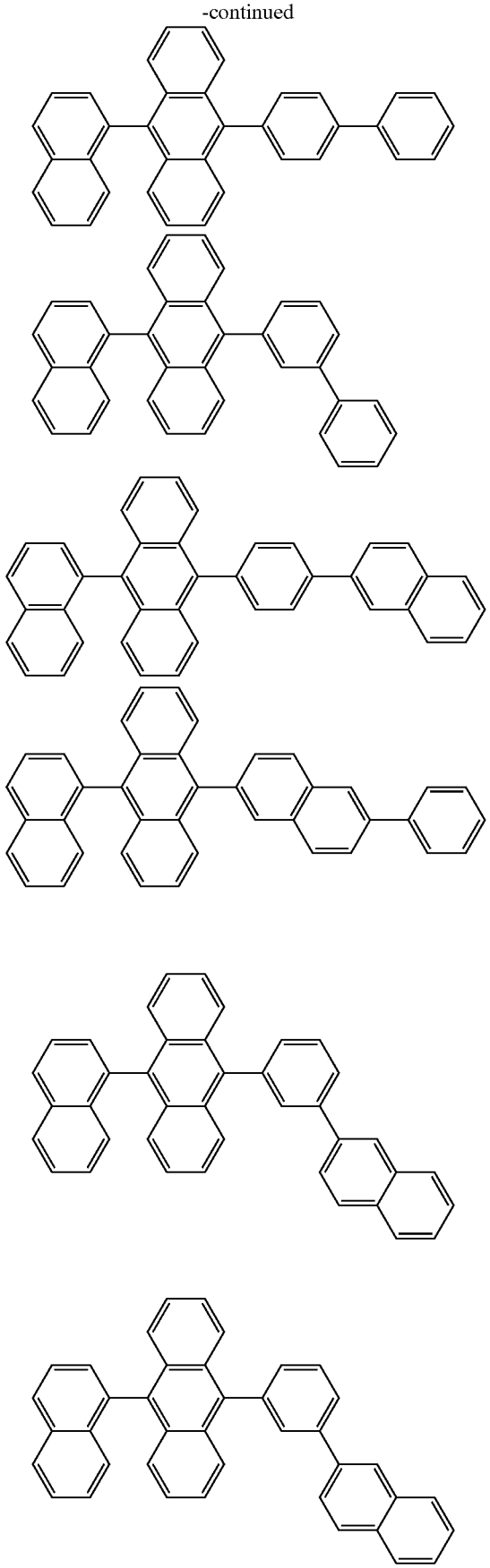
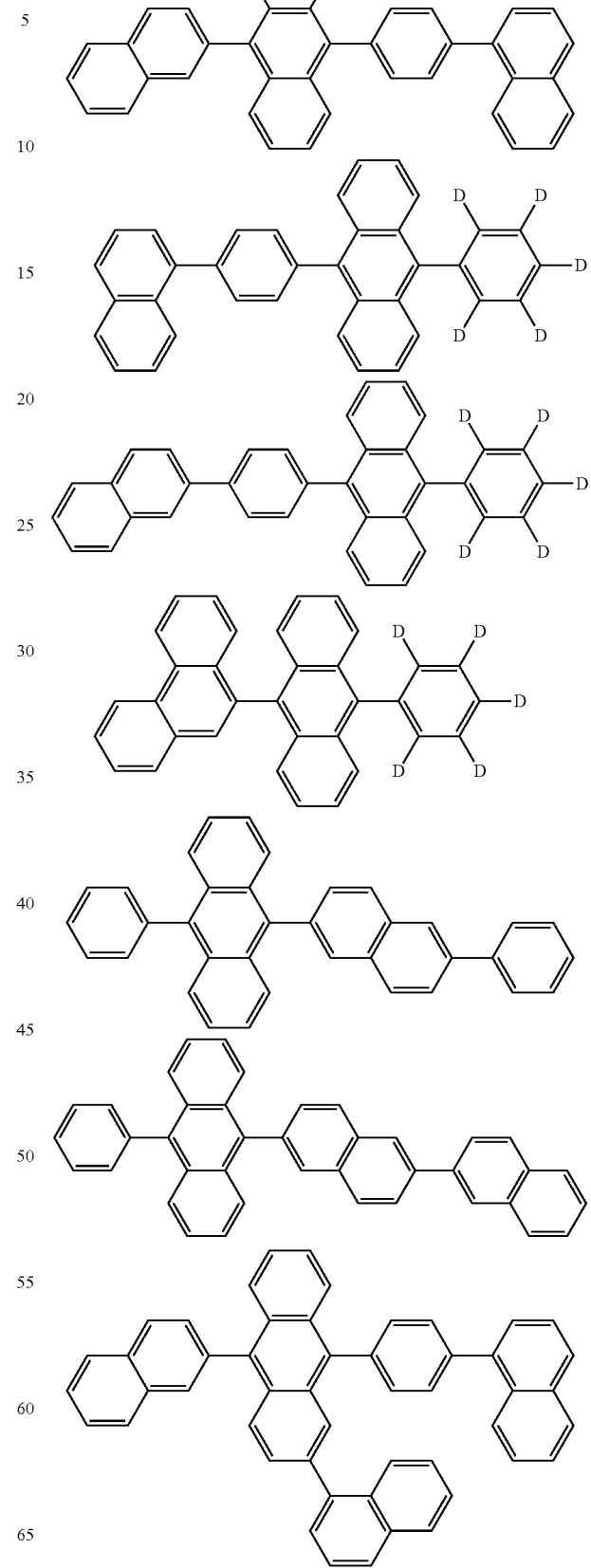

-continued

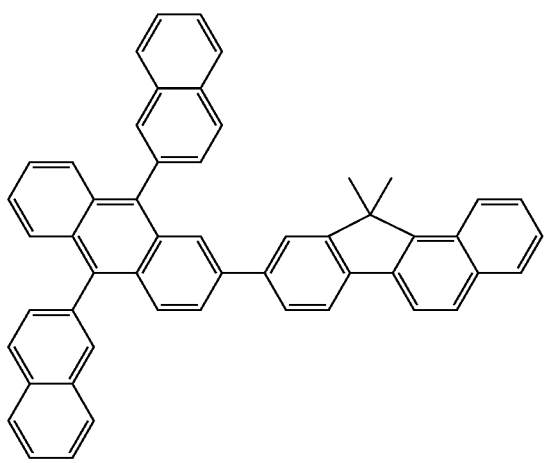

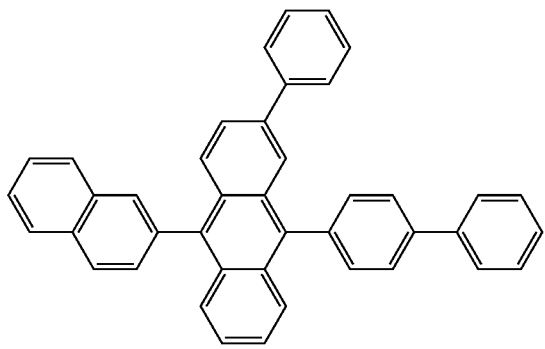

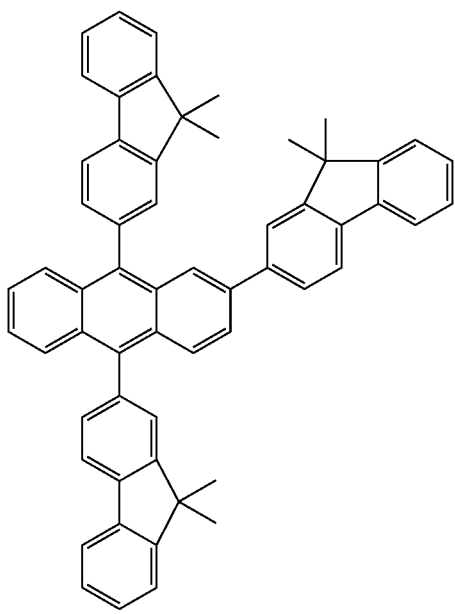

-continued

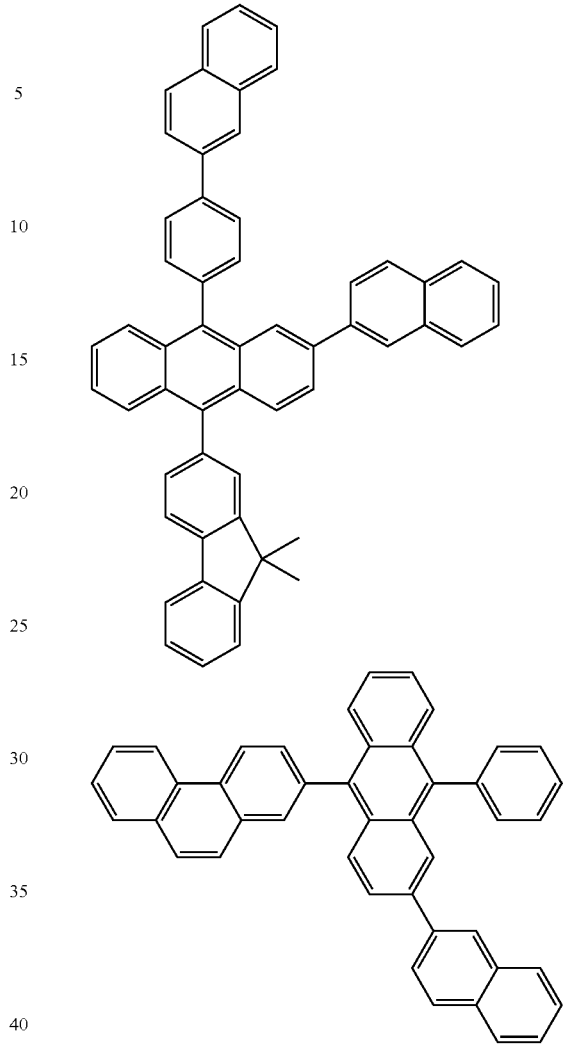

Also, an anthracene-based compound represented by Formula 401 below may be used as the host:

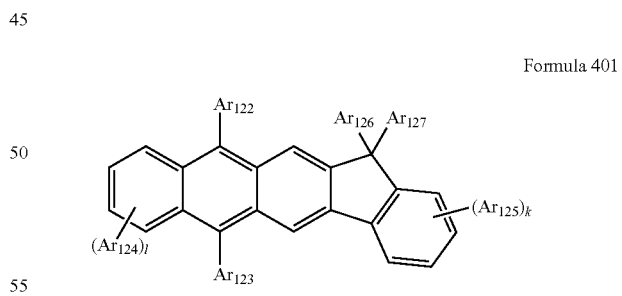

Formula 401 wherein a detailed description of $Ar_{122}$ through $Ar_{125}$ refers to the description of $Ar_{113}$ of Formula 400 above.

In Formula 401 above, $Ar_{126}$ and $Ar_{127}$ may be each independently a $C_1$-$C_{10}$ alkyl group (e.g., a methyl group, an ethyl group, or a propyl group).

In Formula 401 above, k and l may be each independently an integer of 0 to 4. For example, k and l may be each independently 0, 1, or 2.

For example, the anthracene-based compound of Formula 401 may be, but is not limited to, one of the following compounds:

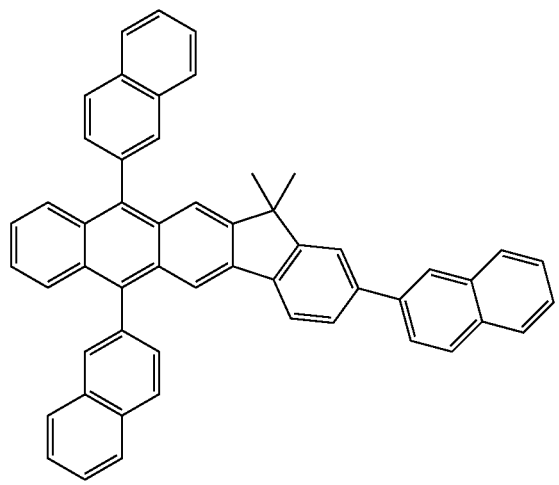
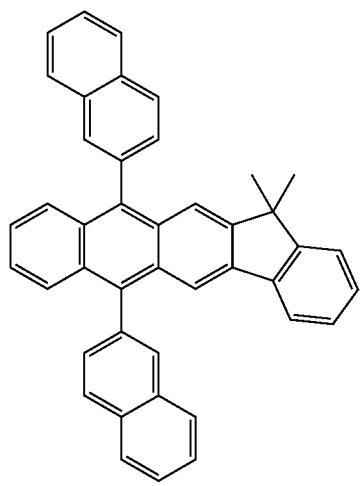
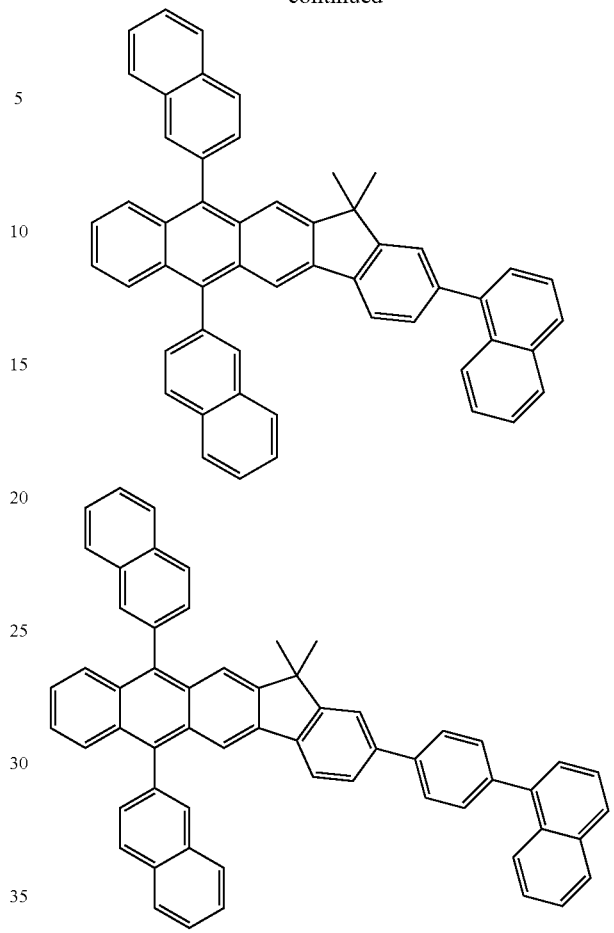
The EML 150 may include a blue dopant, a green dopant, or a red dopant.
For example, compounds described below may be used as a blue dopant, but are not limited thereto.
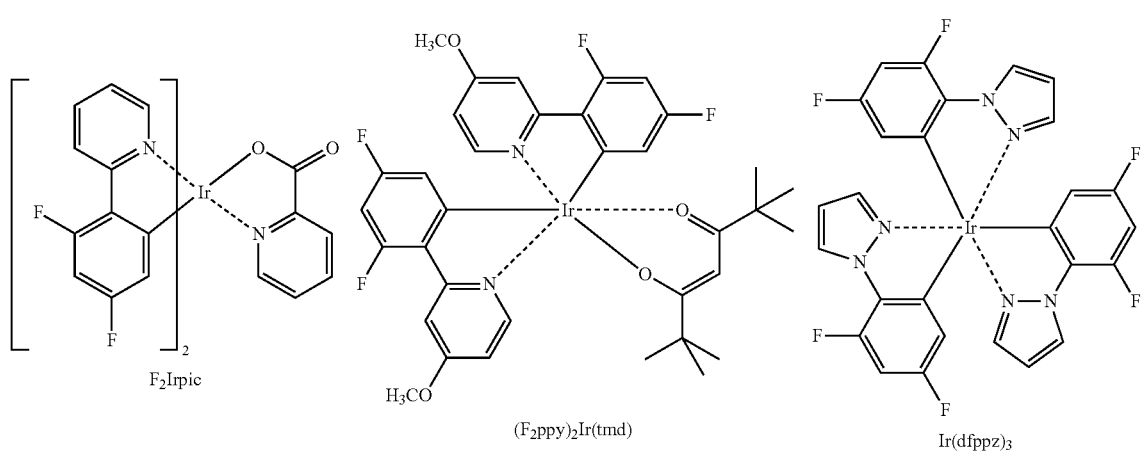

-continued
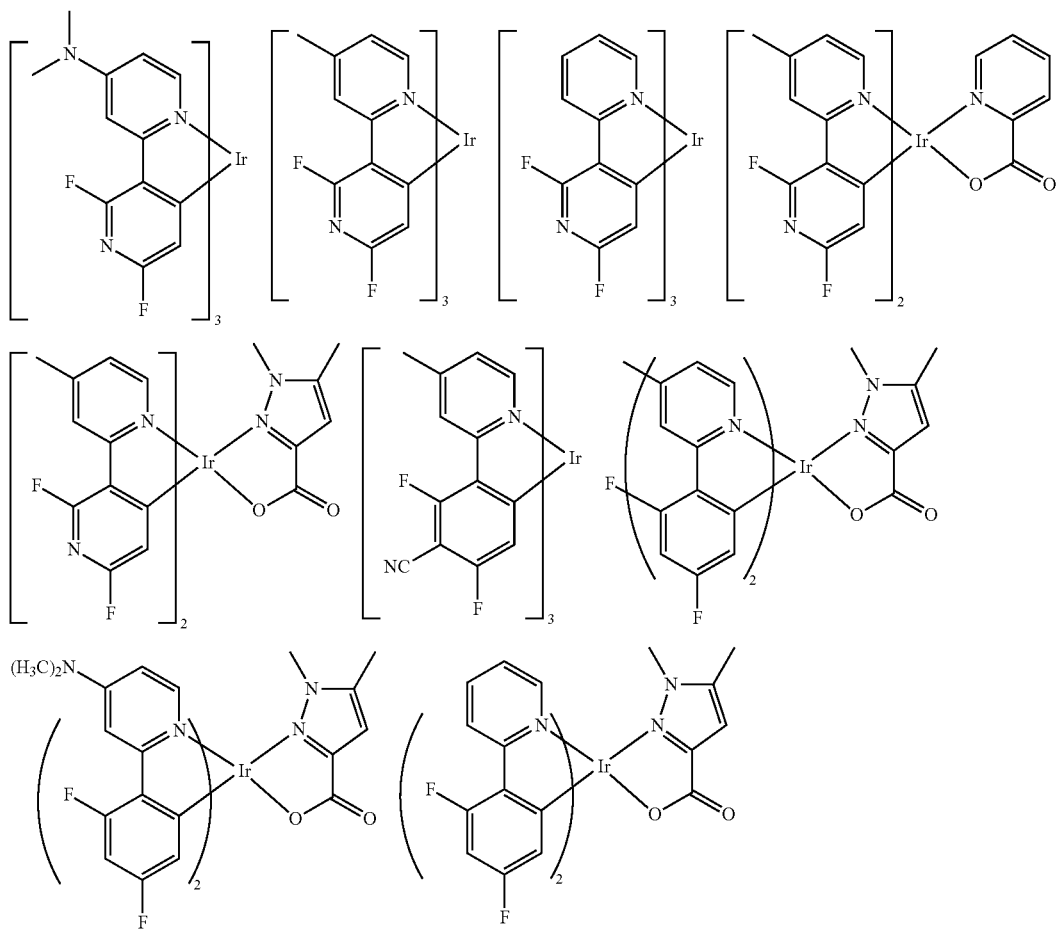
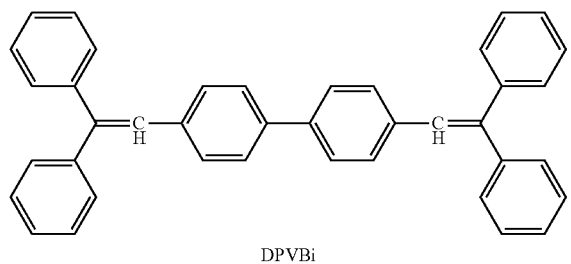
DPVBi
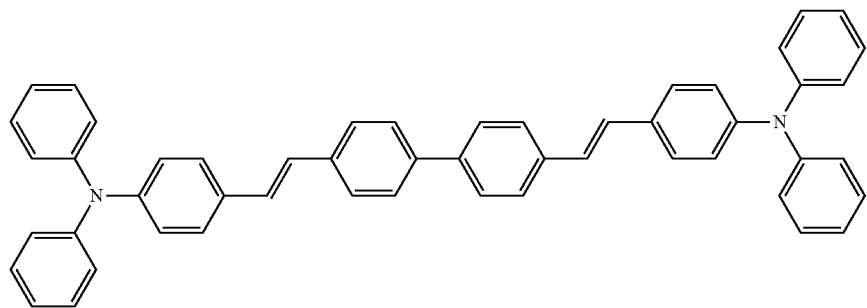
DPAVBi

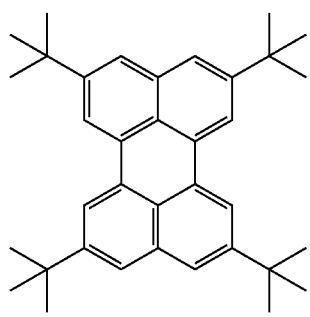
TBPe
For example, compounds described below may be used as a red dopant, but are not limited thereto. In addition, DCM or DCJTB below may be used as the red dopant.
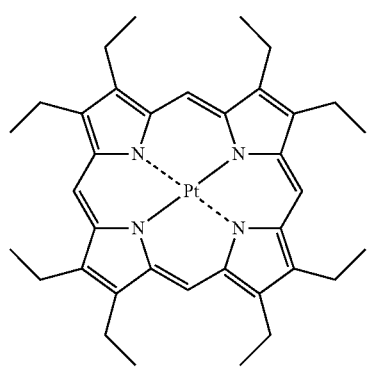
PtOEP
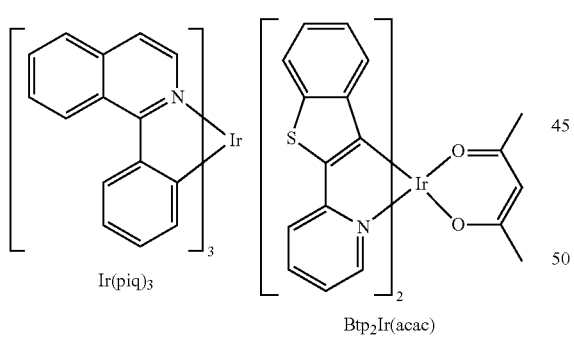
Ir(piq)₃  Btp₂Ir(acac)
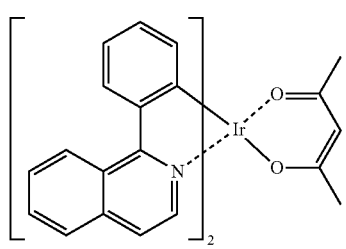
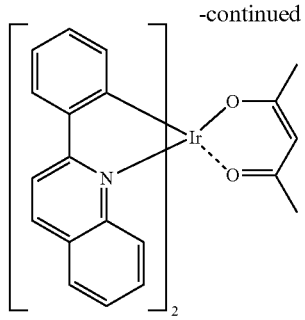 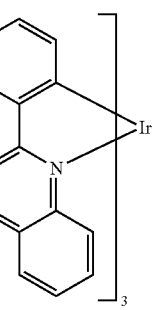
Ir(pq)₂(acac)  Ir(2-phq)₃
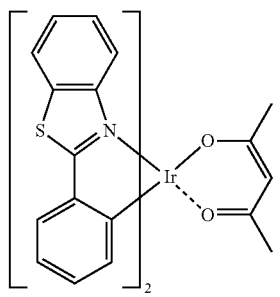
Ir(BT)₂(acac)
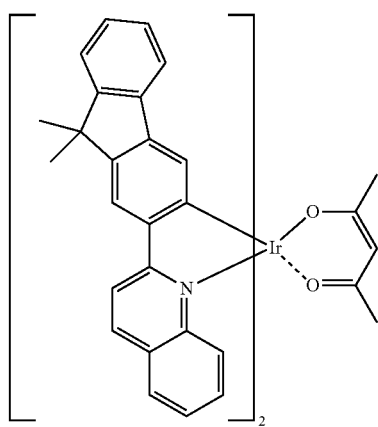
Ir(flq)₂(acac)

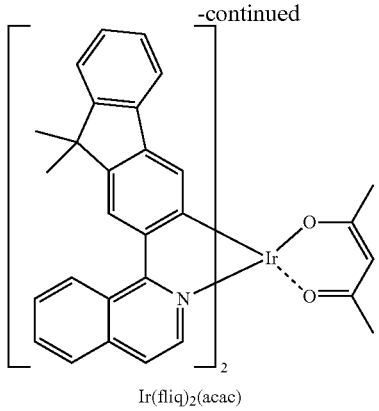
Ir(fliq)₂(acac)
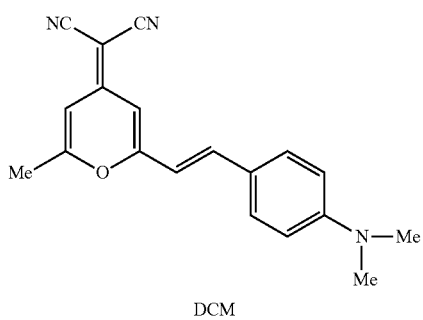
DCM
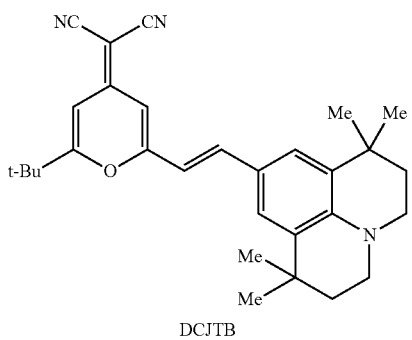
DCJTB
For example, compounds described below may be used as a green dopant, but are not limited thereto. C545T below may be used as the green dopant.
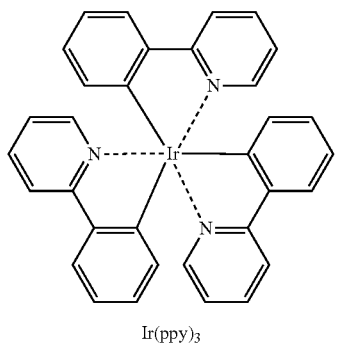
Ir(ppy)₃
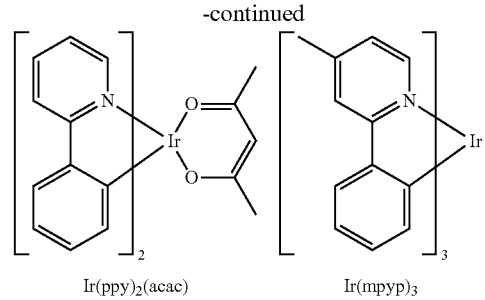
Ir(ppy)₂(acac)  Ir(mpyp)₃
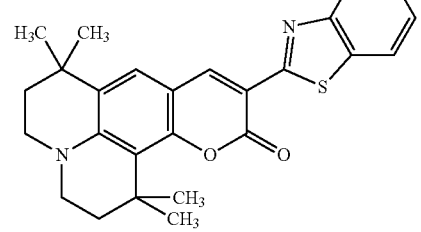
C545T
Examples of the dopant included in the EML include Pt-complexes below, but are not limited thereto:
D1
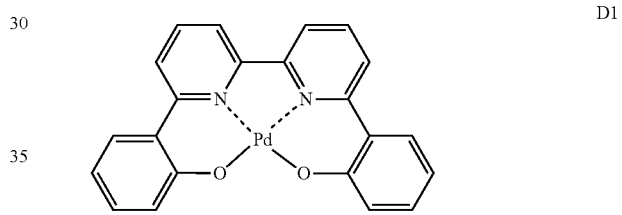
D2
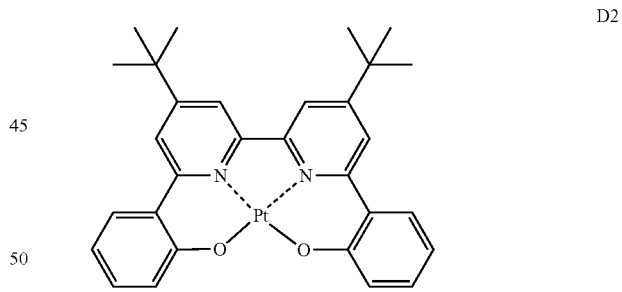
D3
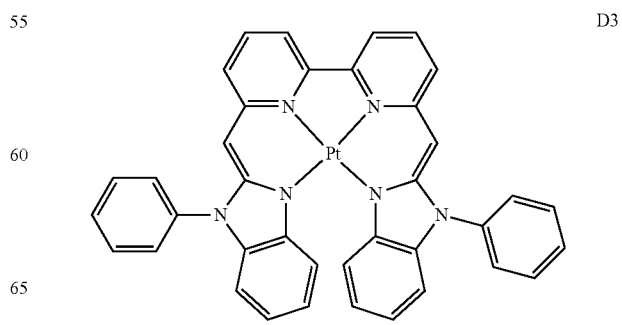

-continued
D4 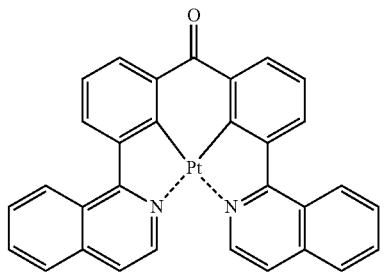
D5 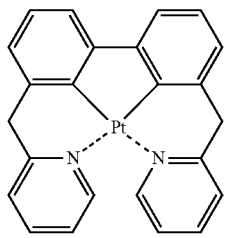
D6 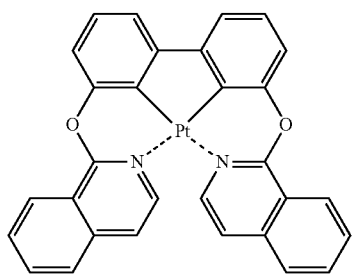
D7 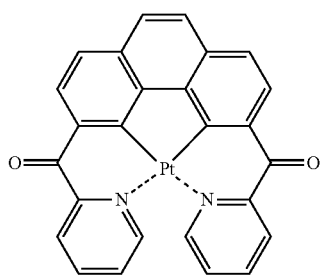
D8 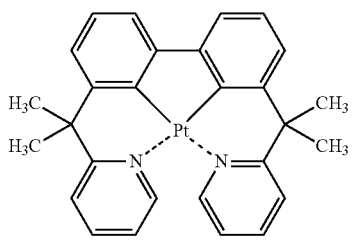
D9 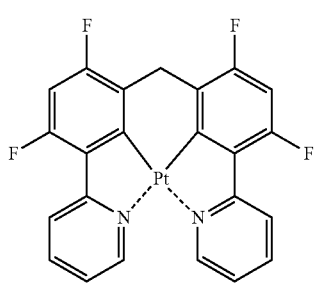
D10 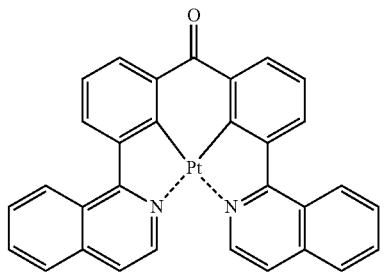
D11 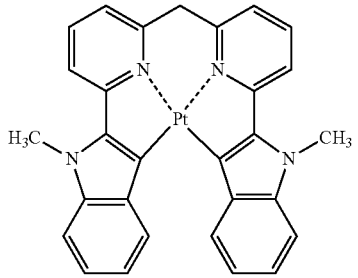
D12 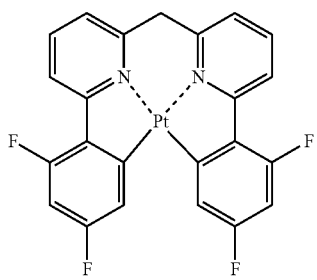
D13 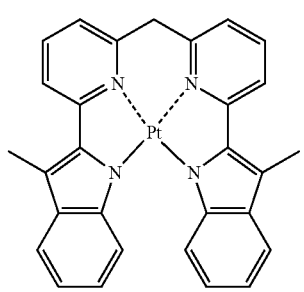
D14 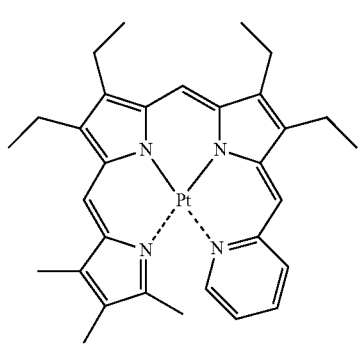

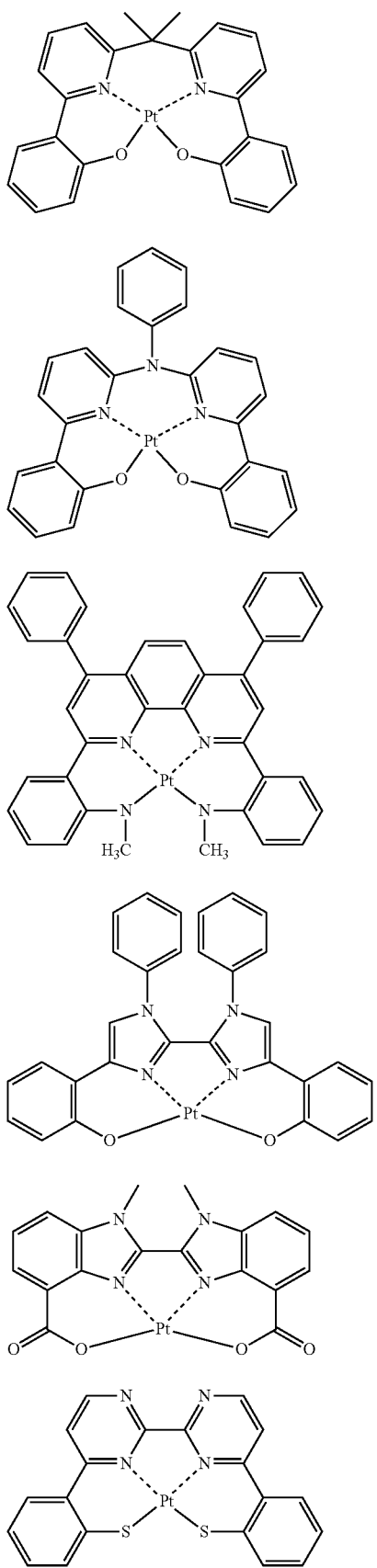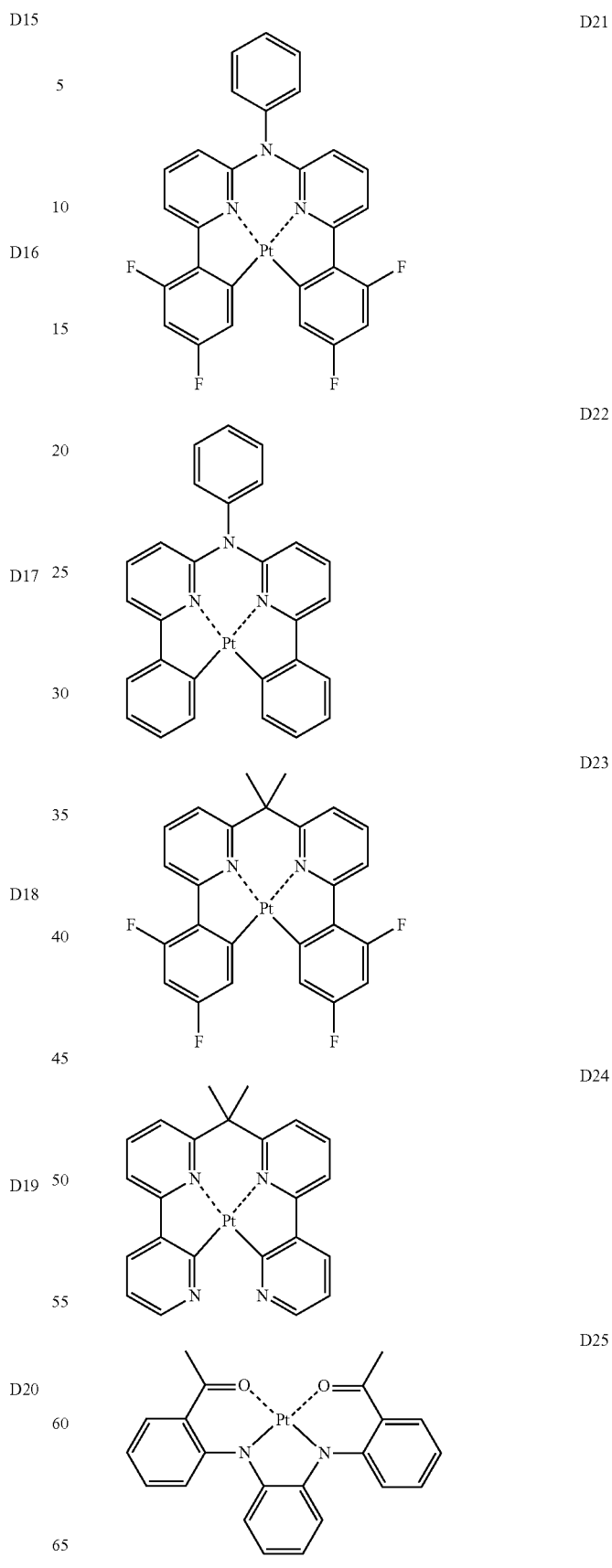

-continued
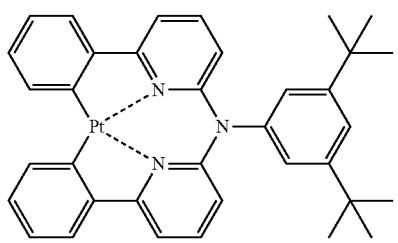
D26
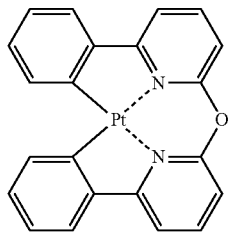
D27
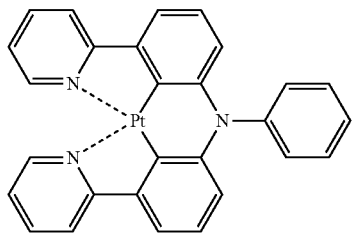
D28
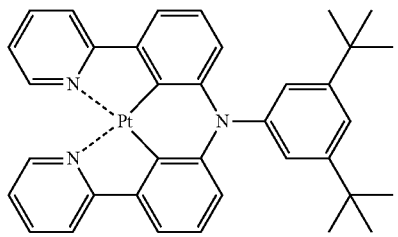
D29
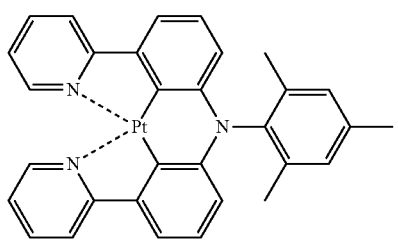
D30
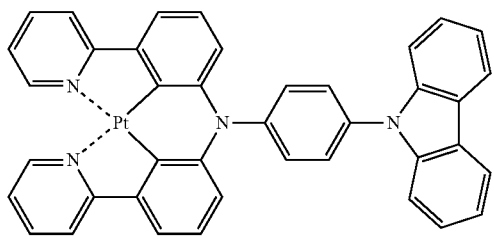
D31
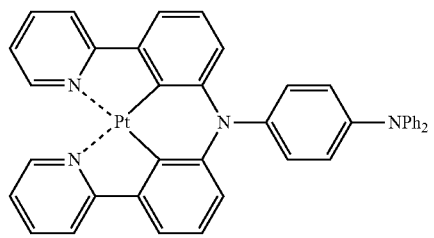
D32
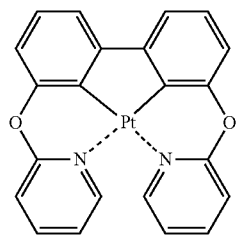
D33
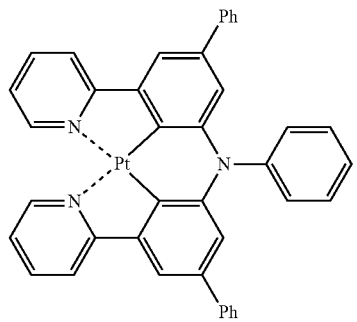
D34
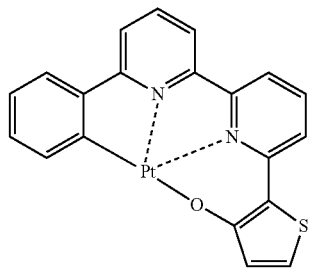
D35
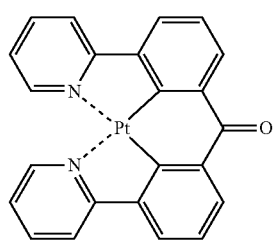
D36

-continued
D37
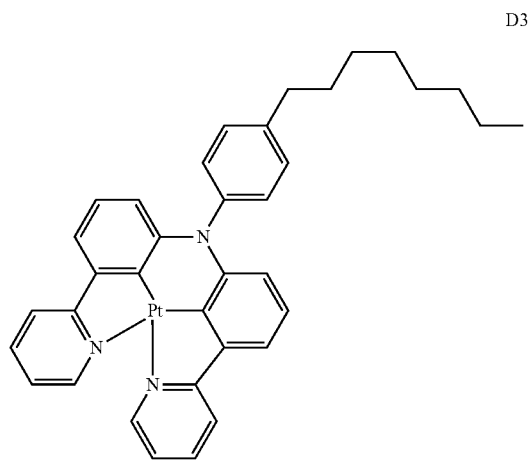
D38
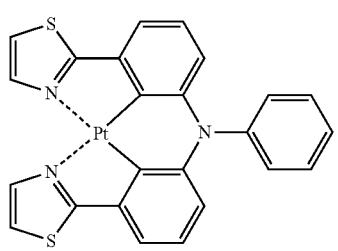
D39
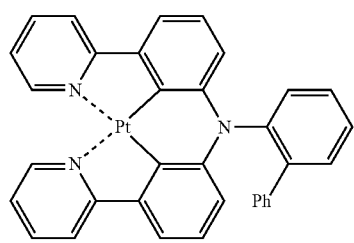
D40
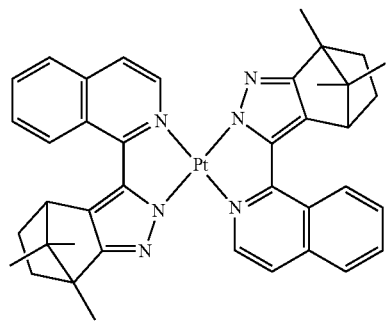
D41
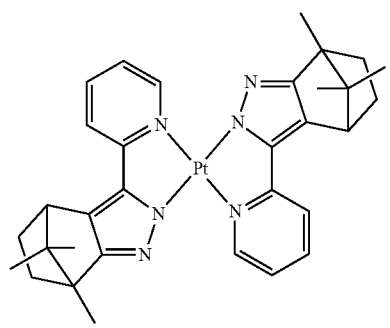
-continued
D42
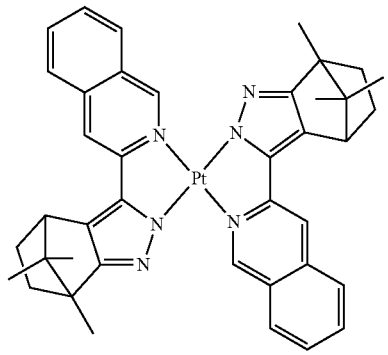
D43
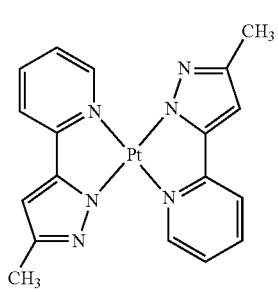
D44
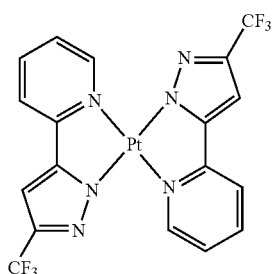
D45
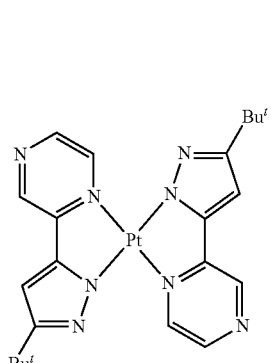
D46
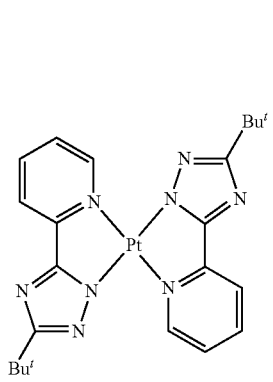

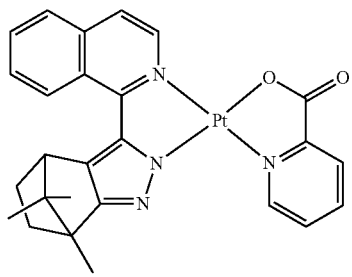

D47
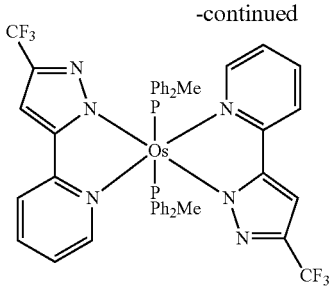
Os(fppz)₂(PPh₂Me)₂

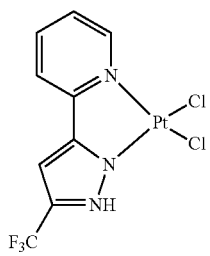

D48
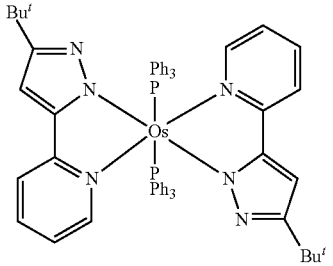
Os(bppz)₂(PPh₃)₂

D49
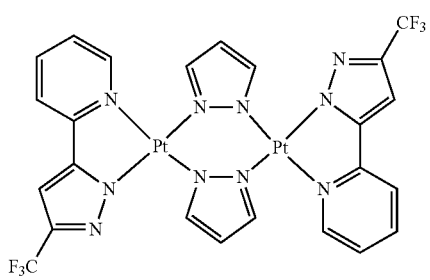

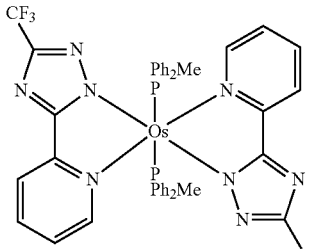
Os(fptz)₂(PPh₂Me)₂

D50
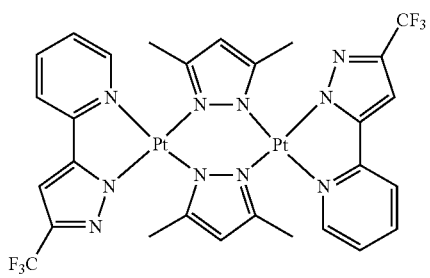

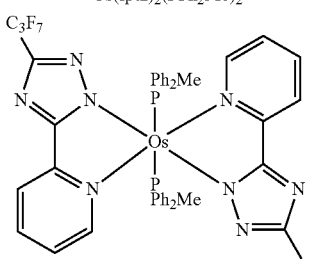
Os(hptz)₂(PPhMe₂)₂

Also, examples of the dopant included in the EML include, but are not limited to, Os-complexes:

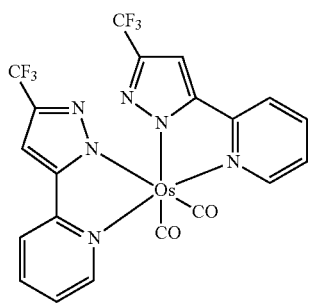
Os(fppz)₂(CO)₂

When the EML 150 includes a host and a dopant, the amount of the dopant in the EML may be generally in the range of about 0.01 to about 15 parts by weight based on 100 parts by weight of the host, but is not limited thereto.

The thickness of the EML 150 may be in the range of about 100 Å to about 1,000 Å, for example, in the range of about 200 Å to about 600 Å. When the thickness of the EML 150 is within this range, excellent luminescent properties may be obtained without a substantial increase in driving voltage.

The first electron transport unit 10 is formed by sequentially forming the first mixed layer 13 and the second mixed layer 17 on the EML 150 by various methods such as a vacuum deposition, spin coating, casting, or LB deposition. When the first mixed layer 13 and the second mixed layer 17 are formed by a vacuum deposition or spin coating, the deposition and coating conditions vary according to the compound being used. However, in general, the condition may be almost the same as the condition for forming the HIL 130.

The first mixed layer 13 includes the first material and the first dopant. The second mixed layer 17 includes the second material and the second dopant. The first dopant may be the same as the second dopant or may be different from the second dopant. For example, the first dopant and the second dopant may be the same. Since the first mixed layer 13 and the second mixed layer 17 include the first dopant and the second dopant, respectively, the OLED may have excellent electrical properties (e.g., efficiency properties or the like).

The first material and the second material are different from each other.

For example, the first material and the second material may satisfy at least one of Formulae 1, 2, and 3 below:

Electron mobility of the first material≠Electron mobility of the second material.    Formula 1

Absolute value of Lowest Unoccupied Molecular Orbital (LUMO) level of the first material≠Absolute value of LUMO level of the second material.    Formula 2

Absolute value of Highest Occupied Molecular Orbital (HOMO) level of the first material≠Absolute value of HOMO level of the second material.    Formula 3

Charges that are transferred by the first material and the second material may be holes or electrons. For example, the first material and the second material may transfer electrons.

In Formula 1 above, the measurement conditions (e.g., a temperature and an electric field) of the electron mobility of the first material and the electron mobility of the second material may be the same.

According to an embodiment of the present invention, the electron mobility of the first material may be greater than the electron mobility of the second material.

According to another embodiment of the present invention, the absolute value of the LUMO level of the first material may be smaller than or the same as the absolute value of the LUMO level of the second material.

According to another embodiment of the present invention, the absolute value of the HOMO level of the first material may be smaller than the absolute value of a HOMO level of the second material.

Figure 2:
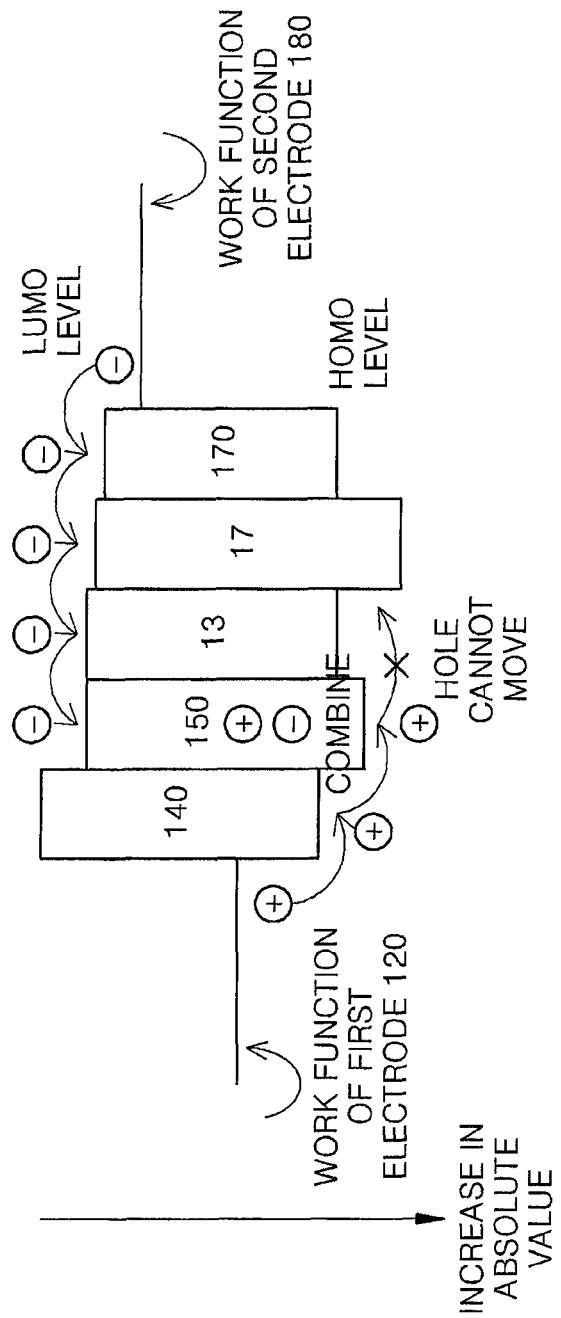
FIG. 2 is a diagram of energy levels of a material included in a hole injection layer (HIL) or a hole transport layer (HTL), a material included in an emission layer (EML) 150, a first material, a second material, a first dopant, and a second dopant included in an electrode transport layer (ETL) of the OLED of FIG. 1, according to an embodiment of the present invention.

FIG. 2 is a diagram of energy levels of a material included in the HIL 130 or the HTL 140; a material included in the EML 150; and the first material, the second material and the first dopant, in the OLED 100 of FIG. 1, according to an embodiment of the present invention.

A difference between an absolute value of a LUMO level of the first material and an absolute value of a LUMO level of the material included in the EML 150 may be equal to or less than 0.5 eV, for example, equal to or less than 0.3 eV. According to an embodiment of the present invention, the absolute value of the LUMO level of the first material and the absolute value of the LUMO level of the material included in the EML 150 may be substantially the same.

Accordingly, electrons injected from the second electrode 180 may be effectively transferred to the EML 150 through the EIL 170 and the ETL 160 (including the first material and the first dopant of the first mixed layer 13 and the second material and second dopant of the second mixed layer 17), and thus, the OLED 100 may have high efficiency.

An absolute value of a HOMO level of the second material 7 may be greater than an absolute value of a HOMO level of the material included in the EML 150.

Thus, holes injected from the first electrode 120 may not be substantially transferred to the ETL 160, thereby preventing exciton quenching, and thus the OLED 100 may have long lifetime (lifespan).

The first material and the second material may be selected from materials that satisfy the above-described conditions. For example, the first material may be an anthracene-based compound represented by any one of Formulae 10A, 10B, and 10C below:

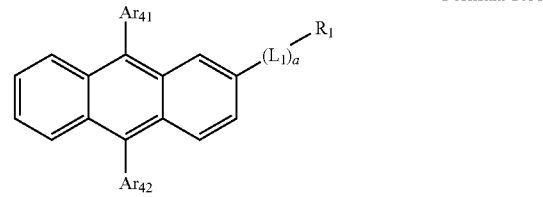

Formula 10A

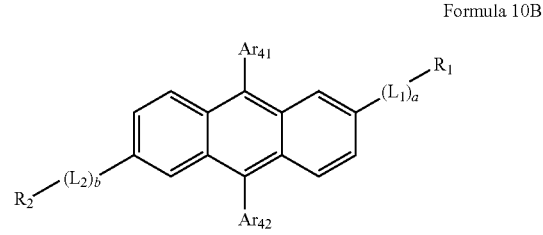

Formula 10B

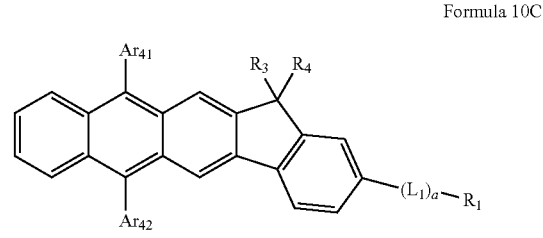

Formula 10C

In Formulae 10A through 10C, $Ar_{41}$ and $Ar_{42}$ may be each independently a substituted or unsubstituted $C_6$-$C_{60}$ aryl group or a substituted or unsubstituted $C_2$-$C_{60}$ heteroaryl group.

For example, $Ar_{41}$ and $Ar_{42}$ may be each independently any one of a $C_6$-$C_{60}$ aryl group and a $C_2$-$C_{60}$ heteroaryl group; and a $C_6$-$C_{60}$ aryl group and a $C_2$-$C_{60}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

For example, $Ar_{41}$ and $Ar_{42}$ may be each independently any one of a phenyl group, a naphthyl group, an anthryl group, a pyrenyl group, a fluorenyl group, a pyridinyl group, a pyrazinyl group, and a pyrimidinyl group; and a phenyl group, a naphthyl group, an anthryl group, a pyrenyl group, a fluorenyl group, a pyridinyl group, a pyrazinyl group, and a pyrimidinyl group that are substituted with at least one of a phenyl group, a naphthyl group, an anthryl group, a pyrenyl group, a fluorenyl group, a pyridinyl group, a pyrazinyl group, and a pyrimidinyl group, but are not limited thereto.

$Ar_{41}$ and $Ar_{42}$ may be the same but are not limited thereto.

In Formulae 10A through 10C, $L_1$ and $L_2$ may be each independently a substituted or unsubstituted $C_6$-$C_{60}$ arylene group or a substituted or unsubstituted $C_2$-$C_{60}$ heteroarylene group.

For example, $L_1$ and $L_2$ may be any one of a $C_6$-$C_{60}$ arylene group and a $C_2$-$C_{60}$ heteroarylene group; and a $C_6$-$C_{60}$ arylene group and a $C_2$-$C_{60}$ heteroarylene group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

For example, $L_1$ and $L_2$ may be each independently any one of a phenylene group, a naphthylene group, an anthrylene group, a pyrenylene group, a fluorenylene group, a pyridinylene group, a pyrazinylene group, and a pyrimidinylene group; and a phenylene group, a naphthylene group, an anthrylene group, a pyrenylene group, a fluorenylene group, a pyridinylene group, a pyrazinylene group, and a pyrimidinylene group that are substituted with at least one of a phenyl group, a naphthyl group, an anthryl group, a pyrenyl group, a fluorenyl group, a pyridinyl group, a pyrazinyl group, and a pyrimidinyl group, but are not limited thereto.

In Formulae 10A through 10C above, a and b may be each independently 0, 1, or 2. For example, in Formulae 10A through 10C above, a and b may be each independently 0 or 1.

In Formulae 10A through 10C above, $R_1$ and $R_2$ may be each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group.

For example, in Formulae 10A through 10C above, $R_1$ and $R_2$ may be each independently any one of a benzoimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group; and a benzoimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

In Formula 10C above, $R_3$ and $R_4$ may be each independently any one of a $C_1$-$C_{20}$ alkyl group and a $C_6$-$C_{20}$ aryl group; and a $C_1$-$C_{20}$ alkyl group and a $C_6$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof. For example, $R_3$ and $R_4$ may be each independently a methyl group, an ethyl group, a propyl group, a butyl group, a pentyl group, a hexyl group, a phenyl group, or a naphthyl group, but are not limited thereto.

For example, $R_1$ and $R_2$ may be each independently represented by any one of Formulae 11(1) through 11(24) below, but are not limited thereto:

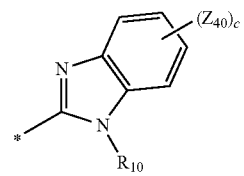

Formula 11(1)

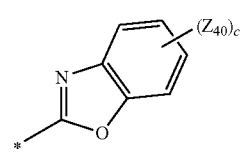

Formula 11(2)

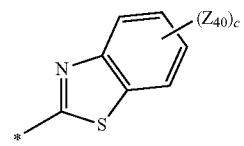

Formula 11(3)

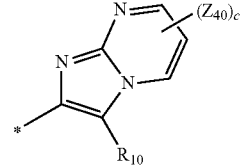

Formula 11(4)

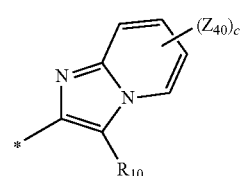

Formula 11(5)

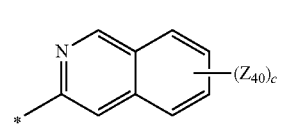

Formula 11(6)

Formula 11(7)
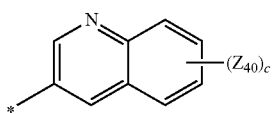

Formula 11(8)
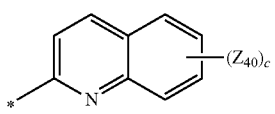

Formula 11(9)
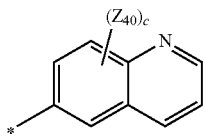

Formula 11(10)
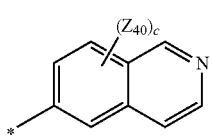

Formula 11(11)

Formula 11(12)
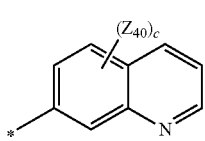

Formula 11(13)
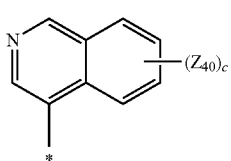

Formula 11(14)
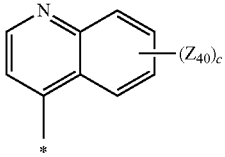

Formula 11(15)
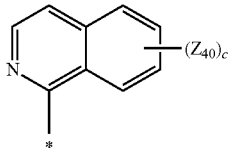

Formula 11(16)
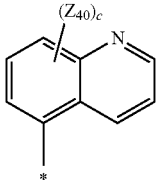

Formula 11(17)
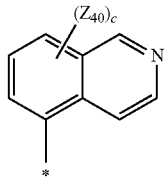

Formula 11(18)
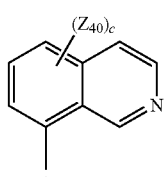

Formula 11(19)
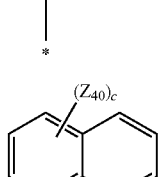

Formula 11(20)
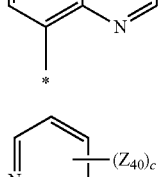

Formula 11(21)
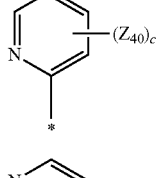

Formula 11(22)
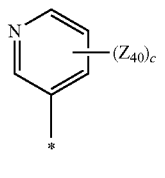

Formula 11(23)

Formula 11(24)

In Formulae 11(1) through 11(24) above, $R_{10}$ may be a substituted or unsubstituted $C_1$-$C_{60}$ alkyl group or a substituted or unsubstituted $C_6$-$C_{60}$ aryl group;

$Z_{40}$ may be any one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group, a $C_1$-$C_{60}$ alkoxy group, a $C_6$-$C_{60}$ aryl group, and a $C_2$-$C_{60}$ heteroaryl group; and a $C_1$-$C_{60}$ alkyl group, a $C_1$-$C_{60}$ alkoxy group, a $C_6$-$C_{60}$ aryl group, and a $C_2$-$C_{60}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; and c may be an integer from 1 to 5.

For example, $R_{10}$ may be any one of a methyl group, an ethyl group, a propyl group, a butyl group, a pentyl group, a hexyl group, a heptyl group, an octyl group, a phenyl group, a naphthyl group, an anthryl group, a fluorenyl group, and a phenanthrenyl group; and a methyl group, an ethyl group, a propyl group, a butyl group, a pentyl group, a hexyl group, a heptyl group, an octyl group, a phenyl group, a naphthyl group, an anthryl group, fluorenyl group, and a phenanthrenyl group that are substituted at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof.

The first material may be represented by any one of Formulae 10A(1) through 10A(12), 10B(1) through 10B(12), and 10C(1) through 10C(6) below, but is not limited thereto:

Formula 10A(1)

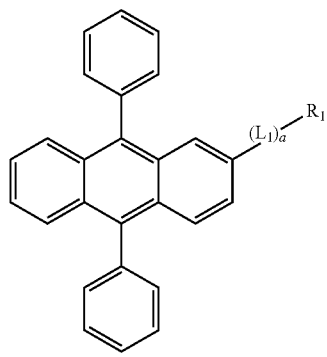

Formula 10A(2)

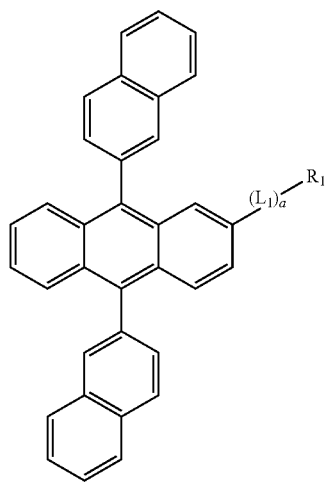

Formula 10A(3)

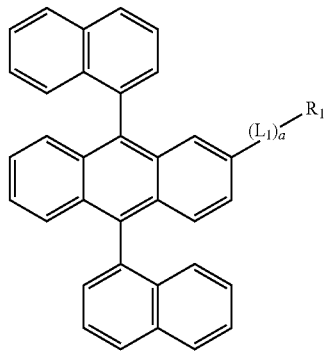

Formula 10A(4)

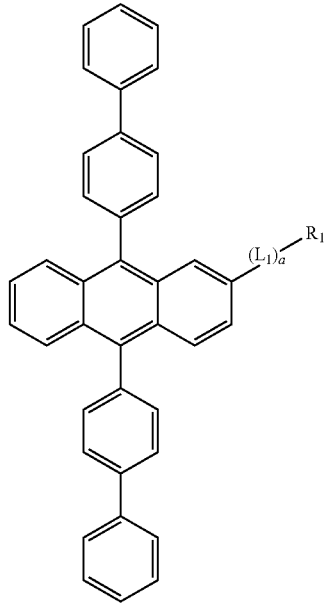

Formula 10A(5)

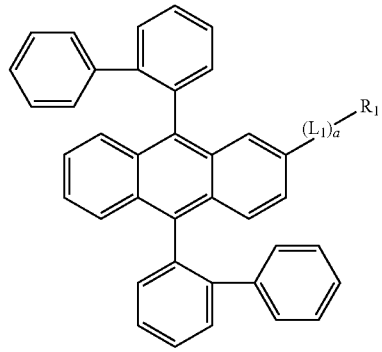

Formula 10A(6)
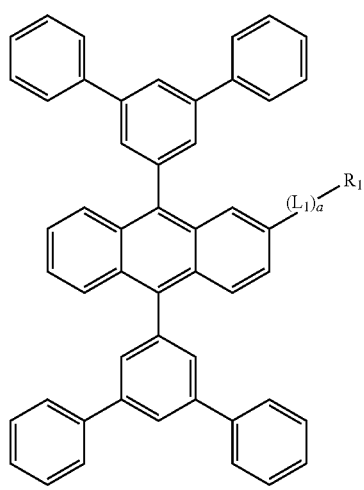
Formula 10A(7)
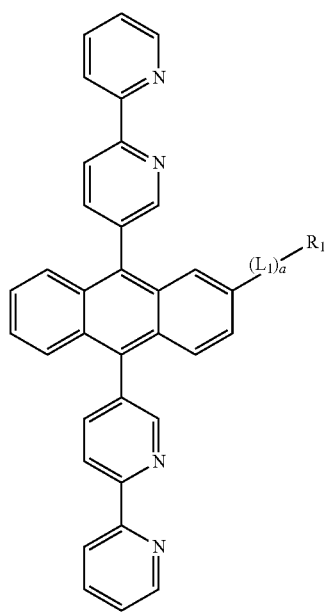
Formula 10A(8)
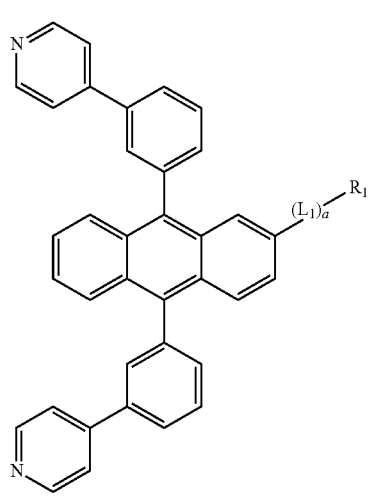
Formula 10A(9)
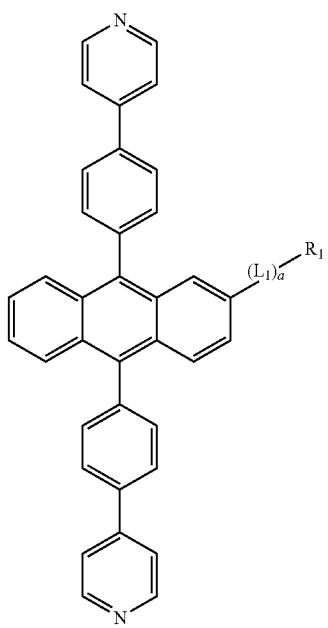
Formula 10A(10)
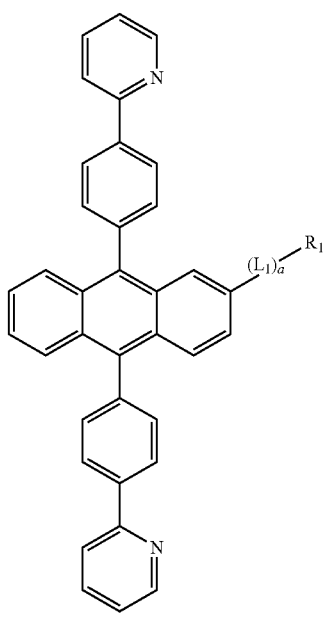

Formula 10A(11)
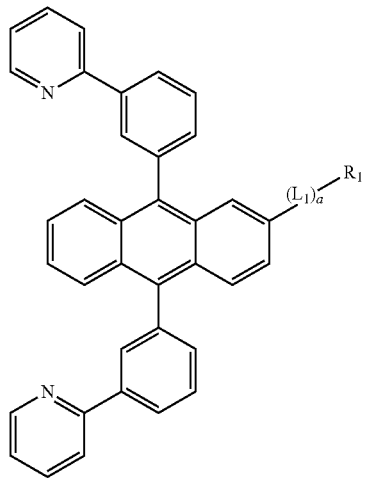
Formula 10A(12)
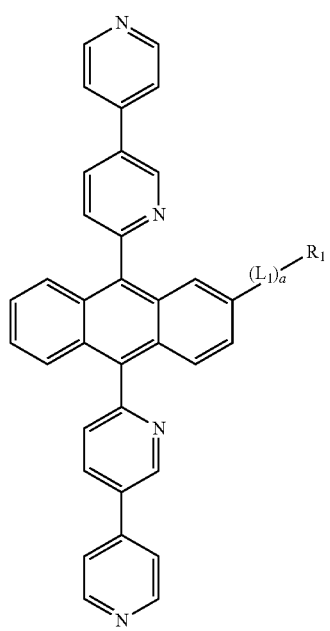
Formula 10B(1)
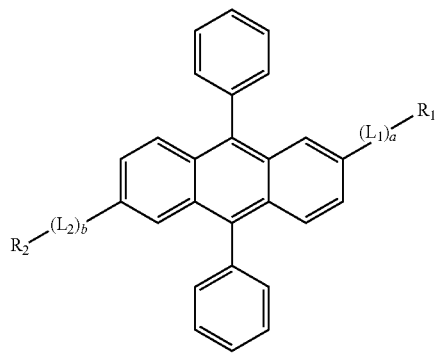
Formula 10B(2)
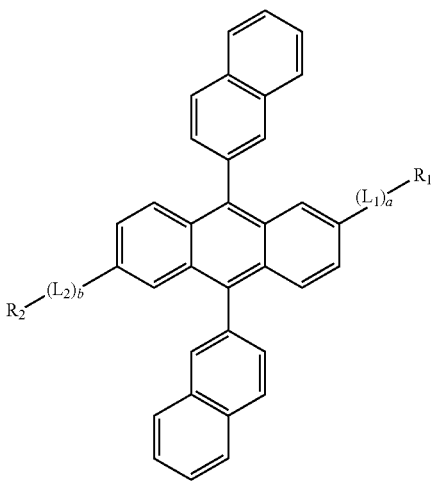
Formula 10B(3)
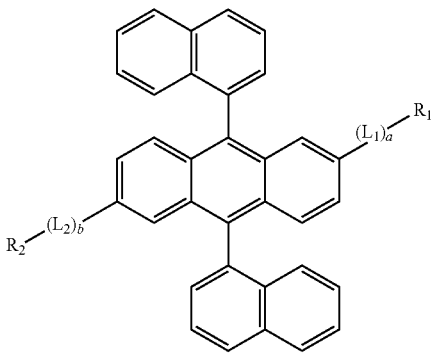
Formula 10B(4)
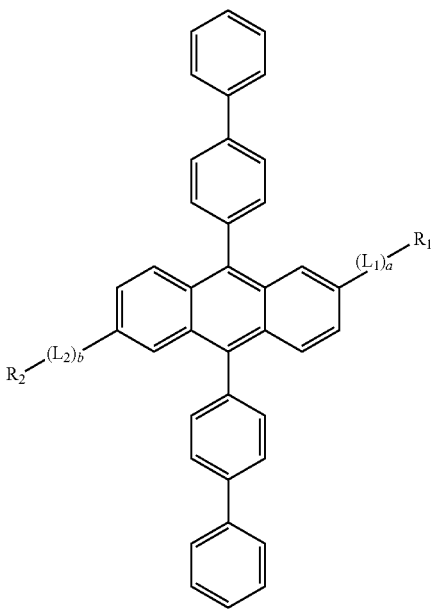

Formula 10B(5)
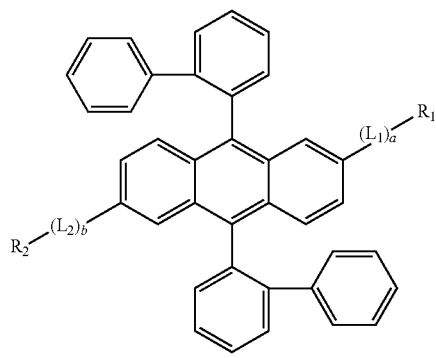
Formula 10B(6)
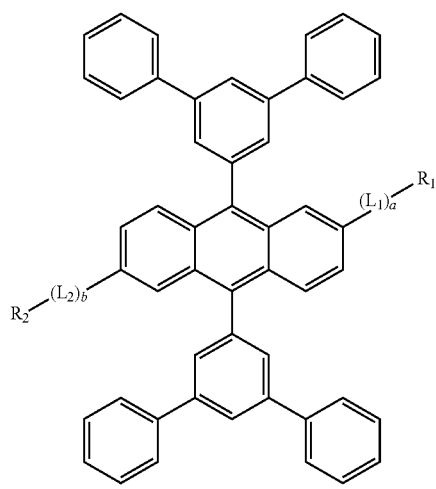
Formula 10B(7)
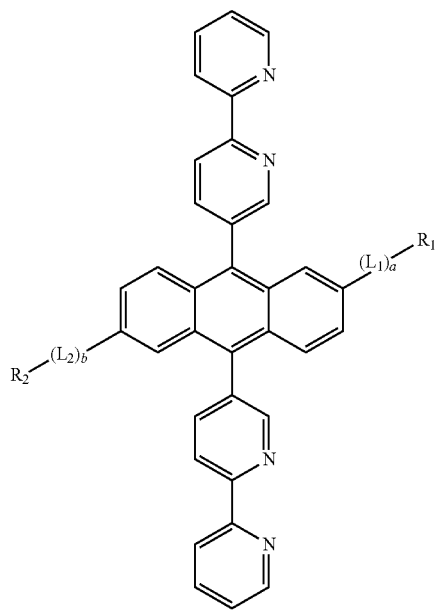
Formula 10B(8)
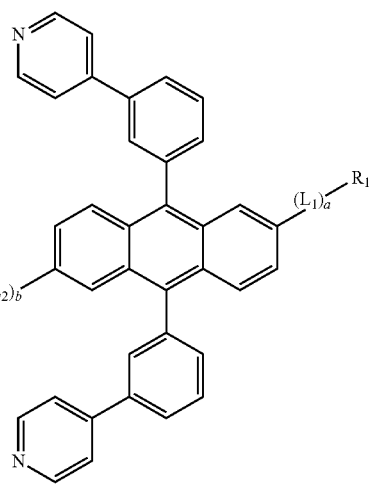
Formula 10B(9)
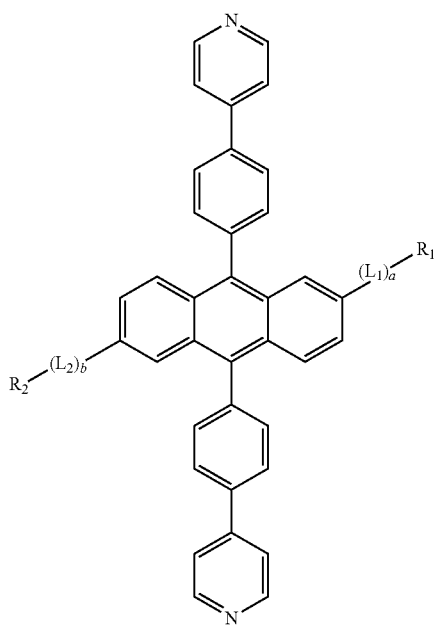

Formula 10B(10)
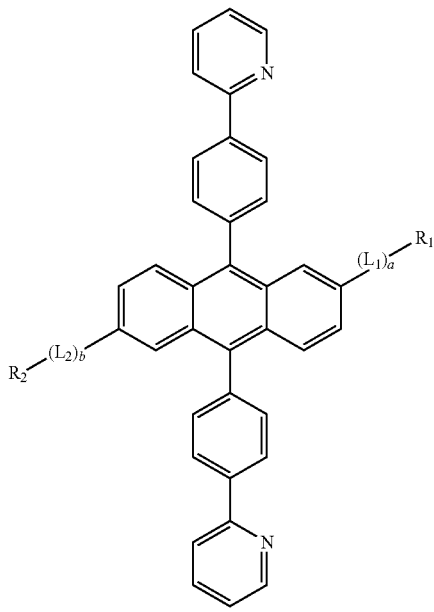
Formula 10B(11)
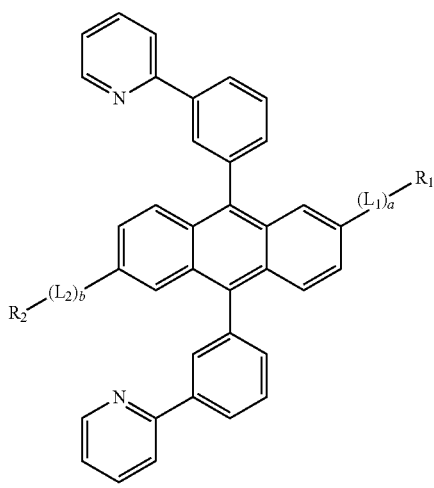
Formula 10B(12)
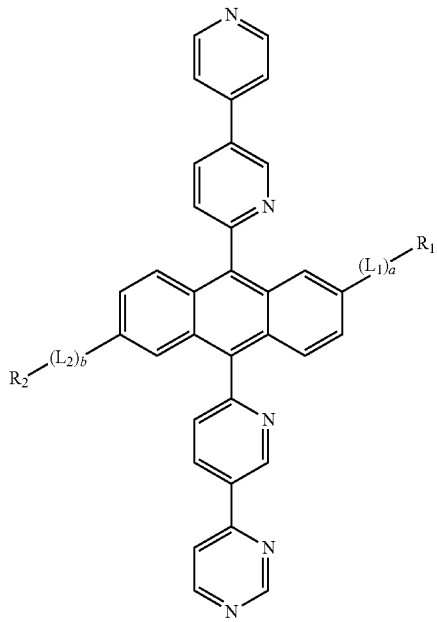
Formula 10C(1)
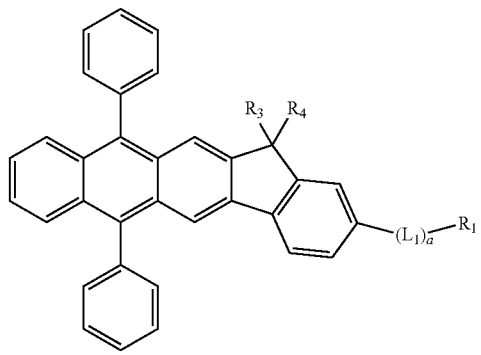
Formula 10C(2)
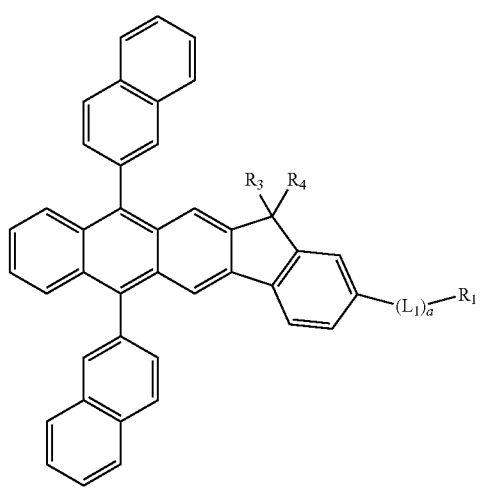

Formula 10C(3)

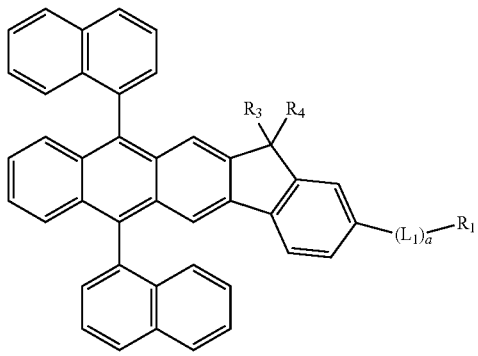

Formula 10C(4)

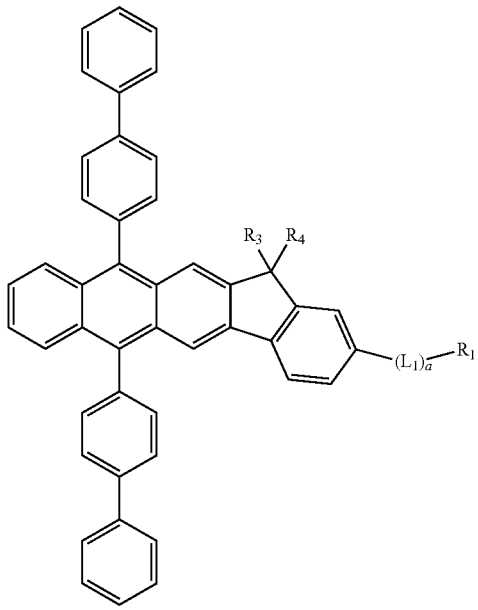

Formula 10C(5)

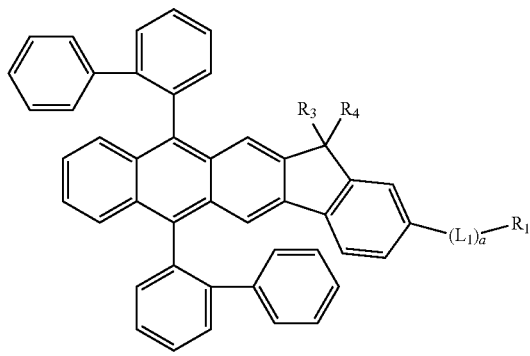

Formula 10C(6)

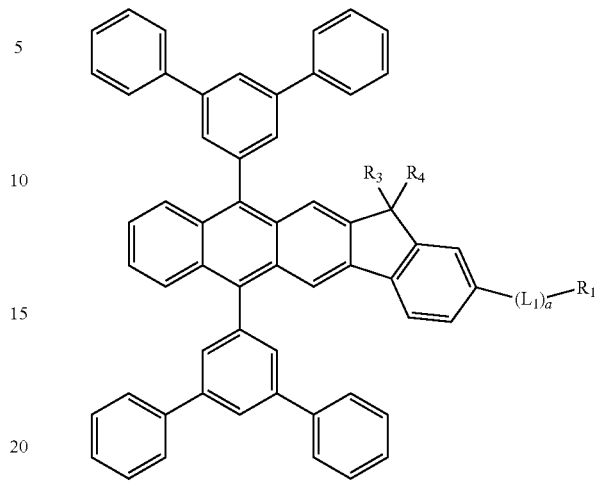

In Formulae 10A(1) through 10A(12) 10B(1) through 10B(12), and 10C(1) through 10C(6) above, $L_1$, $L_2$, a, b and $R_1$ through $R_4$ refer to the above detailed description.

According to an embodiment of the present invention, the first material may be represented by any one of Formulae 10A(1) through 10A(6), 10B(1) through 10B(6), and 10C(1) through 10C(6) above. In Formulae 10A(1) through 10A(6), 10B(1) through 10B(6), and 10C(1) through 10C(6) above, $R_1$ and $R_2$ may be each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, or a substituted or unsubstituted pyrazinyl group (for example, any one of Formulae 11(1) through 11(22) above).

According to another embodiment of the present invention, the first material may be represented by any one of Formulae 10A(1) through 10A(6), 10B(1) through 10B(6), and 10C(1) through 10C(6) above. In Formulae 10A(1) through 10A(6), 10B(1) through 10B(6), and 10C(1) through 10C(6), $R_1$ and $R_2$ may be each independently a substituted or unsubstituted benzoimidazolyl group, a substituted or unsubstituted benzoxazolyl group, or a substituted or unsubstituted benzothiazolyl group (for example, any one of Formulae 11(1) through 11(3)).

According to another embodiment of the present invention, the first material may be represented by any one of Formulae 10A(7) through 10A(12) and 10B(7) through 10B(12) above. In Formulae 10A(7) through 10A(12) and 10B(7) through 10B(12), $R_1$ and $R_2$ may be each independently a substituted or unsubstituted phenyl group or a substituted or unsubstituted naphthyl group (for example, any one of Formula 11(23) or 11(24)), but are not limited thereto.

The first material may be any one of Compounds 200 through 210 below, but is not limited thereto:

Compound 200
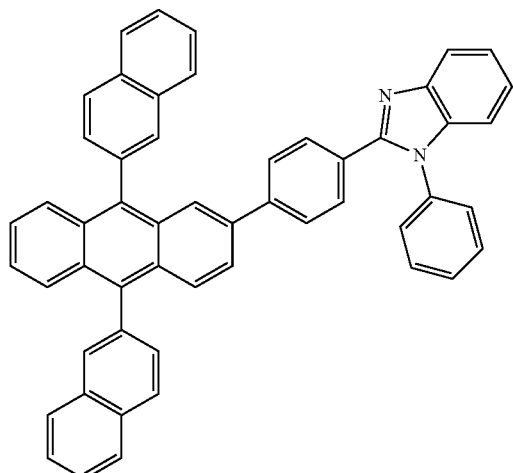
Compound 201
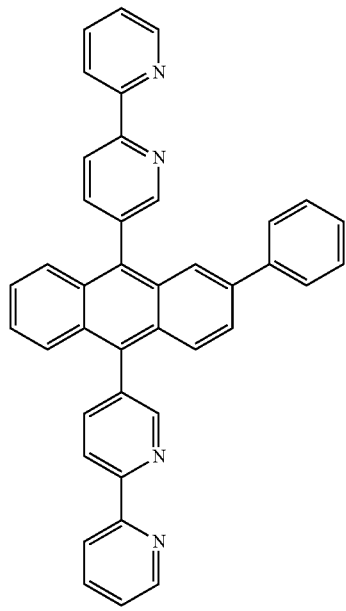
Compound 202
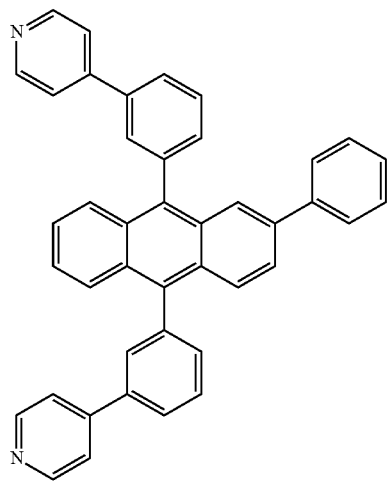
Compound 203
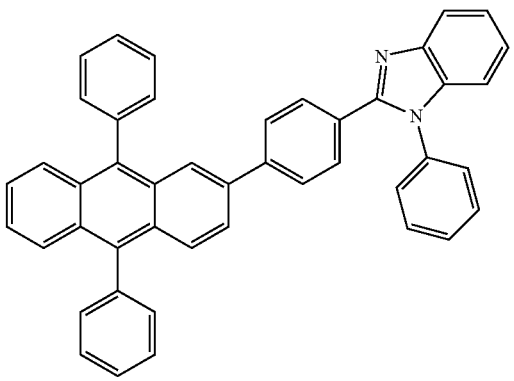
Compound 204
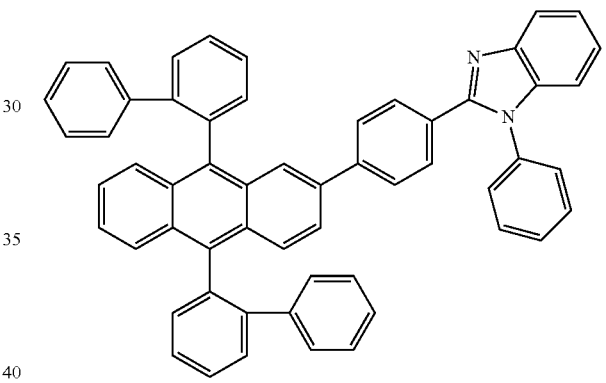
Compound 205
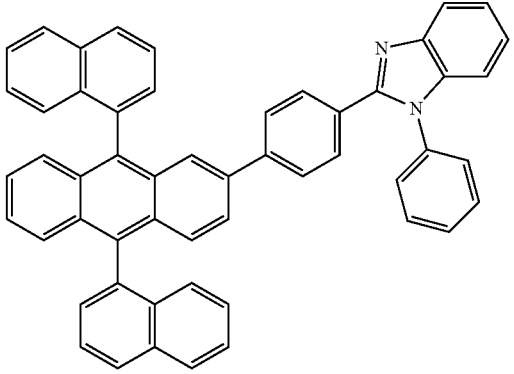

Compound 206

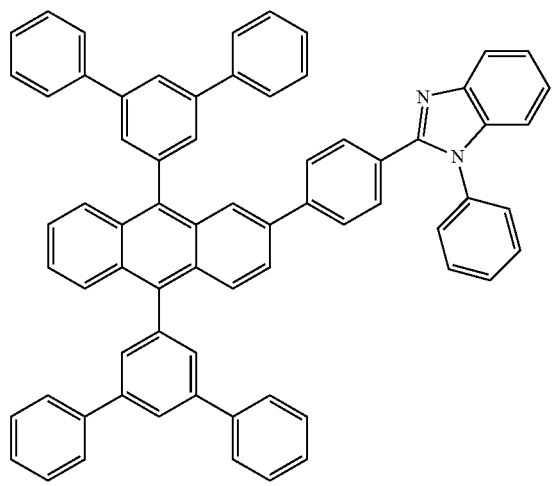

Compound 207

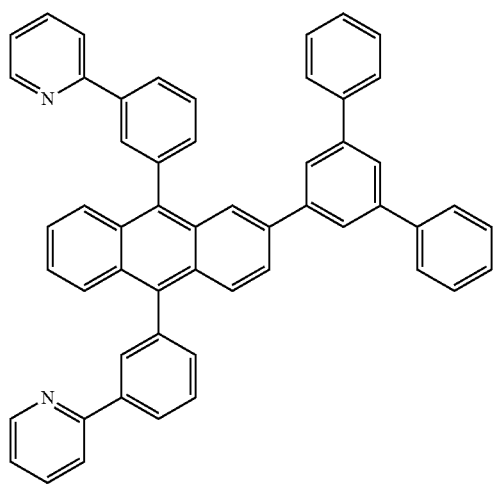

Compound 208

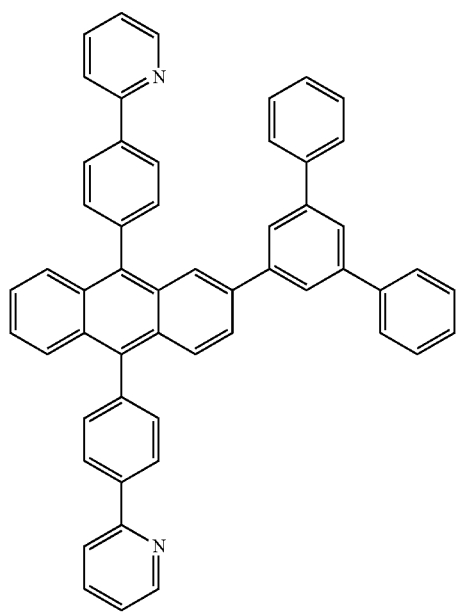

Compound 209

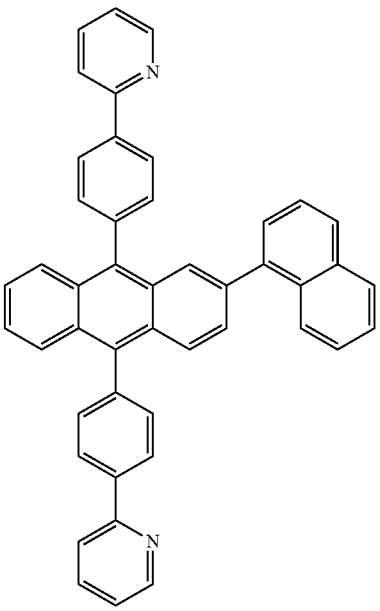

Compound 210

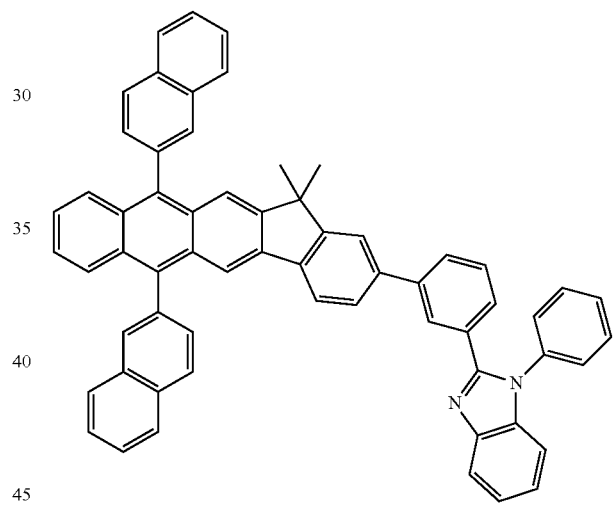

For example, the second material may be represented by Formula 20A below:

Formula 20A

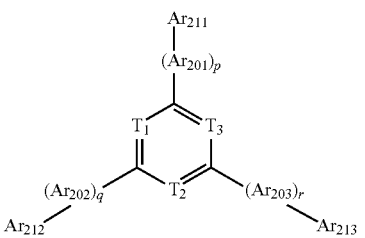

In Formula 20A above, $T_1$ through $T_3$ may be each independently N or $C(R_{100})$, wherein $R_{100}$ may hydrogen; deuterium; —F; —Cl; —Br; —I; —CN; a hydroxyl group; —$NO_2$; an amino group; an amidino group; hydrazine; hydrazone; a carboxyl group or a salt thereof; a sulfonic acid group or a salt thereof; a phosphoric acid or a salt thereof;

a $C_1$-$C_{60}$ alkyl group and a $C_1$-$C_{60}$ alkoxy group; and a $C_1$-$C_{60}$ alkyl group and a $C_1$-$C_{60}$ alkoxy group that are substituted by at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof.

In Formula 20A above, all $T_1$ through $T_3$ may be N; $T_1$ may be $C(R_{100})$ and $T_2$ and $T_3$ may be N; or all $T_1$ through $T_3$ may be $C(R_{100})$ but the present invention is not limited thereto.

In Formula 20A above, $Ar_{201}$ through $Ar_{203}$ may be each independently a substituted or unsubstituted $C_6$-$C_{60}$ arylene group or a substituted or unsubstituted $C_2$-$C_{60}$ heteroarylene group. $Ar_{201}$ through $Ar_{203}$ may be each independently any one of a phenylene group, a naphthylene group, an anthrylene group, a pyrenylene group, a fluorenylene group, a pyridinylene group, a pyrazinylene group and a pyrimidinylene group; and a phenylene group, a naphthylene group, an anthrylene group, a pyrenylene group, a fluorenylene group, a pyridinylene group, a pyrazinylene group, and a pyrimidinylene group that are substituted by at least one of a phenyl group, a naphthyl group, an anthryl group, a pyrenyl group, a fluorenyl group, a pyridinyl group, a pyrazinyl group, and a pyrimidinyl group, but are not limited thereto.

In Formula 20A above, p, q, and r may be each independently 0, 1, or 2. For example, in Formula 20A above, p, q, and r may be each independently 0 or 1 but are not limited thereto.

In Formula 20A above, $Ar_{211}$ through $Ar_{213}$ may be each independently a substituted or unsubstituted $C_6$-$C_{60}$ aryl group or a substituted or unsubstituted $C_2$-$C_{60}$ heteroaryl group. For example, $Ar_{211}$ through $Ar_{213}$ may be each independently a substituted or unsubstituted benzoimidazolyl group, a substituted or unsubstituted benzooxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group.

According to an embodiment of the present invention, $Ar_{211}$ through $Ar_{213}$ may be each independently represented by any one of Formulae 11(1) through 11(26) below but are not limited thereto:

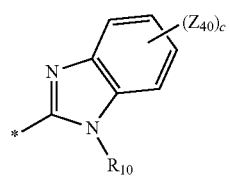

Formula 11(1)

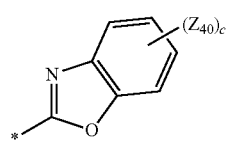

Formula 11(2)

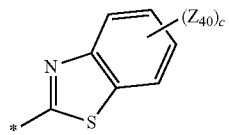

Formula 11(3)

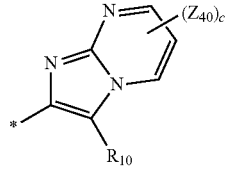

Formula 11(4)

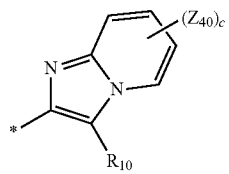

Formula 11(5)

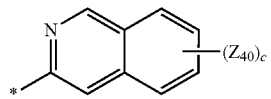

Formula 11(6)

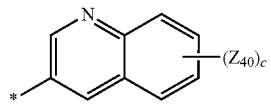

Formula 11(7)

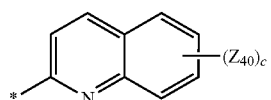

Formula 11(8)

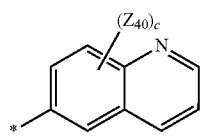

Formula 11(9)

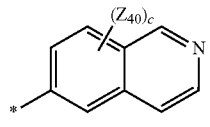

Formula 11(10)

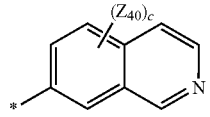

Formula 11(11)

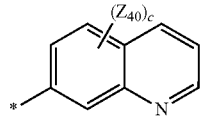

Formula 11(12)

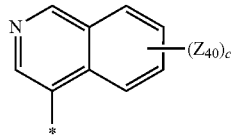

Formula 11(13)

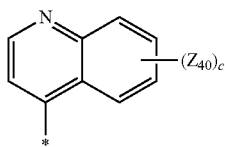
Formula 11(14)

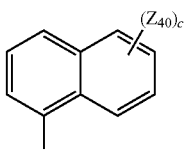
Formula 11(24)

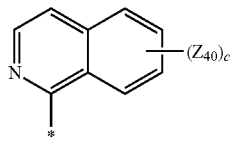
Formula 11(15)

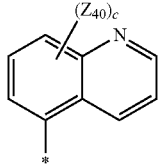
Formula 11(16)

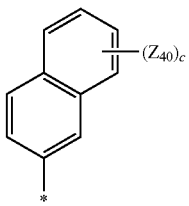
Formula 11(25)

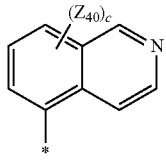
Formula 11(17)

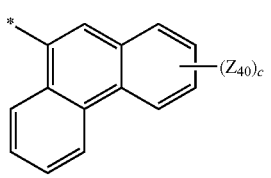
Formula 11(26)

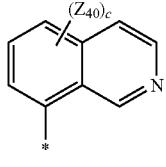
Formula 11(18)

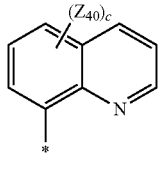
Formula 11(19)

In Formulae 11(1) through 11(26) above, $R_{10}$, $Z_{40}$, and c refer to the above detailed description.

For example, in Formula 20A above, at least one of $Ar_{211}$ through $Ar_{213}$ may be a substituted or unsubstituted phenanthrenyl group.

According to an embodiment of the present invention, the second material may be represented by Formula 20A(1) or 20A(2) below but is not limited thereto:

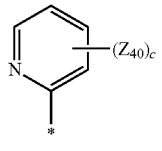
Formula 11(20)

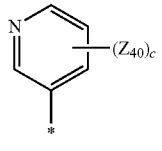
Formula 11(21)

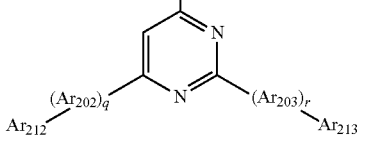

Formula 20A(1)

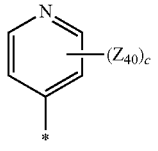
Formula 11(22)

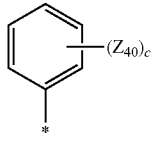
Formula 11(23)

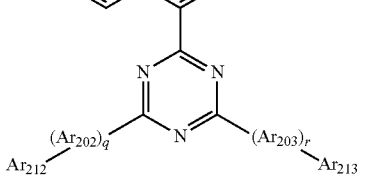

Formula 20A(2)

Formula 20A(3)

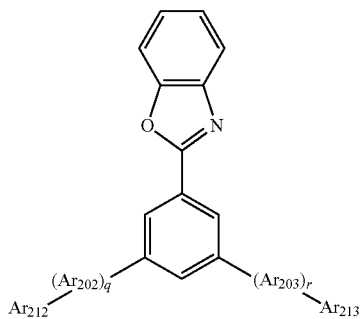

In Formulae 20A(1) through 20A(3), $Ar_{202}$, $Ar_{203}$, q, r, $Ar_{212}$, and $Ar_{213}$ refer to the above detailed description.

The second material may be any one of Compounds 600 through 604 below but is not limited thereto:

Compound 600

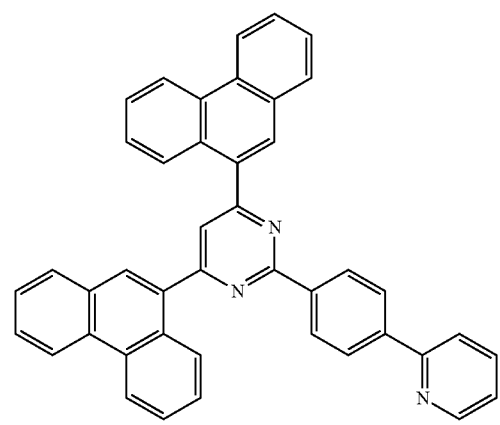

Compound 601

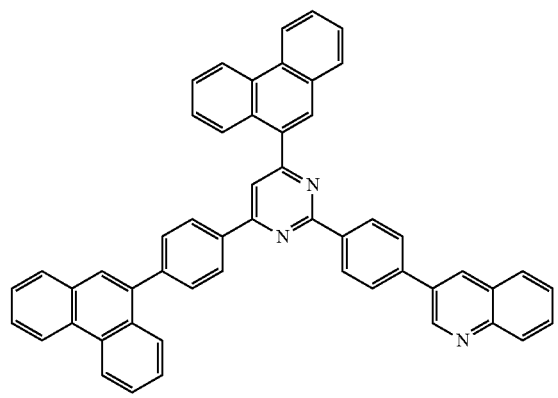

Compound 602

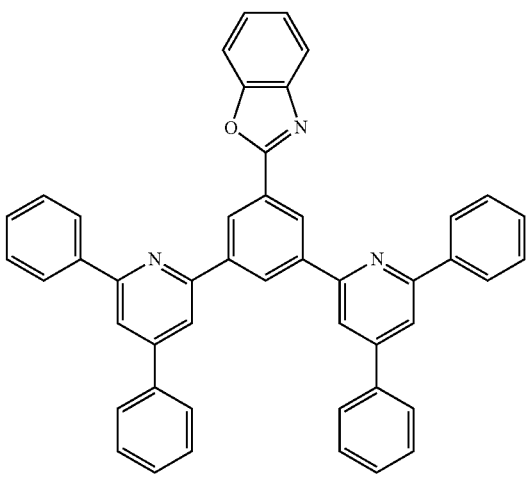

Compound 603

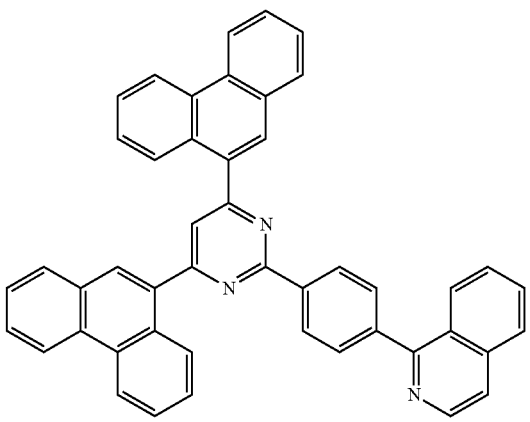

Compound 604

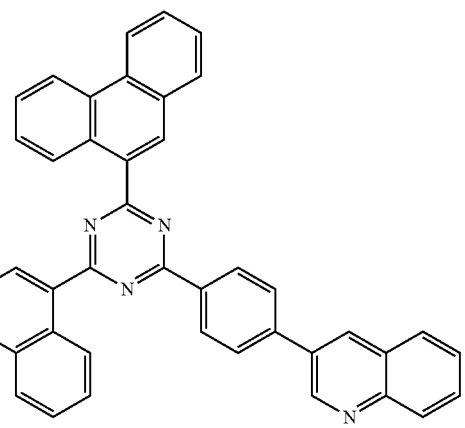

The first dopant and the second dopant may be each independently an n-dopant. For example, the first dopant and the second dopant may be each independently a Li complex, LiF, CsF, $Al_2O_3$, $SiO_2$, $Si_3N_4$, or $Cs_2CO_3$. According to an embodiment of the present invention, the first dopant and the second dopant may be each independently Compound 250 or Compound 251 below but are not limited thereto:

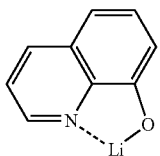

Compound 250

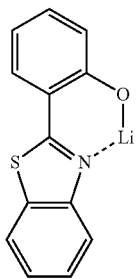

Compound 251

The first dopant and the second dopant may be the same or different. For example, the first dopant and the second dopant may be the same but are not limited thereto.

A thickness ratio of the first mixed layers 13, 23, 33, and 43 and the second mixed layers 17, 27, 37, and 47 may be 1:9 through 9:1, for example, 4:6 through 6:4. The first mixed layers 13, 23, 33, and 43 may each have a thickness ranging from 30 Å to 100 Å. The second mixed layers 17, 27, 37, and 47 may each have a thickness ranging from 30 Å through 100 Å. In one embodiment, when the thickness ratios and the thickness ranges are satisfied, the OLED has high efficiency and high lifetime without a substantial increase in a driving voltage.

Various changes may be made, for example, thicknesses of the first electron transport unit 10, the second electron transport unit 20, the third electron transport unit 30, and the fourth electron transport unit 40 may be the same or different.

The ETL 160 may have a thickness ranging from about 300 Å to about 500 Å, for example, about 300 Å through about 400 Å. In one embodiment, when the thickness of the ETL 160 satisfies the above-described range, the ETL 160 has satisfactory electron transporting ability without a substantial increase in a driving voltage.

The EIL 170 may be formed on the ETL 160. The EIL 170 may be formed of a material for facilitating injection of electrons from a cathode but is not limited thereto.

The EIL 170 may be formed of a known electron injection material such as LiF, NaCl, CsF, $Li_2O$, BaO, or the like. The deposition condition for forming the EIL 170 varies according to a used compound. However, in general, the deposition condition of the EIL 170 may be almost the same as the condition for forming the HIL 130.

The EIL 170 may have a thickness ranging from about 1 Å to about 100 Å, for example, about 3 Å to about 90 Å. When the thickness of the EIL 170 satisfies the above-described range, the EIL 170 may have satisfactory electron injection ability without a substantial increase in a driving voltage.

The second electrode 180 may be formed on the EIL 170. The second electrode 180 may be a cathode that is an electron transport electrode. In this case, the second electrode 180 may be formed of metal, an alloy, an electrical conductive compound, and a mixture thereof, each of which has a low work function. The second electrode 180 may be formed as a transmissive electrode by forming a thin film of, for example, lithium (Li), magnesium (Mg), aluminium (Al), aluminium-lithium (Al—Li), calcium (Ca), magnesium-indium (Mg—In), magnesium-silver (Mg—Ag), or the like. Various changes may be made, for example, in order to obtain a top emission-type organic light-emitting device. The transmissive electrode is formed of ITO, IZO, or the like.

Figure 3:
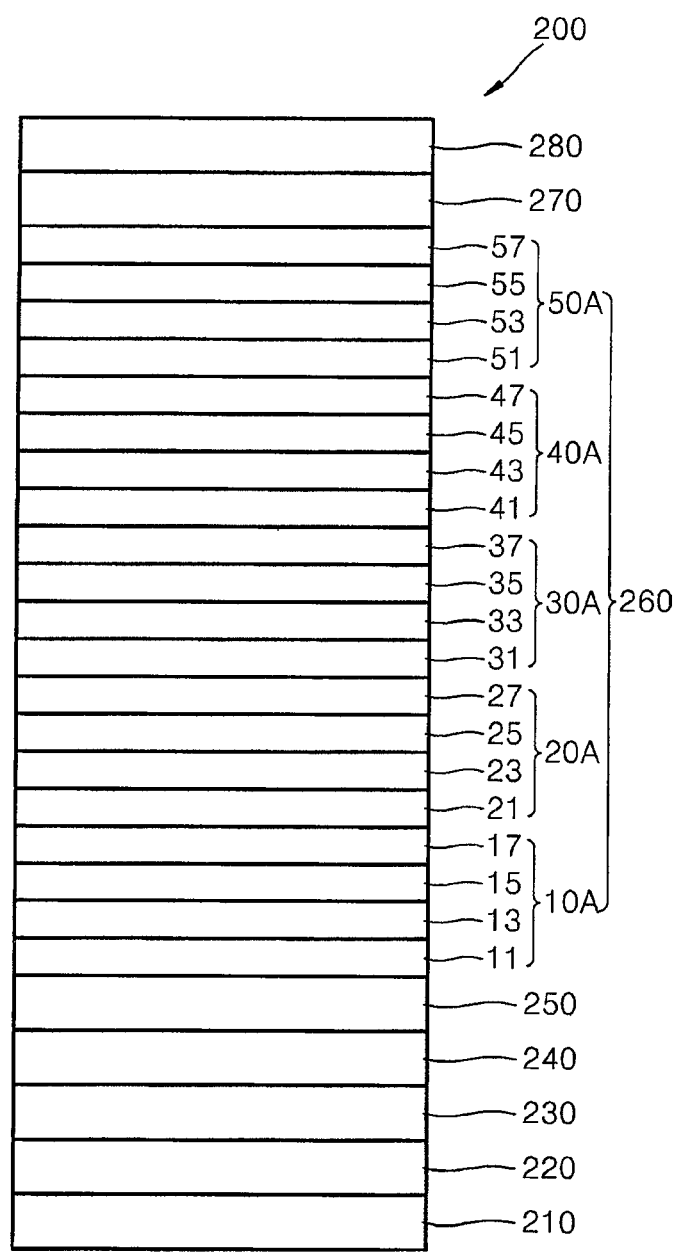
FIG. 3 is a cross-sectional view of an OLED according to another embodiment of the present invention.

FIG. 3 is a cross-sectional view of an OLED 200 according to another embodiment of the present invention.

Referring to FIG. 3, the OLED 200 has a structure in which a substrate 210, a first electrode 220, an HIL 230, an HTL 240, an EML 250, an ETL 260, an EIL 270, and a second electrode 280 are sequentially stacked.

The ETL 260 has a structure in which i) a first electron transport unit 10A including a first layer 11, a first mixed layer 13, a second layer 15, and a second mixed layer 17, ii) a second electron transport unit 20A including a first layer 21, a first mixed layer 23, a second layer 25, and a second mixed layer 27, iii) a third electron transport unit 30A including a first layer 31, a first mixed layer 33, a second layer 35, and a second mixed layer 37, and iv) a fourth electron transport unit 40A including a first layer 41, a first mixed layer 43, a second layer 45, and a second mixed layer 47 are sequentially stacked (that is, n=4).

The first layers 11, 21, 31, and 41 include (e.g., each only include) the first material. The first mixed layers 13, 23, 33, and 43 include the first material and the first dopant. The second layers 15, 25, 35, and 45 include (e.g., each only include) the second material. The second mixed layers 17, 27, 37, and 47 include a second material and a second dopant. In this case, the first layers 11, 21, 31, and 41, and the second layers 15, 25, 35, and 45 may not include the first dopant and the second dopant.

The first material included in the first layers 11, 21, 31, and 41, and the first material included in the first mixed layers 13, 23, 33, and 43 may be the same.

The second material included in the second layers 15, 25, 35, and 45, and the second material included in the second mixed layers 17, 27, 37, and 47 may be the same.

The first layers 11, 21, 31, and 41 may each have a thickness ranging from 1 Å to 10 Å. The first mixed layers 13, 23, 33, and 43 may each have a thickness ranging from 30 Å to 100 Å. The second layers 15, 25, 35, and 45 may each have a thickness ranging from 1 Å to 10 Å. The second mixed layers 17, 27, 37, and 47 may each have a thickness ranging from 30 Å to 100 Å. In one embodiment, when the above-described ranges are satisfied, the OLED 200 has high efficiency and long lifetime without a substantial increase in a driving voltage.

Various changes may be made, for example, thicknesses of the first electron transport unit 10A, the second electron transport unit 20A, the third electron transport unit 30A, and the fourth electron transport unit 40A may be the same or different.

The ETL 260 may have a thickness ranging from about 300 Å to about 500 Å, for example, about 300 Å to about 400 Å. When the thickness of the ETL 260 satisfies the above-described range, the ETL 260 may have satisfactory electron transporting ability without a substantial increase in a driving voltage.

For example, when a phosphorescent dopant is used in the EMLs 150 and 250, a hole block layer (HBL) may be formed between the ETLs 160 and 260 and the EMLs 150 and 250 by using various methods such as a vacuum deposition, spin coating, casting, or LB deposition in order to prevent triplet excitons or holes from being diffused to the ETLs 160 and 260. When the HBL is formed by vacuum deposition or spin coating, the deposition conditions may vary according to a compound used as a material for forming the HBL. The conditions may be almost the same as the conditions for forming a HIL, in general. The HBL may be formed of a known hole block material. Examples of the known hole block material include, but are not limited to, oxadiazole derivatives, triazole derivatives, phenanthroline derivatives, or the like. For example, the HBL may be formed of BCP below:

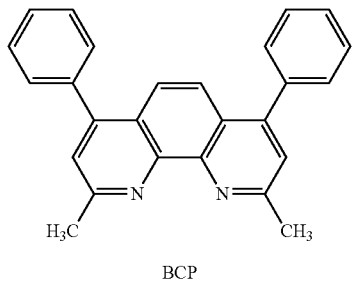 [SMILES: Cc1cc(-c2ccccc2)c2ccc3c(-c4ccccc4)cc(C)nc3c2n1 ; "BCP"]

BCP

The HBL may have a thickness ranging from about 20 Å to about 1000 Å, for example, about 30 Å to about 300 Å. When the thickness of the HBL satisfies the above-described range, the HBL may have satisfactory hole block ability without a substantial increase in driving voltage.

Various changes may be made, for example, the EILs 170 and 270 may be omitted.

Figure 4:
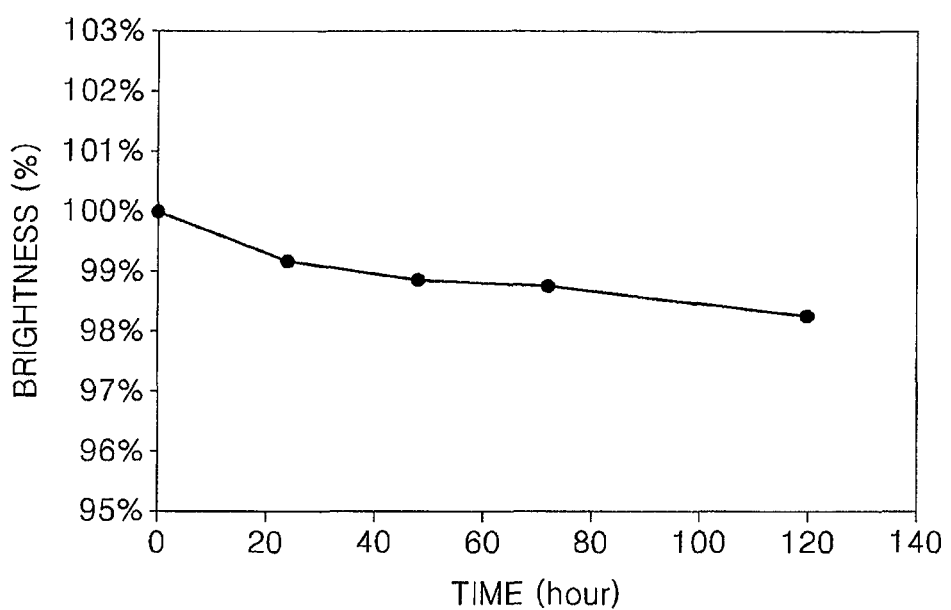
FIG. 4 is a graph showing lifetime data of an OLED prepared in Example 1.

FIG. 4 is a graph showing lifetime data of an OLED (hereinafter, referred to as an OLED of Example 1) according to an embodiment of the present invention. The OLED of Example 1 is prepared by a following method.

As an anode, 15 $\Omega/cm^2$ (1200 Å) Corning ITO glass substrate was cut into a size of 50 mm×50 mm×0.7 mm, washed with ultrasonic waves in isopropyl alcohol and pure water for 5 minutes each, and then cleaned with UV and ozone for 30 minutes. The ITO glass substrate was installed on a vacuum deposition apparatus.

2-TNATA was deposited on the ITO glass substrate to form a HIL with a thickness of 600 Å. Then, 4,4'-bis[N-(1-naphtyl)-N-phenylamino]biphenyl (NPB) was deposited on the HIL to form a HTL with a thickness of 300 Å.

Then, 9,10-di(naphthalene-2-yl)anthracene (ADN) and 4,4'-bis[2-(4-(N,N-diphenylamino)phenyl)vinyl]biphenyl (DPAVBi) were co-deposited on the HTL in a weight ratio of 98:2 to form an EML with a thickness of 300 Å.

Then, a first electron transport unit was formed by co-depositing Compounds 200 and 250 on the EML to form a first mixed layer with a thickness of 45 Å and by co-depositing Compounds 600 and 250 on the first mixed layer to form a second mixed layer with a thickness of 45 Å. Then, a second electron transport unit, a third electron transport unit, and a fourth electron transport unit, which each have the same structure as that of the first electron transport unit, were formed sequentially on the first electron transport unit by using the same method as a method for forming the first electron transport unit to form an ETL including the first electron transport unit, the second electron transport unit, the third electron transport unit, and the fourth electron transport unit with a thickness of 360 Å (that is, n=4).

LiF was deposited on the ETL to form an EIL with a thickness of 10 Å, and Al was deposited on the EIL to form a second electrode (cathode) with a thickness of 3000 Å, thereby completing the preparation of the OLED of Example 1.

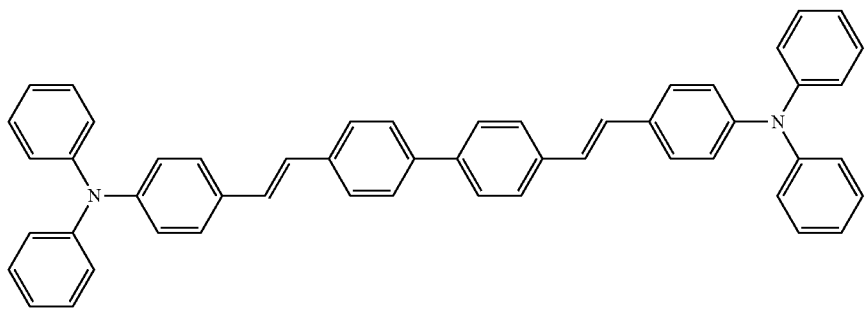

DPAVBi

-continued

Compound 200

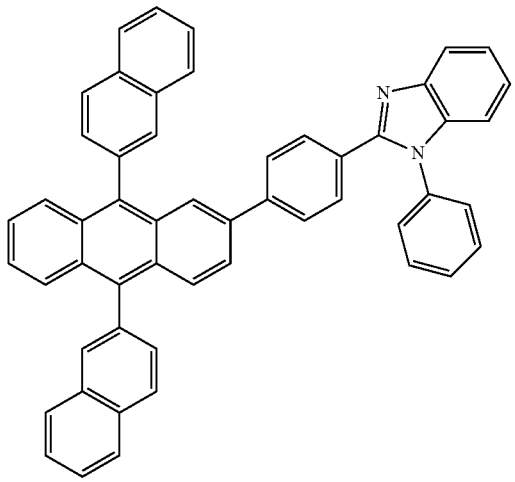

Compound 250

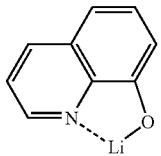

Compound 600

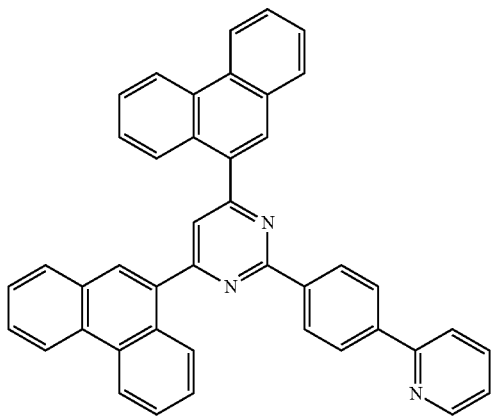

A driving voltage, efficiency, color coordinates, and lifetime of the OLED of Example 1 were evaluated by using PR650 Spectroscan Source Measurement Unit (available from PhotoResearch). The evaluation results are shown in Table 1 and FIG. 4. The lifetime of the OLED was evaluated under 300 cd/m². In FIG. 4, the y axis indicates brightness (%) when initial brightness is 100%.

TABLE 1

|  | Driving Voltage (V) | Efficiency (Cd/A) | CIEx | CIEy | Efficiency/y |
|---|---|---|---|---|---|
| OLED of Example 1 | 7.0 | 3.8 | 0.151 | 0.050 | 76.3 |

As shown in Table 1 and FIG. 4, it is confirmed that the OLED of Example 1 has excellent efficiency and lifetime properties.

Thus far, a case where n=4 has been described with reference to FIGS. 1 through 4 but 'n' of the OLED is not limited to 4.

Throughout this specification, examples of the unsubstituted $C_1$-$C_{60}$ alkyl group (or $C_1$-$C_{60}$ alkyl group) may include a linear or branched $C_1$-$C_{60}$ alkyl group such as methyl, ethyl, propyl, isobutyl, sec-butyl, pentyl, iso-amyl, hexyl, or the like. In addition, a substituted $C_1$-$C_{60}$ alkyl group is an unsubstituted $C_1$-$C_{60}$ alkyl group in which at least one hydrogen atom of the unsubstituted $C_1$-$C_{60}$ alkyl group is substituted with any one of deuterium; —F; —Cl; —Br; —I; —CN; a hydroxyl group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, and a $C_6$-$C_{60}$ aryloxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

Throughout this specification, the unsubstituted $C_1$-$C_{60}$ alkoxy group (or $C_1$-$C_{60}$ alkoxy group) is a group represented by —OA (where A is the above-described unsubstituted $C_1$-$C_{60}$ alkyl group and may be, for example, methoxy, ethoxy, isopropyloxy, or the like. With regard to the unsubstituted $C_1$-$C_{60}$ alkoxy group, at least one hydrogen atom may be substituted with a substituent described above in conjunction with the substituted $C_1$-$C_{60}$ alkyl group.

Through this specification, the unsubstituted $C_2$-$C_{60}$ alkenyl group (or $C_2$-$C_{60}$ alkenyl group) indicates a group having at least one carbon-carbon double bond in the center or at a terminal of the unsubstituted $C_2$-$C_{60}$ alkyl group. Examples of the unsubstituted $C_2$-$C_{60}$ alkyl group include an ethenyl group, a propenyl group, a butenyl group, or the like. At least one hydrogen atom of the unsubstituted $C_2$-$C_{60}$ alkenyl group may be substituted with a substituent described above in conjunction with the substituted $C_1$-$C_{60}$ alkyl group.

Through this specification, the unsubstituted $C_2$-$C_{60}$ alkynyl group (or $C_2$-$C_{60}$ alkynyl group) indicates a group having at least one carbon-carbon triple bond in the center or at a terminal of the $C_2$-$C_{60}$ alkyl group. Examples of the unsubstituted $C_2$-$C_{60}$ alkynyl group include ethynyl, propynyl, or the like. At least one hydrogen atom of the unsubstituted alkynyl group may be substituted with a substituent described above in conjunction with the substituted $C_1$-$C_{60}$ alkyl group.

Through this specification, the unsubstituted $C_6$-$C_{60}$ aryl group indicates a monovalent group having a $C_6$-$C_{60}$ carbocyclic aromatic system containing at least one aromatic ring. An unsubstituted $C_6$-$C_{60}$ arylene group indicates a divalent group having a $C_6$-$C_{60}$ carbocyclic aromatic system having at least one aromatic ring. When the aryl group and arylene group include at least two rings, the at least two rings may be fused with each other. At least one hydrogen atom of the aryl group and arylene group may be substituted with a substituent described above in conjunction with the substituted $C_1$-$C_{60}$ alkyl group.

Examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m-, and p-fluorophenyl group, or a dichlorophenyl group), a dicyanophenyl group, a trifluoromethoxyphenyl group, an o-, m-, and p-tolyl group, an o-, m-, and p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), $C_1$-$C_{10}$ alkoxynaphthyl group (e.g., methoxynaphthyl group), an anthracenyl group, an azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group. Examples of the substituted $C_6$-$C_{60}$ aryl group may be easily realized with reference to the above-described examples of the unsubstituted $C_6$-$C_{60}$ aryl group and the above-described substituents of the substituted $C_1$-$C_{60}$ alkyl group. Examples of the substituted or unsubstituted $C_6$-$C_{60}$ arylene group may be easily understood with reference to the above-described examples of the substituted or unsubstituted $C_6$-$C_{60}$ aryl group.

Through this specification, the unsubstituted $C_2$-$C_{60}$ heteroaryl group indicates a monovalent group having at least one aromatic ring system including carbon rings and at least one hetero atom selected from the group consisting of N, O, P, and S. The unsubstituted $C_2$-$C_{60}$ heteroarylene group indicates a divalent group having at least one aromatic ring system including carbon rings and at least one hetero atom selected from the group consisting of N, O, P, and S. In this regard, if the heteroaryl group and the heteroarylene group each independently have two or more aromatic rings, the rings may be fused with each other. At least one hydrogen atom of each of the heteroaryl group and the heteroarylene group may be substituted with a substituent described above in conjunction with the $C_1$-$C_{60}$ alkyl group.

Examples of the unsubstituted $C_2$-$C_{60}$ heteroaryl group may include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolyl group, an isoquinolyl group, a benzoimidazolyl group, an imidazopyridinyl group, an imidazopyrimidinyl group, or the like. Examples of the unsubstituted $C_2$-$C_{60}$ heteroarylene group may be easily understood with reference to the above-described examples of the substituted or unsubstituted $C_2$-$C_{60}$ arylene group.

The substituted or unsubstituted $C_6$-$C_{60}$ aryloxy group indicates a group represented by —$OA_2$ (where $A_2$ is the substituted or unsubstituted $C_6$-$C_{60}$ aryl group). The substituted or unsubstituted $C_6$-$C_{60}$ arylthio group indicates a group represented by —$SA_3$ (where $A_3$ is the substituted or unsubstituted $C_6$-$C_{60}$ aryl group).

Thus far, an OLED according to an embodiment of the present invention has been described with reference to FIGS. 1 through 4 and Example 1 but is not limited thereto.

The OLED having a novel ETL structure may have high efficiency and long lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:
1. An organic light-emitting diode (OLED) comprising:
   a substrate;
   a first electrode on the substrate;
   a second electrode facing the first electrode;
   an emission layer between the first electrode and the second electrode; and
   an electron transport layer between the emission layer and the second electrode,
   wherein the electron transport layer has a structure in which n (where n is an integer of 1 or more) electron transport units are stacked, and each of the electron transport units comprises a first mixed layer comprising a first material and a first dopant and a second mixed layer comprising a second material and a second dopant,
   wherein the first material and the second material are different from each other,
   wherein the first material and the second material satisfy at least one of Formulae 1, 2, and 3 below:

Electron mobility of the first material≠Electron mobility of the second material,   Formula 1

Absolute value of Lowest Unoccupied Molecular Orbital (LUMO) level of the first material≠Absolute value of LUMO level of the second material, and   Formula 2

Absolute value of the Highest Occupied Molecular Orbital (HOMO) level of the first material≠Absolute value of the HOMO level of the second material,   Formula 3 wherein the first material is Compound 200; the second material is Compound 600; and the first dopant and the second dopant are Compound 250:

<Compound 200>

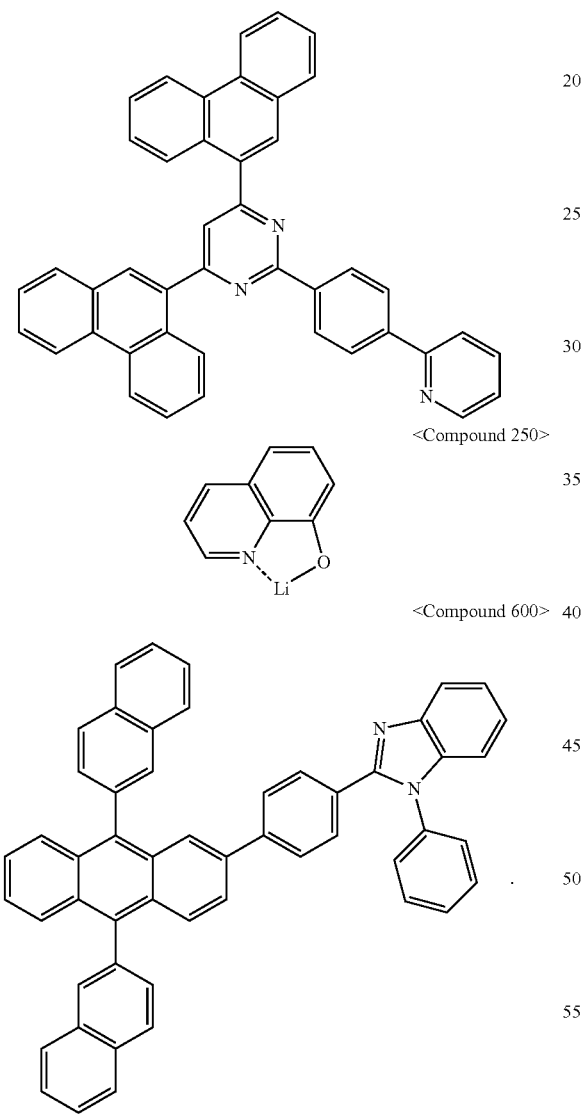

<Compound 250>

<Compound 600>

2. The OLED of claim 1, wherein the electron mobility of the first material is greater than the electron mobility of the second material.

3. The OLED of claim 1, wherein a difference between the absolute value of the LUMO level of the first material and the absolute value of the LUMO of a material included in the emission layer is equal to or less than 0.5 eV.

4. The OLED of claim 1, wherein an absolute value of the HOMO level of the second material is greater than an absolute value of the HOMO level of a material included in the emission layer.

5. An organic light-emitting diode (OLED) comprising:
a substrate;
a first electrode on the substrate;
a second electrode facing the first electrode;
an emission layer between the first electrode and the second electrode; and
an electron transport layer between the emission layer and the second electrode,
wherein the electron transport layer has a structure in which n (where n is an integer of 1 or more) electron transport units are stacked, and each of the electron transport units comprises a first mixed layer comprising a first material and a first dopant and a second mixed layer comprising a second material and a second dopant,
wherein the first material and the second material are different from each other,
wherein the first material is represented by any one of Formulae 10A(1) through 10A(12), 10B(1) through 10B(12), and 10C(1) through 10C(6):

Formula 10A(1)

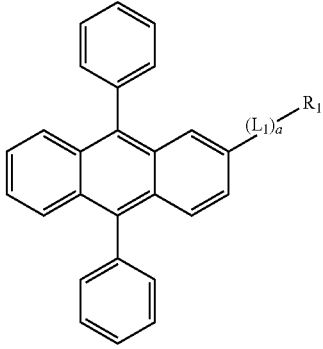

Formula 10A(2)

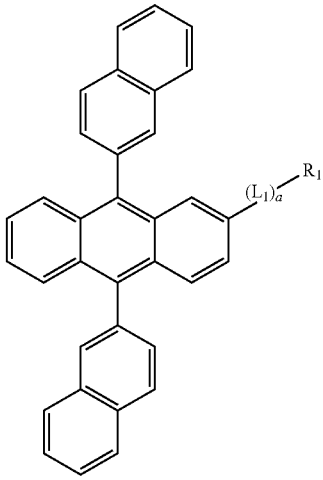

Formula 10A(3)
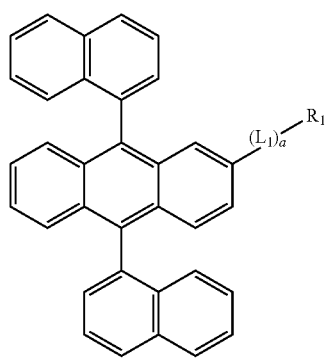
Formula 10A(4)
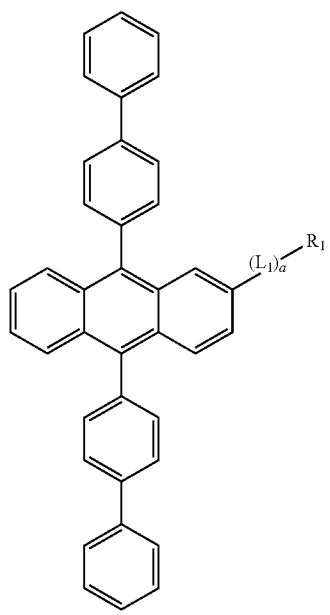
Formula 10A(5)
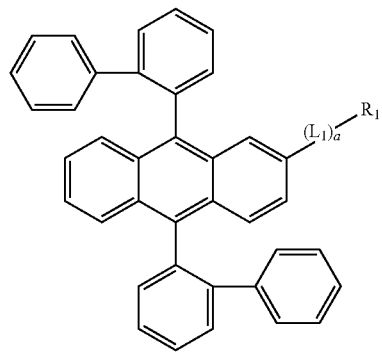
Formula 10A(6)
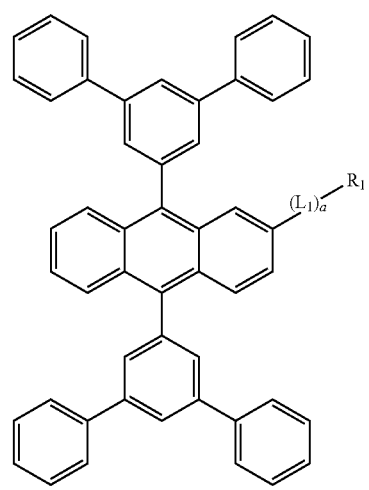
Formula 10A(7)
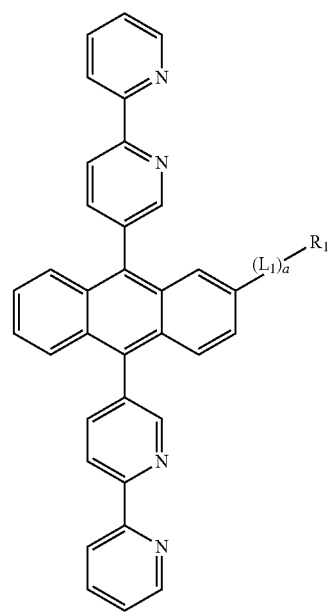
Formula 10A(8)
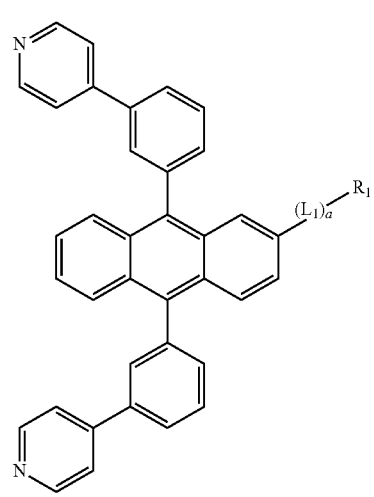

Formula 10A(9)
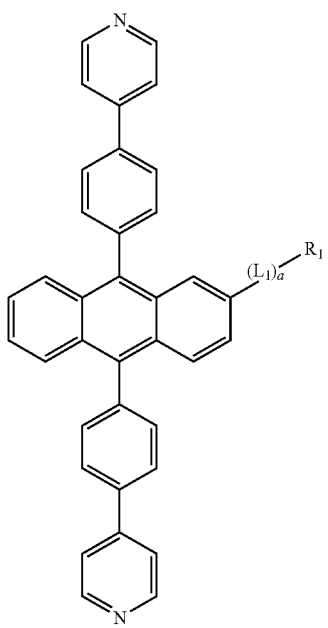
Formula 10A(10)
Formula 10A(11)
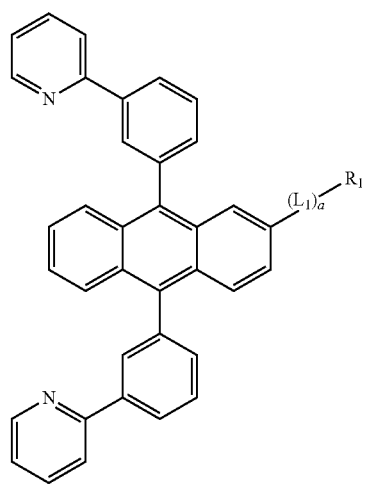
Formula 10A(12)
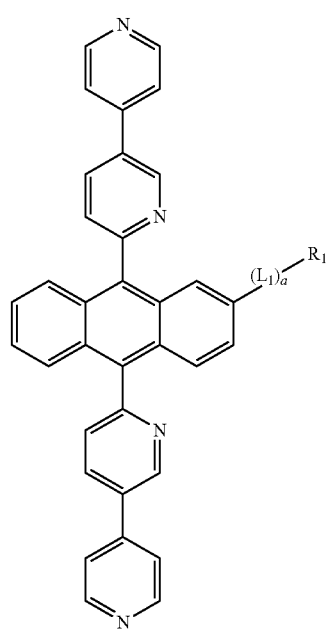
Formula 10B(1)
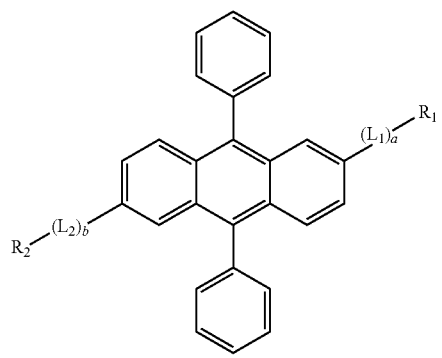

Formula 10B(2)
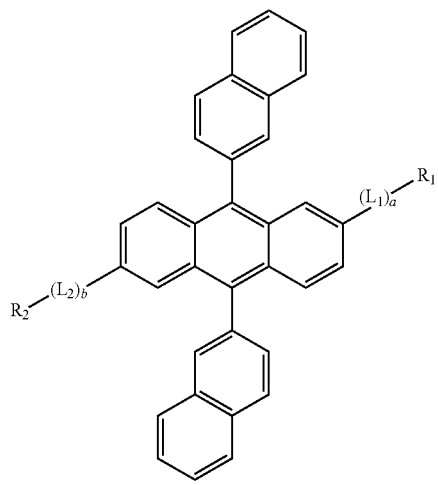
Formula 10B(3)
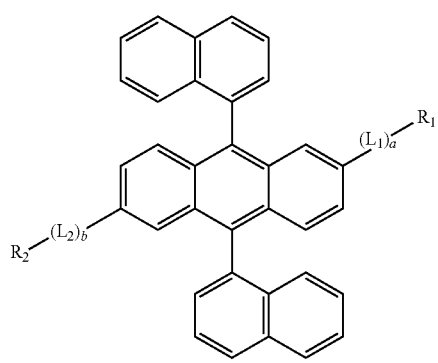
Formula 10B(4)
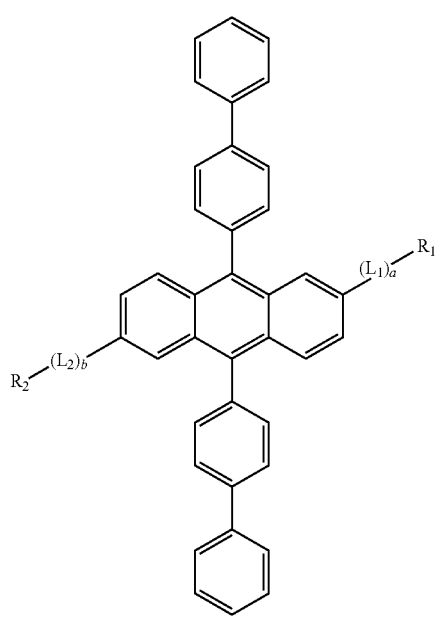
Formula 10B(5)
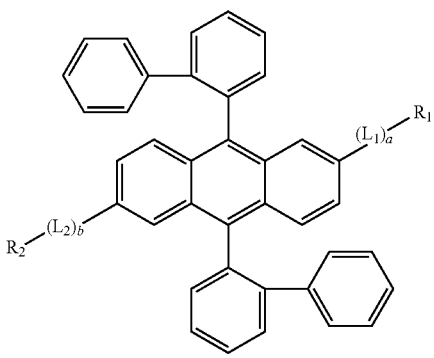
Formula 10B(6)
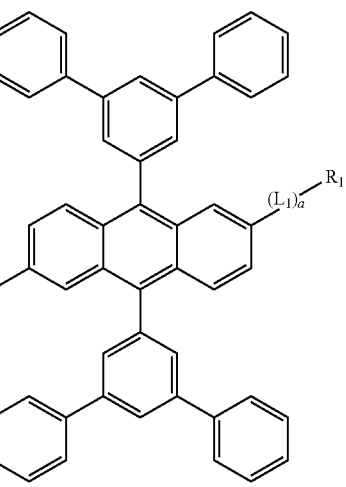
Formula 10B(7)
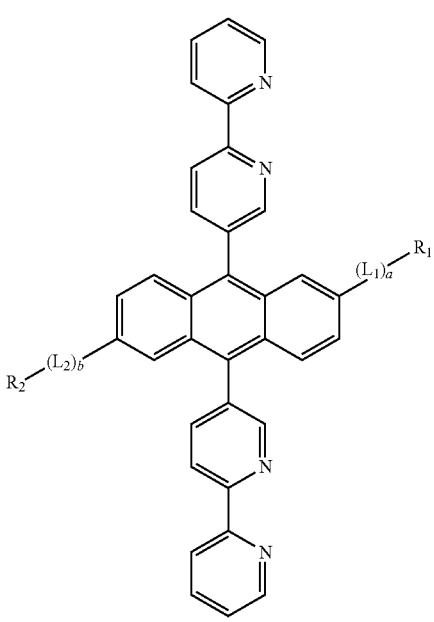

Formula 10B(8)
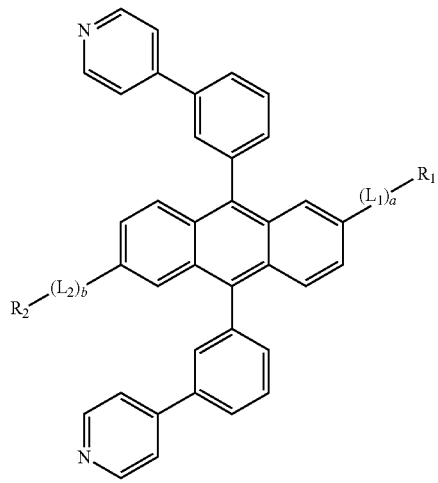
Formula 10B(9)
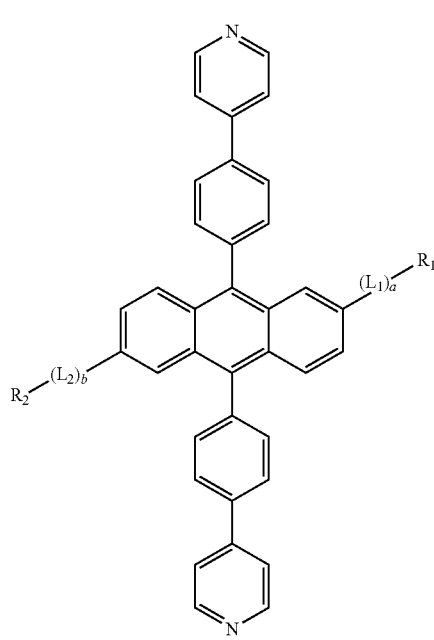
Formula 10B(10)
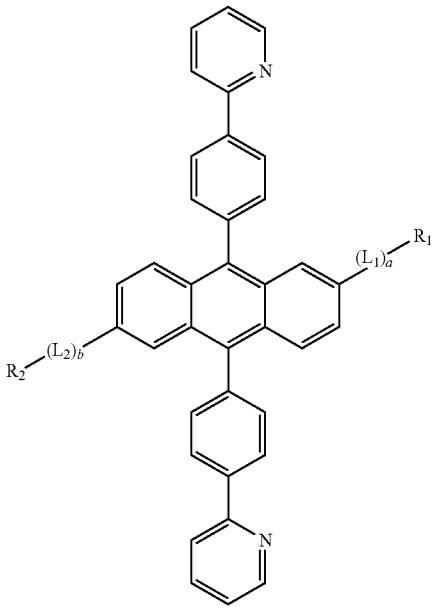
Formula 10B(11)

Formula 10B(12)
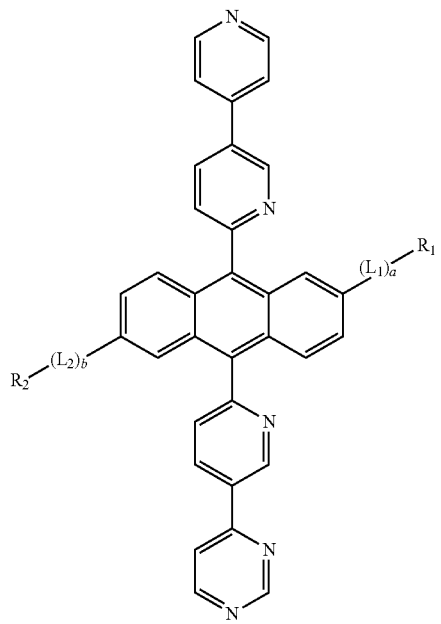
Formula 10C(1)
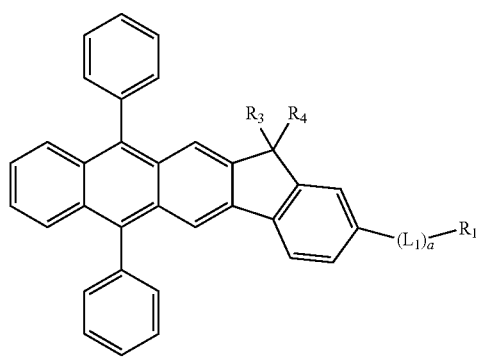
Formula 10C(2)
Formula 10C(3)
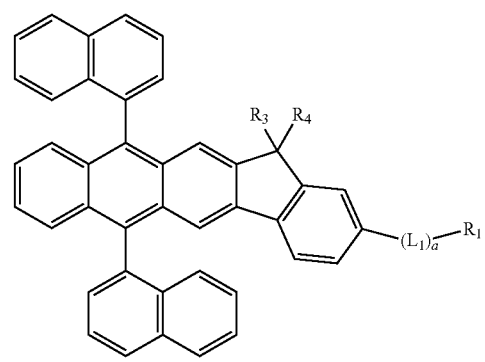
Formula 10C(4)
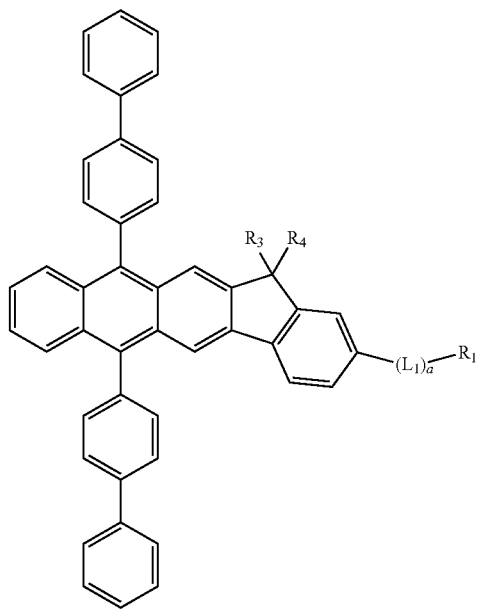
Formula 10C(5)
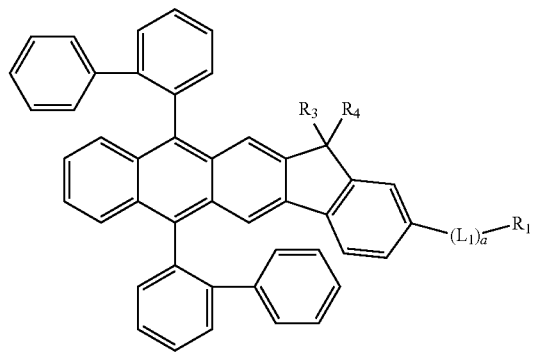

Formula 10C(6)

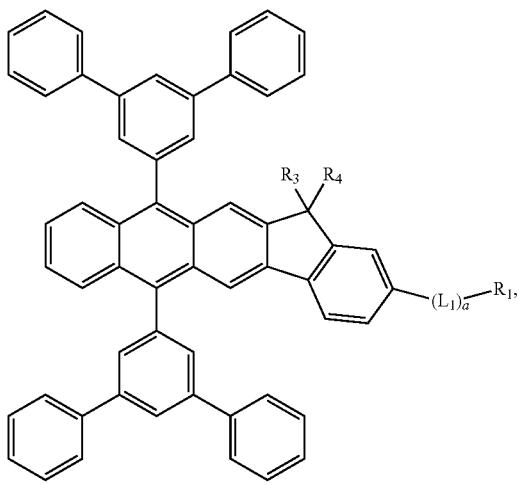

wherein the first material and the second material satisfy at least one of Formulae 1, 2, and 3 below:

Electron mobility of the first material≠Electron mobility of the second material,   Formula 1

Absolute value of Lowest Unoccupied Molecular Orbital (LUMO) level of the first material≠Absolute value of LUMO level of the second material, and   Formula 2

Absolute value of the Highest Occupied Molecular Orbital (HOMO) level of the first material≠Absolute value of the HOMO level of the second material, and   Formula 3 wherein:

$L_1$ and $L_2$ are each independently a substituted or unsubstituted $C_6$-$C_{60}$ arylene group or a substituted or unsubstituted $C_2$-$C_{60}$ heteroarylene group;

a and b are each independently 0, 1, or 2;

$R_3$ and $R_4$ are each independently any one of a $C_1$-$C_{20}$ alkyl group and a $C_6$-$C_{20}$ aryl group; and a $C_1$-$C_{20}$ alkyl group and a $C_6$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof, in Formulae 10A(1) through 10A(6), 10B(1) through 10B(6), and 10C(1) through 10C(6) $R_1$ and $R_2$ are each independently a substituted or unsubstituted benzoimidazolyl group, a substituted or unsubstituted benzoxazolyl group, or a substituted or unsubstituted benzothiazolyl group, and in Formulae 10A(7) through 10A(12) and 10B(7) through 10B(12) above, $R_1$ and $R_2$, are each independently a substituted or unsubstituted phenyl group, or a substituted or unsubstituted naphthyl group.

6. The OLED of claim 5, wherein $L_1$ and $L_2$ are each independently any one of a phenylene group, a naphthylene group, an anthrylene group, a pyrenylene group, a fluorenylene group, a pyridinylene group, a pyrazinylene group, and a pyrimidinylene group; and a phenylene group, a naphthylene group, an anthrylene group, a pyrenylene group, a fluorenylene group, a pyridinylene group, a pyrazinylene group, and a pyrimidinylene group that are substituted with at least one of a phenyl group, a naphthyl group, an anthryl group, a pyrenyl group, a fluorenyl group, a pyridinyl group, a pyrazinyl group, and a pyrimidinyl group.

7. The OLED of claim 5, wherein $R_1$ and $R_2$ are each independently any one represented by Formulae 11(1) through 11(3), 11(23), and 11(24) below:

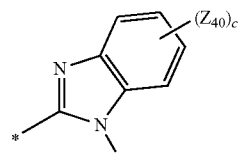
Formula 11(1)

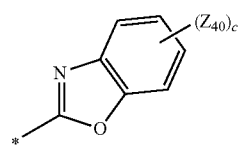
Formula 11(2)

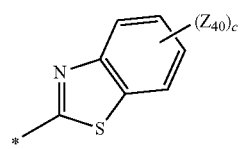
Formula 11(3)

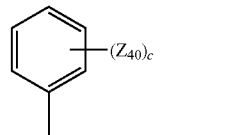
Formula 11(23)

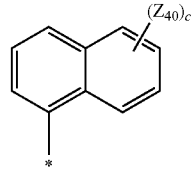
Formula 11(24)

in Formulae 11(1) through 11(3), 11(23), and 11(24) above, $R_{10}$ is a substituted or unsubstituted $C_1$-$C_{60}$ alkyl group or a substituted or unsubstituted $C_6$-$C_{60}$ aryl group;

$Z_{40}$ is hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group, a $C_1$-$C_{60}$ alkoxy group, a $C_6$-$C_{60}$ aryl group, and a $C_2$-$C_{60}$ heteroaryl group; and a $C_1$-$C_{60}$ alkyl group, a $C_1$-$C_{60}$ alkoxy group, a $C_6$-$C_{60}$ aryl group, and a $C_2$-$C_{60}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; and c is an integer from 1 to 5.

8. An organic light-emitting diode (OLED) comprising:
a substrate;
a first electrode on the substrate;
a second electrode facing the first electrode;
an emission layer between the first electrode and the second electrode; and
an electron transport layer between the emission layer and the second electrode,
wherein the electron transport layer has a structure in which n (where n is an integer of 1 or more) electron transport units are stacked, and each of the electron transport units comprises a first mixed layer comprising a first material and a first dopant and a second mixed layer comprising a second material and a second dopant,
wherein the first material and the second material are different from each other,
wherein the first material and the second material satisfy at least one of Formulae 1, 2, and 3 below:

Electron mobility of the first material≠Electron mobility of the second material,     Formula 1

Absolute value of Lowest Unoccupied Molecular Orbital (LUMO) level of the first material≠Absolute value of LUMO level of the second material, and     Formula 2

Absolute value of the Highest Occupied Molecular Orbital (HOMO) level of the first material≠Absolute value of the HOMO level of the second material,     Formula 3 wherein the second material is a compound represented by Formula 20A below:

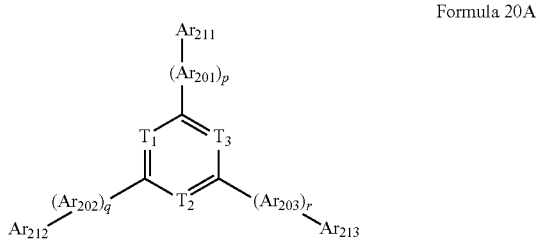

Formula 20A in Formulae 20A above, $T_1$ through $T_3$ are each independently N or $C(R_{100})$, $R_{100}$ is any one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group, and a $C_1$-$C_{60}$ alkoxy group; and a $C_1$-$C_{60}$ alkyl group and a $C_1$-$C_{60}$ alkoxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof;
$Ar_{201}$ through $Ar_{203}$ are each independently a substituted or unsubstituted $C_6$-$C_{60}$ arylene group or a substituted or unsubstituted $C_2$-$C_{60}$ heteroarylene group;
p, q, and r are each independently 0, 1, or 2; and
$Ar_{211}$ through $Ar_{213}$ are each independently a substituted or unsubstituted $C_6$-$C_{60}$ aryl group or a substituted or unsubstituted $C_2$-$C_{60}$ heteroaryl group.

9. The OLED of claim 8, wherein all $T_1$ through $T_3$ are N; $T_1$ is $C(R_{100})$, and $T_2$ and $T_3$ are N; or all $T_1$ through $T_3$ are $C(R_{100})$.

10. The OLED of claim 8, wherein $Ar_{201}$ through $Ar_{203}$ are each independently any one of a phenylene group, a naphthylene group, an anthrylene group, a pyrenylene group, a fluorenylene group, a pyridinylene group, a pyrazinylene group, and a pyrimidinylene group; and a phenylene group, a naphthylene group, an anthrylene group, a pyrenylene group, a fluorenylene group, a pyridinylene group, a pyrazinylene group, and a pyrimidinylene group that are substituted with at least one of a phenyl group, a naphthyl group, an anthryl group, a pyrenyl group, a fluorenyl group, a pyridinyl group, a pyrazinyl group, and a pyrimidinyl group.

11. The OLED of claim 8, wherein $Ar_{211}$ through $Ar_{213}$ are each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group.

12. An organic light-emitting diode (OLED) comprising:
a substrate;
a first electrode on the substrate;
a second electrode facing the first electrode;
an emission layer between the first electrode and the second electrode; and
an electron transport layer between the emission layer and the second electrode,
wherein the electron transport layer has a structure in which n (where n is an integer of 1 or more) electron transport units are stacked, and each of the electron transport units comprises a first mixed layer comprising a first material and a first dopant and a second mixed layer comprising a second material and a second dopant,
wherein the first material and the second material are different from each other,
wherein the first material and the second material satisfy at least one of Formulae 1, 2, and 3 below:

Electron mobility of the first material≠Electron mobility of the second material,     Formula 1

Absolute value of Lowest Unoccupied Molecular Orbital (LUMO) level of the first material≠Absolute value of LUMO level of the second material, and     Formula 2

Absolute value of the Highest Occupied Molecular Orbital (HOMO) level of the first material≠Absolute value of the HOMO level of the second material,     Formula 3 wherein the first material is an anthracene-based compound represented by any one of Formulae 10A, 10B, and 10C below:

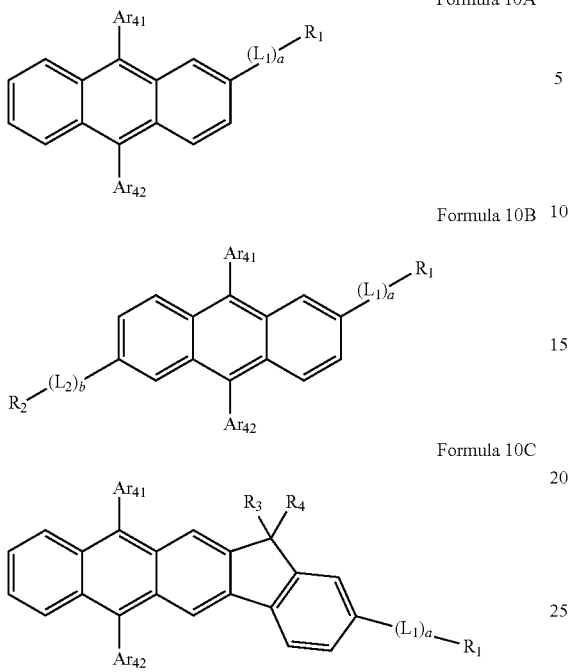

Formula 10A

Formula 10B

Formula 10C

Formula 250

Formula 251 in Formulae 10A through 10C above, $Ar_{41}$ and $Ar_{42}$ are each independently substituted or unsubstituted $C_6$-$C_{60}$ aryl group or a substituted or unsubstituted $C_2$-$C_{60}$ heteroaryl group;

$L_1$ and $L_2$ are each independently a substituted or unsubstituted $C_6$-$C_{60}$ arylene group or a substituted or unsubstituted $C_2$-$C_{60}$ heteroarylene group;

a and b are each independently 0, 1, or 2;

$R_1$ and $R_2$ are each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group; and $R_3$ and $R_4$ are each independently any one of a $C_1$-$C_{20}$ alkyl group and a $C_6$-$C_{20}$ aryl group; and a $C_1$-$C_{20}$ alkyl group and a $C_1$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof, wherein the first dopant and the second dopant are each independently a Li complex, LiF, CsF, $Al_2O_3$, $SiO_2$, $Si_3N_4$, or $Cs_2CO_3$.

13. The OLED of claim 12, wherein the first dopant and the second dopant are each independently represented by Formula 250 or 251 below:

14. The OLED of claim 5, wherein the first dopant and the second dopant are the same.

15. The OLED of claim 5, wherein a thickness ratio of the first mixed layer and the second mixed layer is from 1:9 to 9:1.

16. The OLED of claim 5, wherein n is 4.

17. An organic light-emitting diode (OLED) comprising:
a substrate;
a first electrode on the substrate;
a second electrode facing the first electrode;
an emission layer between the first electrode and the second electrode; and
an electron transport layer between the emission layer and the second electrode,
wherein the electron transport layer has a structure in which n (where n is an integer of 1 or more) electron transport units are stacked, and each of the electron transport units comprises a first mixed layer comprising a first material and a first dopant and a second mixed layer comprising a second material and a second dopant,
wherein the first material and the second material are different from each other,
wherein the first material and the second material satisfy at least one of Formulae 1, 2, and 3 below,
wherein the electron transport unit further comprises a first layer comprising the first material and a second layer comprising the second material,
wherein the first layer and the second layer do not comprise the first dopant and the second dopant, and
wherein the electron transport unit has a structure in which the first layer, the first mixed layer, the second layer, and the second mixed layer are sequentially stacked, Electron mobility of the first material≠Electron mobility of the second material,   Formula 1

Absolute value of Lowest Unoccupied Molecular Orbital (LUMO) level of the first material≠Absolute value of LUMO level of the second material, and   Formula 2

Absolute value of the Highest Occupied Molecular Orbital (HOMO) level of the first material≠Absolute value of the HOMO level of the second material.   Formula 3

18. The OLED of claim 5, wherein the first material is an anthracene-based compound represented by any one of Formulae 10A and 10B.

19. The OLED of claim 8, wherein the first dopant and the second dopant are each independently a Li complex, LiF, CsF, Al2O3, SiO2, Si3N4, or Cs2CO3.

20. The OLED of claim 8, wherein the first dopant and the second dopant are each independently represented by Formula 250 or 251 below:

Formula 250

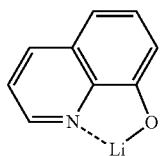

Formula 251

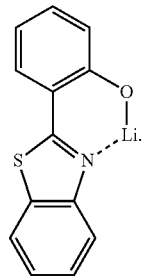

21. The OLED of claim 8, wherein the first dopant and the second dopant are the same.

22. The OLED of claim 8, wherein a thickness ratio of the first mixed layer and the second mixed layer is from 1:9 to 9:1.

23. The OLED of claim 8, wherein n is 4.

24. An organic light-emitting diode (OLED) comprising:
a substrate;
a first electrode on the substrate;
a second electrode facing the first electrode;
an emission layer between the first electrode and the second electrode; and
an electron transport layer between the emission layer and the second electrode,
wherein the electron transport layer has a structure in which n (where n is an integer of 1 or more) electron transport units are stacked, and each of the electron transport units comprises a first mixed layer comprising a first material and a first dopant and a second mixed layer comprising a second material and a second dopant,
wherein the first material and the second material are different from each other,
wherein the first material and the second material satisfy at least one of Formulae 1, 2, and 3 below:

Electron mobility of the first material≠Electron mobility of the second material,　　Formula 1

Absolute value of Lowest Unoccupied Molecular Orbital (LUMO) level of the first material≠Absolute value of LUMO level of the second material, and　　Formula 2

Absolute value of the Highest Occupied Molecular Orbital (HOMO) level of the first material≠Absolute value of the HOMO level of the second material,　　Formula 3 wherein the first material is an anthracene-based compound represented by any one of Formulae 10A, 10B, and 10C below; and
wherein the second material is a compound represented by Formula 20A below:

Formula 10A

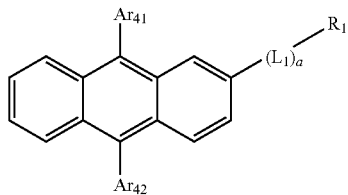

Formula 10B

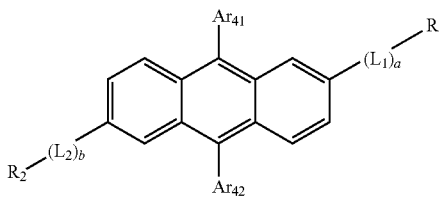

Formula 10C

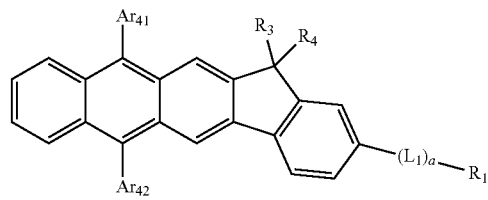

in Formulae 10A through 10C above, $Ar_{41}$ and $Ar_{42}$ are each independently a substituted or unsubstituted $C_6$-$C_{60}$ aryl group or a substituted or unsubstituted $C_2$-$C_{60}$ heteroaryl group;
$L_1$ and $L_2$ are each independently a substituted or unsubstituted $C_6$-$C_{60}$ arylene group or a substituted or unsubstituted $C_2$-$C_{60}$ heteroarylene group;
a and b are each independently 0, 1, or 2;
$R_1$ and $R_2$ are each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group; and
$R_3$ and $R_4$ are each independently any one of a $C_1$-$C_{20}$ alkyl group and a $C_6$-$C_{20}$ aryl group; and a $C_1$-$C_{20}$ alkyl group and a $C_6$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof,

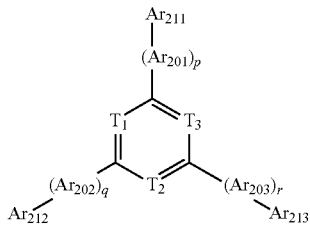

Formula 20A in Formulae 20A above, $T_1$ through $T_3$ are each independently N or $C(R_{100})$, $R_{100}$ is any one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group, and a $C_1$-$C_{60}$ alkoxy group; and a $C_1$-$C_{60}$ alkyl group and a $C_1$-$C_{60}$ alkoxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof;

$Ar_{201}$ through $Ar_{203}$ are each independently a substituted or unsubstituted $C_6$-$C_{60}$ arylene group or a substituted or unsubstituted $C_2$-$C_{60}$ heteroarylene group;

p, q, and r are each independently 0, 1, or 2; and $Ar_{211}$ through $Ar_{213}$ are each independently a substituted or unsubstituted $C_6$-$C_{60}$ aryl group or a substituted or unsubstituted $C_2$-$C_{60}$ heteroaryl group.

\* \* \* \* \*